United States Patent [19]
Takahashi et al.

[11] Patent Number: 5,687,164
[45] Date of Patent: Nov. 11, 1997

[54] DECODER EMPLOYING VITERBI DECODING METHOD FOR DECODING CODED MULTI-VALUED SIGNAL

[75] Inventors: Kohji Takahashi, Sendai; Tadashi Nakamura; Kenichi Oide, both of Kawasaki, all of Japan

[73] Assignee: Fujitsu Limited, Kanagawa, Japan

[21] Appl. No.: 492,989

[22] Filed: Jun. 21, 1995

[30] Foreign Application Priority Data

Sep. 30, 1994 [JP] Japan .................. 6-237194

[51] Int. Cl.$^6$ .................. H04L 1/00; H04L 27/34; H03M 13/00
[52] U.S. Cl. .................. 370/207; 375/262; 375/341
[58] Field of Search .................. 370/20, 206, 207; 375/341, 346, 261, 262; 371/43

[56] References Cited

U.S. PATENT DOCUMENTS

| | | |
|---|---|---|
| 4,534,040 | 8/1985 | Thapar . |
| 4,709,377 | 11/1987 | Martinez et al. . |
| 4,873,701 | 10/1989 | Tretter . |
| 5,134,635 | 7/1992 | Hong et al. . |
| 5,233,629 | 8/1993 | Paik et al. . |
| 5,502,736 | 3/1996 | Todoroki .................. 371/43 |

FOREIGN PATENT DOCUMENTS 0 465 428  1/1992  European Pat. Off. .

*Primary Examiner*—Melvin Marcelo
*Attorney, Agent, or Firm*—Helfgott & Karas, P.C.

[57] ABSTRACT

A Viterbi decoder decodes a received signal having Ich and Qch components obtained by modulating a convolutional coded multi-valued QAM signal. The Viterbi decoder includes a first unit which inputs the received signal having the Ich and Qch components, a second unit which finds Euclidean distance between a predetermined signal point, which is one of a plurality of predetermined signal points allocated on a plane formed of Ich and Qch axes orthogonally crossed, and a signal point of the received signal, and a third unit which performs a Viterbi decoding based on the Euclidean distance obtained by the second unit.

16 Claims, 62 Drawing Sheets

| SEL[1:0] | EXPRESSION FOR CALCULATING EUCLIDEAN DISTANCE | D[2:0] | CALCULATED VALUE | BRNT[3:0] |
|---|---|---|---|---|
| 0 0 | $(4-D)^2$ | 0 0 0 | 0 1 0 0 0 0 = 1 6 | 0 1 0 0 |
| | | 0 0 1 | 0 0 1 0 0 1 = 9 | 0 0 1 0 |
| | | 0 1 0 | 0 0 0 1 0 0 = 4 | 0 0 0 1 |
| | | 0 1 1 | 0 0 0 0 0 1 = 1 | 0 0 0 0 |
| | | 1 0 0 | 0 0 0 0 0 0 = 0 | 0 0 0 0 |
| | | 1 0 1 | 0 0 0 0 0 1 = 1 | 0 0 0 0 |
| | | 1 1 0 | 0 0 0 1 0 0 = 4 | 0 0 0 1 |
| | | 1 1 1 | 0 0 1 0 0 1 = 9 | 0 0 1 0 |
| 0 1 | $(4+D)^2$ | 0 0 0 | 0 1 0 0 0 0 = 1 6 | 0 1 0 0 |
| | | 0 0 1 | 0 1 1 0 0 1 = 2 5 | 0 1 1 0 |
| | | 0 1 0 | 1 0 0 1 0 0 = 3 6 | 1 0 0 1 |
| | | 0 1 1 | 1 1 0 0 0 1 = 4 9 | 1 1 0 0 |
| | | 1 0 0 | 1 1 1 1 1 1 = 6 3 | 1 1 1 1 |
| | | 1 0 1 | 1 1 1 1 1 1 = 6 3 | 1 1 1 1 |
| | | 1 1 0 | 1 1 1 1 1 1 = 6 3 | 1 1 1 1 |
| | | 1 1 1 | 1 1 1 1 1 1 = 6 3 | 1 1 1 1 |
| 1 0 | $(12-D)^2$ | 0 0 0 | 1 1 1 1 1 1 = 6 3 | 1 1 1 1 |
| | | 0 0 1 | 1 1 1 1 1 1 = 6 3 | 1 1 1 1 |
| | | 0 1 0 | 1 1 1 1 1 1 = 6 3 | 1 1 1 1 |
| | | 0 1 1 | 1 1 1 1 1 1 = 6 3 | 1 1 1 1 |
| | | 1 0 0 | 1 1 1 1 1 1 = 6 3 | 1 1 1 1 |
| | | 1 0 1 | 1 1 0 0 0 1 = 4 9 | 1 1 0 0 |
| | | 1 1 0 | 1 0 0 1 0 0  3 6 | 1 0 0 1 |
| | | 1 1 1 | 0 1 1 0 0 1 = 2 5 | 0 1 1 0 |
| 1 1 | Showing Maximum Value | X X | 1 1 1 1 1 1 = 6 3 | 1 1 1 1 |

FIG. 5

| | | | | | | | | | | | | | |
|---|---|---|---|---|---|---|---|---|---|---|---|---|---|
| — | 1101 | | | $B_{13}$ | $A_{49}$ | $B_3$ | $A_{33}$ | $B_9$ | $A_{37}$ | $B_{11}$ | $A_{51}$ | | |
| — | 1100 | | | $A_{31}$ | $B_{55}$ | $A_{27}$ | $B_{39}$ | $A_{25}$ | $B_{47}$ | $A_{29}$ | $B_{53}$ | | |
| 111 | 1011 | $B_{19}$ | $A_{53}$ | $B_{30}$ | $A_{54}$ | $B_{26}$ | $A_{34}$ | $B_{24}$ | $A_{46}$ | $B_{28}$ | $A_{62}$ | $B_{31}$ | $A_{45}$ |
| 110 | 1010 | $A_{11}$ | $B_{51}$ | $A_{28}$ | $B_{52}$ | $A_{12}$ | $B_{48}$ | $A_4$ | $B_{50}$ | $A_{20}$ | $B_{54}$ | $A_{23}$ | $B_{49}$ |
| 101 | 1001 | $B_5$ | $A_{47}$ | $B_{14}$ | $A_{50}$ | $B_{10}$ | $A_{34}$ | $B_8$ | $A_{42}$ | $B_{12}$ | $A_{58}$ | $B_{27}$ | $A_{35}$ |
| 100 | 1000 | $A_9$ | $B_{57}$ | $A_{24}$ | $B_{36}$ | $A_8$ | $B_{32}$ | $A_0$ | $B_{34}$ | $A_{16}$ | $B_{38}$ | $A_7$ | $B_{33}$ |
| 011 | 0111 | $B_1$ | $A_{39}$ | $B_6$ | $A_{48}$ | $B_2$ | $A_{32}$ | $B_0$ | $A_{40}$ | $B_4$ | $A_{56}$ | $B_{25}$ | $A_{41}$ |
| 010 | 0110 | $A_3$ | $B_{59}$ | $A_{26}$ | $B_{44}$ | $A_{10}$ | $B_{40}$ | $A_2$ | $B_{42}$ | $A_{18}$ | $B_{46}$ | $A_{15}$ | $B_{37}$ |
| 001 | 0101 | $B_{17}$ | $A_{55}$ | $B_{22}$ | $A_{52}$ | $B_{18}$ | $A_{36}$ | $B_{16}$ | $A_{44}$ | $B_{20}$ | $A_{60}$ | $B_{29}$ | $A_{43}$ |
| 000 | 0100 | $A_{13}$ | $B_{63}$ | $A_{30}$ | $B_{60}$ | $A_{14}$ | $B_{56}$ | $A_6$ | $B_{58}$ | $A_{22}$ | $B_{62}$ | $A_{21}$ | $B_{51}$ |
| — | 0011 | | | $B_{21}$ | $A_{61}$ | $B_{15}$ | $A_{57}$ | $B_7$ | $A_{59}$ | $B_{23}$ | $A_{63}$ | | |
| — | 0010 | | | $A_{19}$ | $B_{43}$ | $A_5$ | $B_{41}$ | $A_1$ | $B_{35}$ | $A_{17}$ | $B_{45}$ | | |
| Q \ I | | 0010 | 0011 | 0100 | 0101 | 0110 | 0111 | 1000 | 1001 | 1010 | 1011 | 1100 | 1101 |
| | | — | — | 000 | 001 | 010 | 011 | 100 | 101 | 110 | 111 | — | — |

STRAIGHT LINE (i) EXPRESSES QE = IE

STRAIGHT LINE (ii) EXPRESSES IE + QE = 8

WHEN IQECMP = 1, DOMAIN SPECIFIES;

a

WHEN ADD8 = 1, DOMAIN SPECIFIES;

b

IN THE DIAGRAM.

FIG. 11
| DOMAIN (I) | DOMAIN CONDITION (II) | SELI[1:0], SELQ[1:0] |
|---|---|---|
| 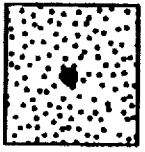 | ID [0] = QD [0] | • SELI[1:0] = 0 0<br>• SELQ[1:0] = 0 0 |
|  | ID [0] ≠ QD [0]<br>&<br>IQECMP = 0<br>&<br>ADD8 = 0 | • SELI[1:0] = 0 1<br>• SELQ[1:0] = 0 0 |
|  | ID [0] ≠ QD [0]<br>&<br>IQECMP = 0<br>&<br>ADD8 = 1 | • SELI[1:0] = 0 0<br>• SELQ[1:0] = 1 0 |
|  | ID [0] ≠ QD [0]<br>&<br>IQECMP = 1<br>&<br>ADD8 = 1 | • SELI[1:0] = 1 0<br>• SELQ[1:0] = 0 0 |
|  | ID [0] ≠ QD [0]<br>&<br>IQECMP = 1<br>&<br>ADD8 = 0 | • SELI[1:0] = 0 0<br>• SELQ[1:0] = 0 1 |

FIG. 14

| DOMAIN (I) | DOMAIN CONDITION (II) | SELI[1:0], SELQ[1:0] |
|---|---|---|
| 8 | QD[3:0] = 1111 | · SELI[1:0] = 1 1<br>· SELQ[1:0] = 1 1 |
| 1 | ID[3:0] = 0101<br>&<br>QD[3:0] = 1110 | · SELI[1:0] = 0 0<br>· SELQ[1:0] = 0 1 |
| 2 | ID[3:0] = 0110<br>&<br>QD[3:0] = 1110<br>&<br>IE[2] = 0 | · SELI[1:0] = 0 1<br>· SELQ[1:0] = 0 1 |
| 3 | ID[3:0] = 0110<br>&<br>QD[3:0] = 1101<br>&<br>IE[2] = 0<br>&<br>IQECMP = 0 | · SELI[1:0] = 0 1<br>· SELQ[1:0] = 0 0 |
| 4 | ID[3:0] = 0110<br>&<br>QD[3:0] = 1101<br>&<br>IQECMP = 1<br>&<br>ADD8 = 0 | · SELI[1:0] = 0 0<br>· SELQ[1:0] = 0 1 |
| 5 | ID[3:0] = 0110<br>&<br>QD[3:0] = 1101<br>&<br>IE[2] = 1<br>&<br>ADD8 = 1 | · SELI[1:0] = 1 0<br>· SELQ[1:0] = 0 0 |
| 6 | ID[3:0] = 0110<br>&<br>QD[3:0] = 1110<br>&<br>IE[2] = 1 | · SELI[1:0] = 1 0<br>· SELQ[1:0] = 0 1 |
| 7 | ID[3:0] = 0111<br>&<br>QD[3:0] = 1110 | · SELI[1:0] = 0 0<br>· SELQ[1:0] = 0 1 |

FIG. 15

| SEL[1:0] | EXPRESSION FOR CALCULATING EUCLIDEAN DISTANCE | D[2:0] | CALCULATED VALUE | BRNT[3:0] |
|---|---|---|---|---|
| 0 0 | $(4-D)^2$ | 0 0 0 | 0 1 0 0 0 0 = 16 | 0 1 0 0 |
| | | 0 0 1 | 0 0 1 0 0 1 = 9 | 0 0 1 0 |
| | | 0 1 0 | 0 0 0 1 0 0 = 4 | 0 0 0 1 |
| | | 0 1 1 | 0 0 0 0 0 1 = 1 | 0 0 0 0 |
| | | 1 0 0 | 0 0 0 0 0 0 = 0 | 0 0 0 0 |
| | | 1 0 1 | 0 0 0 0 0 1 = 1 | 0 0 0 0 |
| | | 1 1 0 | 0 0 0 1 0 0 = 4 | 0 0 0 1 |
| | | 1 1 1 | 0 0 1 0 0 1 = 9 | 0 0 1 0 |
| 0 1 | $(4+D)^2$ | 0 0 0 | 0 1 0 0 0 0 = 16 | 0 1 0 0 |
| | | 0 0 1 | 0 1 1 0 0 1 = 25 | 0 1 1 0 |
| | | 0 1 0 | 1 0 0 1 0 0 = 36 | 1 0 0 1 |
| | | 0 1 1 | 1 1 0 0 0 1 = 49 | 1 1 0 0 |
| | | 1 0 0 | 1 1 1 1 1 1 = 63 | 1 1 1 1 |
| | | 1 0 1 | 1 1 1 1 1 1 = 63 | 1 1 1 1 |
| | | 1 1 0 | 1 1 1 1 1 1 = 63 | 1 1 1 1 |
| | | 1 1 1 | 1 1 1 1 1 1 = 63 | 1 1 1 1 |
| 1 0 | $(12-D)^2$ | 0 0 0 | 1 1 1 1 1 1 = 63 | 1 1 1 1 |
| | | 0 0 1 | 1 1 1 1 1 1 = 63 | 1 1 1 1 |
| | | 0 1 0 | 1 1 1 1 1 1 = 63 | 1 1 1 1 |
| | | 0 1 1 | 1 1 1 1 1 1 = 63 | 1 1 1 1 |
| | | 1 0 0 | 1 1 1 1 1 1 = 63 | 1 1 1 1 |
| | | 1 0 1 | 1 1 0 0 0 1 = 49 | 1 1 0 0 |
| | | 1 1 0 | 1 0 0 1 0 0  36 | 1 0 0 1 |
| | | 1 1 1 | 0 1 1 0 0 1 = 25 | 0 1 1 0 |
| 1 1 | Showing Maximum Value | X X | 1 1 1 1 1 1 = 63 | 1 1 1 1 |

FIG. 32

| DOMAIN | DOMAIN CONDITION | ISEL0[1:0]   QSEL0[1:0] |
|---|---|---|
| 1 | ID[0] = 1 & QD[0] = 1 & IE[2] = 1 & IE[2] = 0 | • ISEL0[1:0] = 10<br>• QSEL0[1:0] = 01 |
| 2 | ID[0] = 1 & QD[0] = 0 & IE[2] = 1 | • ISEL0[1:0] = 10<br>• QSEL0[1:0] = 00 |
| 3 | ID[0] = 1 & QD[0] = 1 & IE[2] = 1 & IE[2] = 1 | • ISEL0[1:0] = 10<br>• QSEL0[1:0] = 10 |
| 4 | ID[0] = 0 & QD[0] = 1 & IE[2] = 0 | • ISEL0[1:0] = 00<br>• QSEL0[1:0] = 10 |
| 5 | ID[0] = 1 & QD[0] = 1 & IE[2] = 0 & IE[2] = 1 | • ISEL0[1:0] = 01<br>• QSEL0[1:0] = 10 |
| 6 | ID[0] = 1 & QD[0] = 0 & IE[2] = 0 | • ISEL0[1:0] = 01<br>• QSEL0[1:0] = 00 |
| 7 | ID[0] = 1 & QD[0] = 1 & IE[2] = 0 & IE[2] = 0 | • ISEL0[1:0] = 01<br>• QSEL0[1:0] = 01 |
| 8 | ID[0] = 0 & QD[0] = 1 & IE[2] = 0 | • ISEL0[1:0] = 00<br>• QSEL0[1:0] = 01 |
| 9 | ID[0] = 0 & QD[0] = 0 | • ISEL0[1:0] = 00<br>• QSEL0[1:0] = 00 |

FIG. 35

| DOMAIN | DOMAIN CONDITION | ISEL[1:0], QSEL[1:0] |
|---|---|---|
|  | ID[3:0]=0000 | · ISEL[1:0] = 1 1<br>· QSEL[1:0] = 1 1 |
| 1 | ID[3:0]=0001<br>&<br>QD[3:0]=1001<br>&<br>IE[2]=0<br>&<br>QE[2]=0 | · ISEL[1:0] = 1 0<br>· QSEL[1:0] = 0 1 |
| 2 | ID[3:0]=0001<br>&<br>QD[3:0]=1000<br>&<br>IE[2]=0 | · ISEL[1:0] = 1 0<br>· QSEL[1:0] = 0 0 |
| 3 | ID[3:0]=0001<br>&<br>QD[3:0]=0111<br>&<br>IE[2]=0<br>&<br>QE[2]=1 | · ISEL[1:0] = 1 0<br>· QSEL[1:0] = 1 0 |

FIG. 36

| SEL[1:0] | EXPRESSION FOR CALCULATING BRANCH METRIC VALUE | D[2:0] | CALCULATED VALUE | BRNT[4:0] |
|---|---|---|---|---|
| 0 0 | $(4-D)^2$ | 0 0 0 | 0 0 1 0 0 0 0 = 1 6 | 0 0 1 0 0 |
| | | 0 0 1 | 0 0 0 1 0 0 1 = 9 | 0 0 0 1 0 |
| | | 0 1 0 | 0 0 0 0 1 0 0 = 4 | 0 0 0 0 1 |
| | | 0 1 1 | 0 0 0 0 0 0 1 = 1 | 0 0 0 0 0 |
| | | 1 0 0 | 0 0 0 0 0 0 0 = 0 | 0 0 0 0 0 |
| | | 1 0 1 | 0 0 0 0 0 0 1 = 1 | 0 0 0 0 0 |
| | | 1 1 0 | 0 0 0 0 1 0 0 = 4 | 0 0 0 0 1 |
| | | 1 1 1 | 0 0 0 1 0 0 1 = 9 | 0 0 0 1 0 |
| 0 1 | $(4+D)^2$ | 0 0 0 | 0 0 1 0 0 0 0 = 1 6 | 0 0 1 0 0 |
| | | 0 0 1 | 0 0 1 1 0 0 1 = 2 5 | 0 0 1 1 0 |
| | | 0 1 0 | 0 1 0 0 1 0 0 = 3 6 | 0 1 0 0 1 |
| | | 0 1 1 | 0 1 1 0 0 0 1 = 4 9 | 0 1 1 0 0 |
| | | 1 0 0 | 1 0 0 0 0 0 0 = 6 4 | 1 0 0 0 0 |
| | | 1 0 1 | 1 0 1 0 0 0 1 = 8 1 | 1 0 1 0 0 |
| | | 1 1 0 | 1 1 0 0 1 0 0 = 1 0 0 | 1 1 0 0 1 |
| | | 1 1 1 | 1 1 1 1 0 0 1 = 1 2 1 | 1 1 1 1 0 |
| 1 0 | $(12-D)^2$ | 0 0 0 | 1 1 1 1 1 1 1 = 1 2 7 | 1 1 1 1 1 |
| | | 0 0 1 | 1 1 1 1 0 0 1 = 1 2 1 | 1 1 1 1 0 |
| | | 0 1 0 | 1 1 0 0 1 0 0 = 1 0 0 | 1 1 0 0 1 |
| | | 0 1 1 | 1 0 1 0 0 0 1 = 8 1 | 1 0 1 0 0 |
| | | 1 0 0 | 1 0 0 0 0 0 0 = 6 4 | 1 0 0 0 0 |
| | | 1 0 1 | 0 1 1 0 0 0 1 = 4 9 | 0 1 1 0 0 |
| | | 1 1 0 | 0 1 0 0 1 0 0 = 3 6 | 0 1 0 0 1 |
| | | 1 1 1 | 0 0 1 1 0 0 1 = 2 5 | 0 0 1 1 0 |
| 1 1 | Showing Maximum Value | × × × | 1 1 1 1 1 1 1 = 1 2 7 | 1 1 1 1 1 |

※ NUMBERS WRITTEN IN DATA OF SEL[4:0] ARE EXPRESSED WITH SEXADECIMAL NUMBERS.

FIG. 48

| DOMAIN | DOMAIN CONDITION | ID0[2:0], QD0[2:0] | |
|---|---|---|---|
| 1 | ID[0]=1 & QD[0]=1 & IE[2]=1 & QE[2]=0 | · ID0[2:0]:ID[3:1]<br>· QD0[2:0]:QD[3:1] | Add one<br>Through |
| 2 | ID[0]=1 & QD[0]=0 & IE[2]=1 | · ID0[2:0]:ID[3:1]<br>· QD0[2:0]:QD[3:1] | Add one<br>Through |
| 3 | ID[0]=0 & QD[0]=1 & IE[2]=1 & QE[2]=1 | · ID0[2:0]:ID[3:1]<br>· QD0[2:0]:QD[3:1] | Add one<br>Add one |
| 4 | ID[0]=0 & QD[0]=1 & QE[2]=1 | · ID0[2:0]:ID[3:1]<br>· QD0[2:0]:QD[3:1] | Through<br>Add one |

FIG. 49

| | | | |
|---|---|---|---|
| 5 | ID[0]=1 & QD[0]=1 & IE[2]=0 & QE[2]=1 | · IDO[2:0]:ID[3:1]<br>· QDO[2:0]:QD[3:1] | Through<br>Add one |
| 6 | ID[0]=1 & QD[0]=0 & IE[2]=0 | · IDO[2:0]:ID[3:1]<br>· QDO[2:0]:QD[3:1] | Through<br>Through |
| 7 | ID[0]=1 & QD[0]=1 & IE[2]=0 & QE[2]=0 | · IDO[2:0]:ID[3:1]<br>· QDO[2:0]:QD[3:1] | Through<br>Through |
| 8 | ID[0]=0 & QD[0]=1 & QE[2]=0 | · IDO[2:0]:ID[3:1]<br>· QDO[2:0]:QD[3:1] | Through<br>Through |
| 9 | ID[0]=0 & QD[0]=0 | · IDO[2:0]:ID[3:1]<br>· QDO[2:0]:QD[3:1] | Through<br>Through |

| DOMAIN (I) | DOMAIN CONDITION (II) | ID0[2:0], QD0[2:0] | |
|---|---|---|---|
| 1 | ID[0]=1 & QD[3:1]=111 & IE[2]=0 | • ID0[2:0]:ID[3:1]<br>• QD0[2:0]:QD[3:1] | Through<br>Through |
| 2 | ID[0]=1 & QD[3:1]=111 & IE[2]=1 | • ID0[2:0]:ID[3:1]<br>• QD0[2:0]:QD[3:1] | Add one<br>Through |
| 3 or 3 | ID[3:1]=111 or QD[3:1]=111 | • ID0[2:0]:ID[3:1]<br>• QD0[2:0]:QD[3:1] | Through<br>Through |
| 4 | ID[3:1]=111 & QD[0]=1 & IE[2]=1 | • ID0[2:0]:ID[3:1]<br>• QD0[2:0]:QD[3:1] | Through<br>Add one |
| 5 | ID[3:1]=111 & QD[0]=1 & IE[2]=0 | • ID0[2:0]:ID[3:1]<br>• QD0[2:0]:QD[3:1] | Through<br>Through |

DECODER EMPLOYING VITERBI DECODING METHOD FOR DECODING CODED MULTI-VALUED SIGNAL

BACKGROUND OF THE INVENTION

1. Field of the Invention

The present invention relates to a decoder for decoding coded multi-valued signals. More particularly, it relates to a decoder, which employs a Viterbi decoding method for decoding coded multi-valued signals and is provided on a receiver circuit of digital multiplexing radio equipment.

2. Description of the Related Art

Multiplexing Radio Transmission systems multiplex a plurality of channels and transmit them to remote stations. In recent years, to transmit a large number of channel signals in such the system, the multiplication level of signals has become large. Accordingly, the speed of transmitting mutiplexed signals has become high.

Therefore, radio transmission systems for multiplexed channel signals employing a multi-valued QAM (Quadrature Amplitude Modulation) coding or the like have been used.

It has been an object of attention to employ a convolutional coding method that has a high error correcting function and is suitable for a communication system, and a Viterbi decoding method corresponding to the coding method. It is required for performing the Viterbi decoding of coded multi-valued QAM signals to which the convolutional coding method is employed to find distances (Euclidean distance) between a plurality of predetermined signal points allocated on a plane formed of Ich and Qch axes crossed at right angles and signal points of the received signals.

An Euclidean distance can be obtained by calculating the second power of a distance between coordinates of a predetermined signal point and the signal point of a received signal. The signal point of the received signal is designated as (x, y), and a predetermined signal point, which is the closest to (x, y) selected from the plurality of predetermined signal points allocated on the plane formed of the above-described Ich and Qch axes is used as (X, Y). Consequently, the second power of the Euclidean distance for the received signal is given as an expression of $(X-x)^2+(Y-y)^2$.

When the expression is realized in an arithmetic and logic unit, it is formed of three arithmetic executions, i.e., subtraction, multiplication and addition. Accordingly, it requires an arithmetic circuit of which a number of basic cells is small to obtain high speed operation and miniaturization of an apparatus.

The arithmetic circuit can be formed of a ROM. However, the ROM is required to have $2^{14}$ addresses, when the Euclidean distances which are calculated for Viterbi decoding are obtained by a main signal of 4 bits and an error signal of 3 bits in the Ich direction, and a main signal of 4 bits and an error signal of 3 bits in the Qch direction.

When employing the ROM as a complied cell, a number of basic cells becomes too large. Further, when a ROM is provided outside, it is not advantageous in view of costs and mounting areas.

SUMMARY OF THE INVENTION

Accordingly, it is an object of the present invention to provide a decoder, which decodes coded multi-valued signals with the use of a Viterbi decoding method, and makes it possible to use an arithmetic circuit of high speed and including a small number of basic cells.

It is another object of the present invention to provide a decoder for decoding coded multi-valued signals, in which the same functions as subtractions and multiplications are performed by selecting one arithmetic expression from a various kinds of predetermined expressions, and employing logic of only a selection signal for the arithmetic expression and error signals without any real arithmetic executions in a calculation of Euclidean distances obtained when performing Viterbi decoding.

It is a further object of the present invention to provide a decoder for decoding coded multi-valued signals with the use of employing a Viterbi decoding method, which can operate with high speed and be formed by a minimized number of basic cells, by that signal points of received signals are coded and logic between the received signals and the coded signals is obtained in calculations of Euclidean distances obtained when performing Viterbi decoding.

To realize the above-explained objects, a Viterbi decoder for decoding a received signal having Ich and Qch components, which are obtained by demodulating a convolutional coded multi-valued quadrature amplitude modulated to the present invention has a basic structure as follows;

A first means inputs the received signal having Ich and Qch components, a second means operatively connected to the first means for obtaining Euclidean distance between a predetermined signal point, which is one of a plurality of predetermined signal points allocated on a plane formed of Ich and Qch axes orthogonally crossed and a signal point of the received signal, and a third means performs Viterbi decoding based on the Euclidean distance obtained by the second means.

As explained above, according to the present invention, it can be realized to perform the processing with high speed and minimize a number of basic cells by selecting a calculating expression from predetermined expressions and having the same functions as subtractions and multiplications with selecting a calculating expression and only logic of error signals without any real execution in an arithmetic operation of Euclideans distances obtained when performing Viterbi decoding.

Further, objects of the present invention will be apparent from the following detailed description of preferred embodiments of the invention with reference to the drawings.

BRIEF DESCRIPTION OF THE DRAWINGS

FIG. 5 is an explanatory diagram of signal point allocation (mapping).

FIG. 11 is a diagram showing the relationship between domain and domain condition and selecting signals SELI and SELQ.

FIG. 14 is a diagram showing the correspondence between domain and domain condition and selecting signal.

FIG. 15 is a diagram showing the correspondence between selecting signal SEL and expression for calculating Euclidean distance.

FIG. 32 is a diagram showing the relationship between each domain and domain condition and outputs ISEL and QSEL.

FIG. 35 is a diagram showing the relationship between domain and domain condition and selecting signals ISEL and QSEL.

FIG. 36 is a diagram showing the correspondence between selecting signal SEL and branch-metric value calculating expression.

FIG. 48 is a diagram showing the relationship between domain and domain condition and outputs ID0 and QD0 (No. 1) corresponding to FIG. 47.

FIG. 49 is a diagram showing the relationship between domain and domain condition and outputs ID0 and QD0 (No. 2) corresponding to FIG. 47.

FIG. 50 is a diagram showing one section (domain out of a bold line) cut out from the demapping table shown in FIG. 46.

FIG. 52 is a diagram showing the relationship between domain and domain condition and outputs ID0 and QD0 corresponding to FIGS. 50 and 51.

FIG. 54 is a diagram showing demapping table at time of employing 64-valued QAM system.

DESCRIPTION OF THE PREFERRED EMBODIMENTS

Figure 1A:
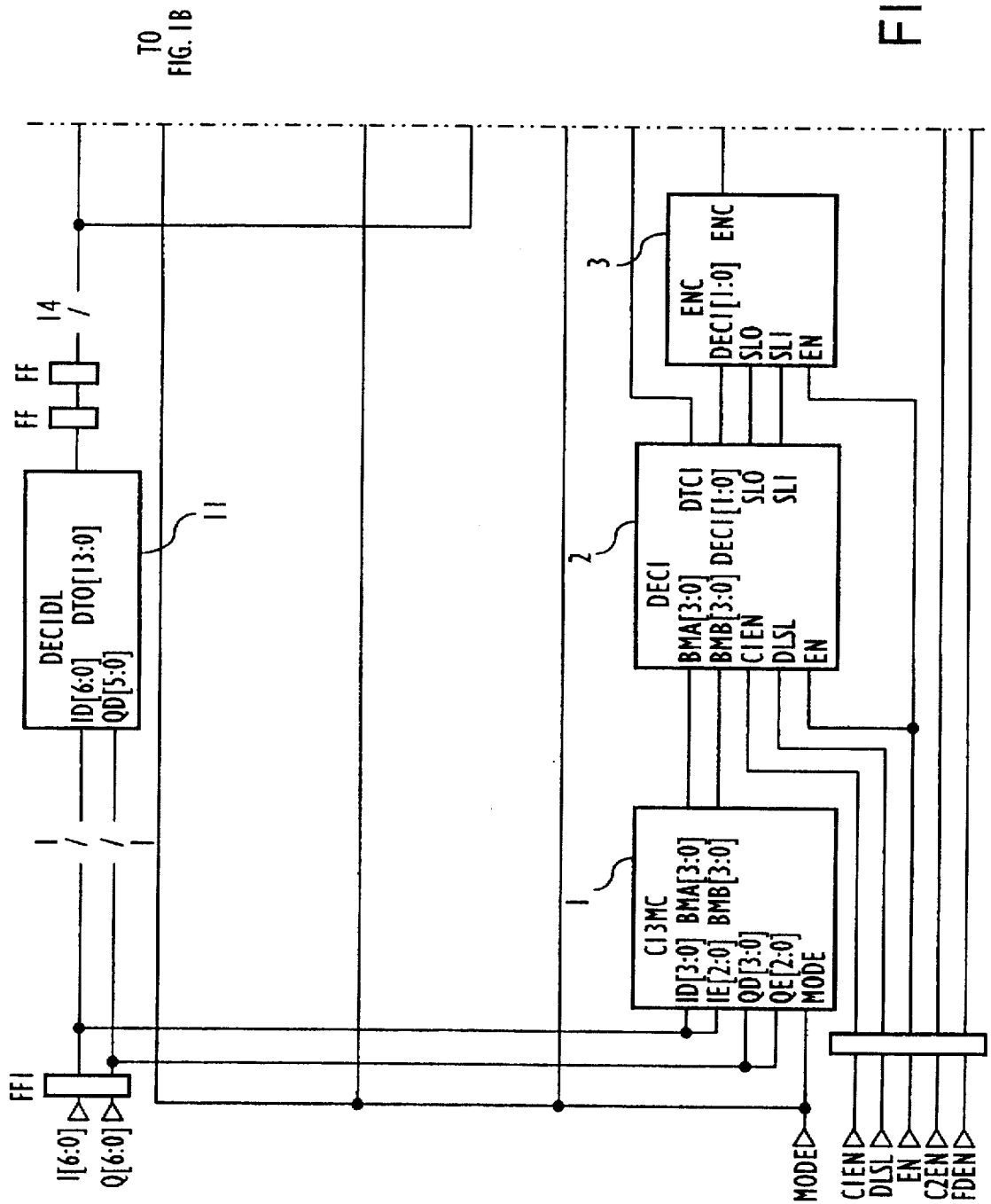
FIGS. 1A and 1B are block diagrams according to an embodiment of the present invention.

A preferred embodiment according to the present invention will be explained in conjunction with drawings. Throughout the following description, the same reference numerals are used to denote and identify corresponding or identical components.

Figure 1B:
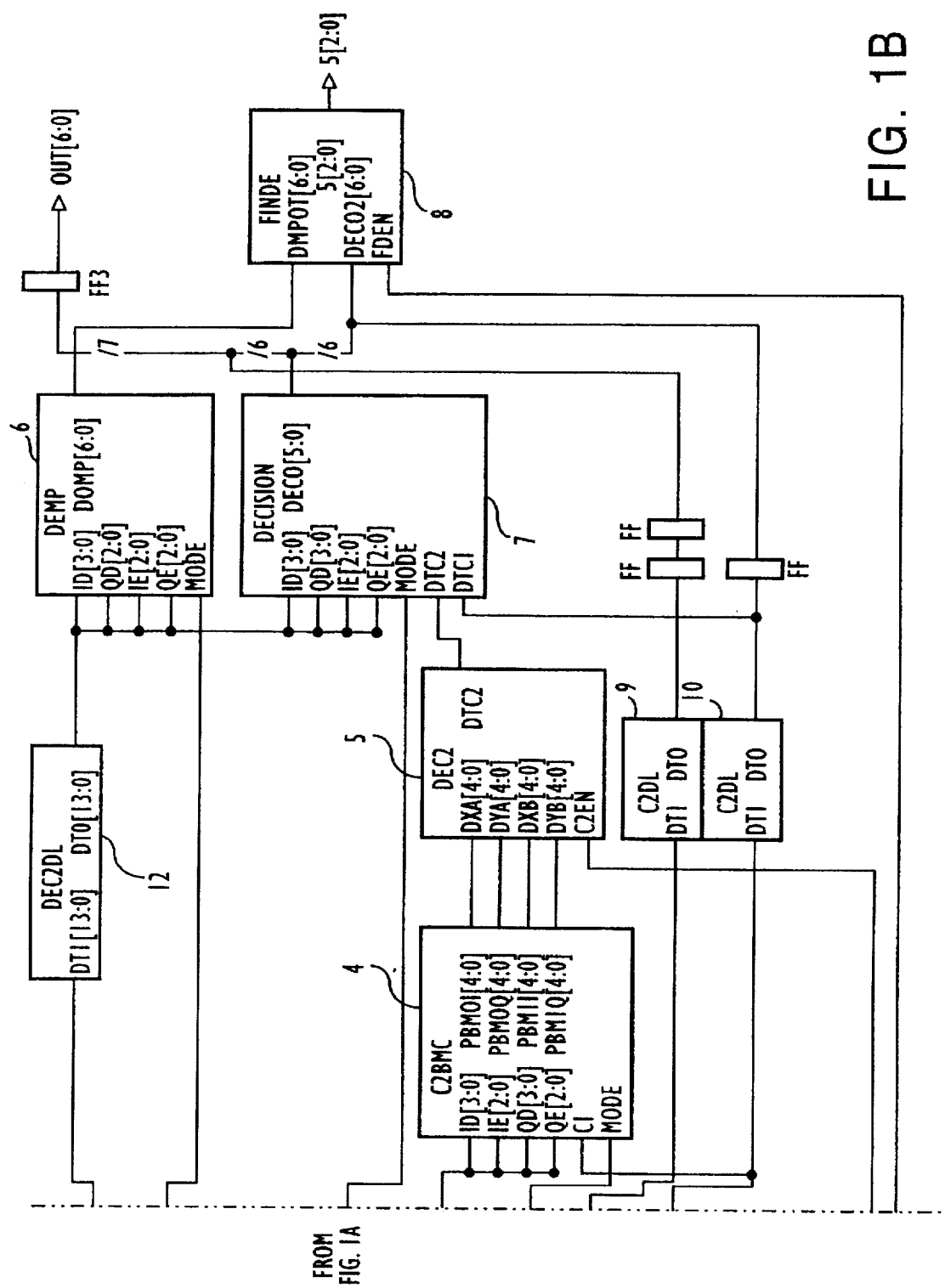
Figures 1, 18:
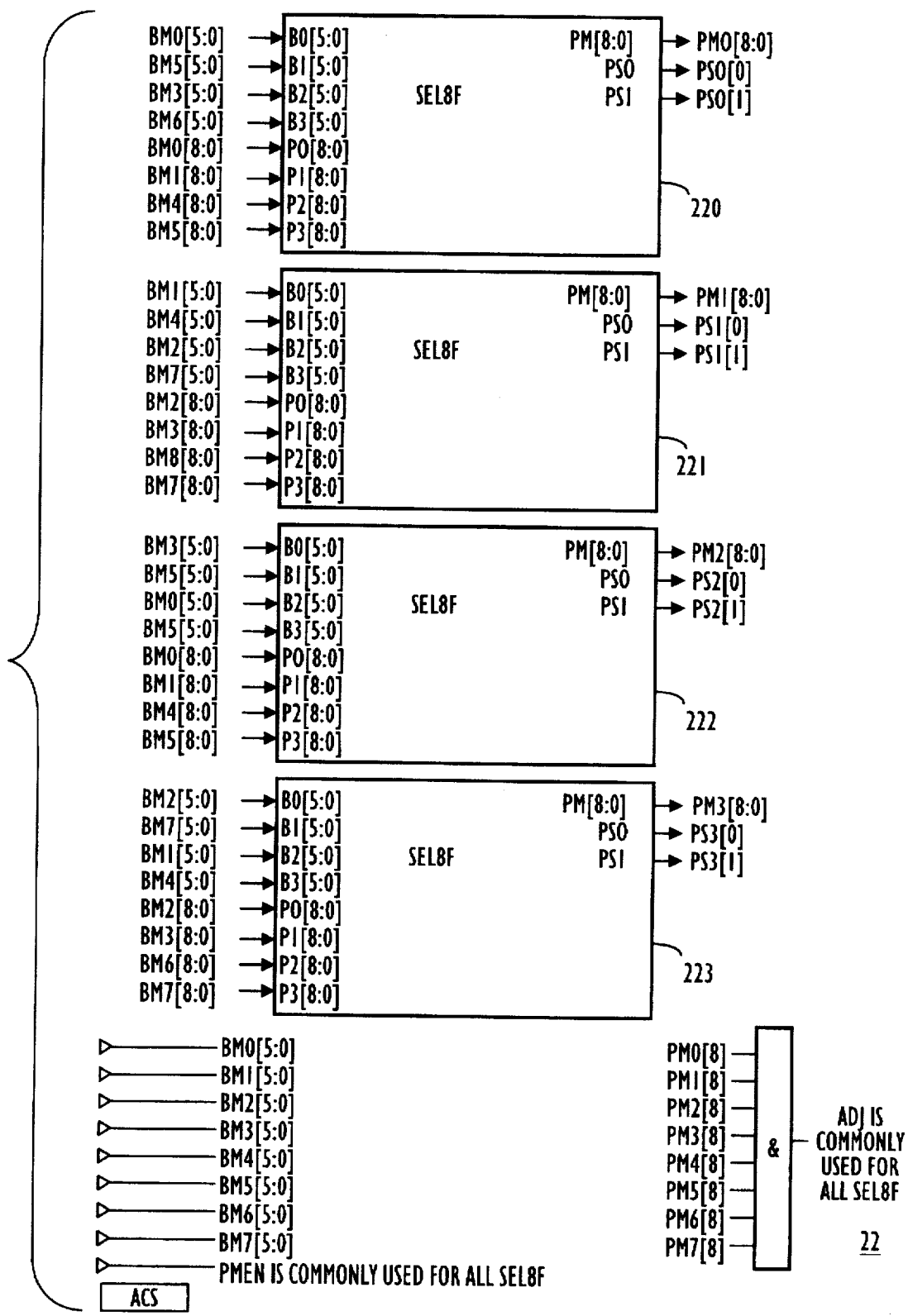
FIG. 18 is a diagram illustrating a structural example of addition, comparison or selection circuit (ACS).
Figures 2, 18:
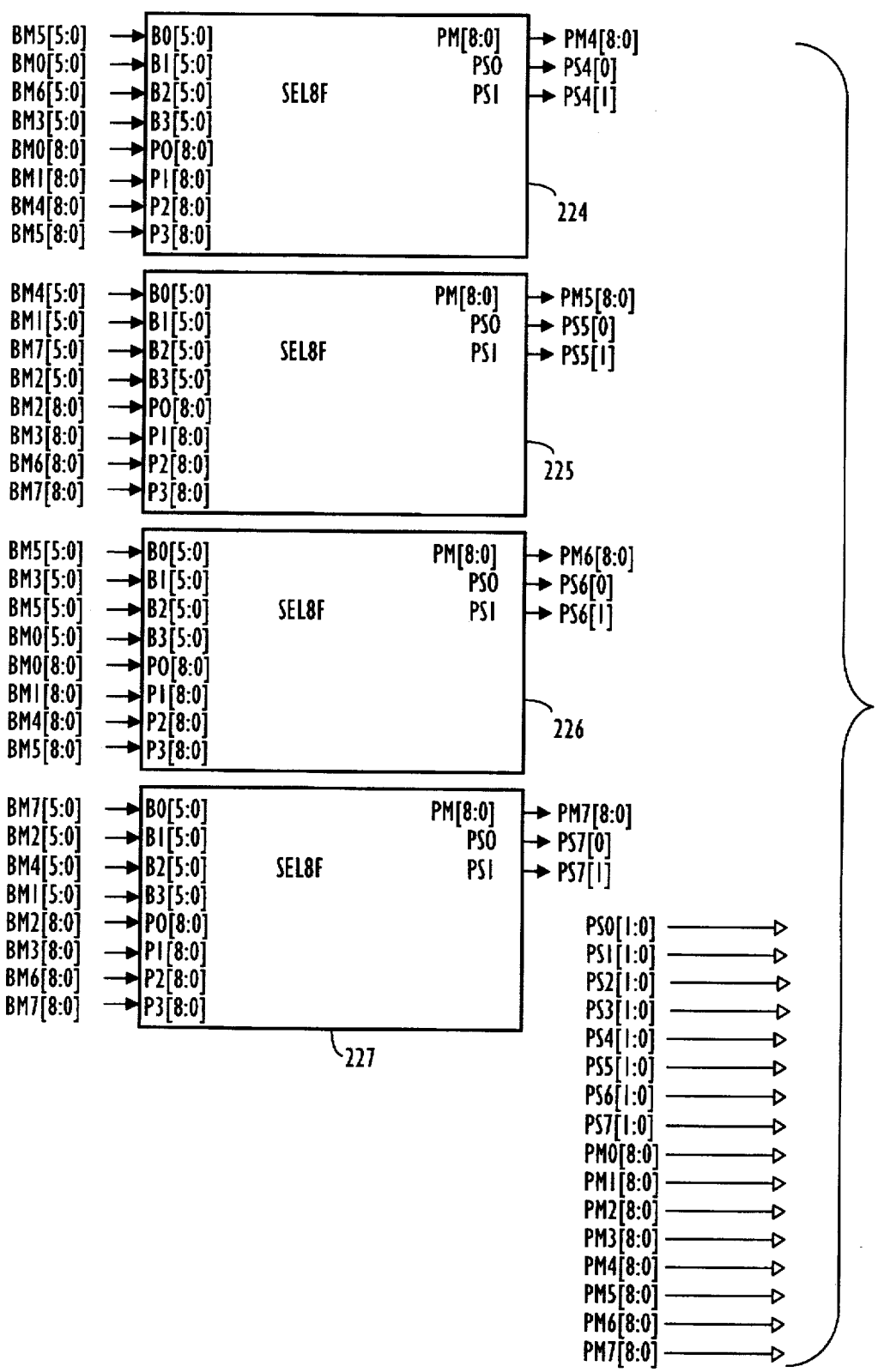

FIGS. 1A and 1B are block diagrams of a decoder for decoding multi-valued coded signals with employing a Viterbi decoding method according to the present invention. In FIGS. 1A and 1B, input I and Q received signals mean an Ich component, i.e., an Ich main signal ID and an Ich error signal IE, and a Qch component, i.e., a Qch main signal QD and a Qch error signal QE of the multi-valued QAM coded signal, respectively. The main and error signals are respectively obtained via a multi-valued QAM demodulator and an error detecting circuit, not shown in the diagram. In FIG. 1, Ich and Qch received signals are shown as I[6:0] and Q[6:0], which mean parallel signals $I_6$ to $I_0$, and $Q_6$ to $Q_0$ of 7 bits, respectively (hereinafter, numbers in brackets [ ] following signals have the same definition).

I and Q received signals are inputted via a flip flop FF1, and Viterbi decoding and parity check arithmetic operation are performed for the I and Q received signals in series circuits of a C1 branch-metric value calculator 1, a C1 decoder 2, an encoder 3, C2 branch-metric value calculator 4, a C2 decoder 5 and a decision circuit 7.

The I and Q received signals are also inputted to a demapping section 6 via delay circuits 11 and 12 and are demapped. The results of demapping and decoding, which are obtained respectively from the demapping section 6 and the decision circuit 7, are inputted to an error correcting bit number counter 8.

Then, the results of decoding and C1 re-coding obtained from the decision circuit 7 are compared with the demapping result of the received signal, and an error corrected bit number is detected.

Accordingly, the delay circuits 11 and 12 give a delay amount to make a timing of inputting the I and Q received signals to the demapping section 6 correspond with a timing of outputting the decoding result from the C2 decoder 5.

More particularly, the delay circuits 11 and 12 give a delay time so that a timing of inputting the output of the encoder 3 coincides with a timing of inputting the outputs of the demapping section 6 and the decision circuit 7 to the error correcting bit number counter 8.

In FIG. 1A, C1EN means a C1 decoding termination pulse at the position of a frame bit, DLSL is a timing control pulse at the position of a frame bit, EN is a C1 re-coding termination pulse, C2EN is a C2 decoding termination pulse at the position of a frame bit, and FDEN is an error detecting termination pulse.

MODE means a signal for switching a subset A to a subset B descried later.

Figure 2:
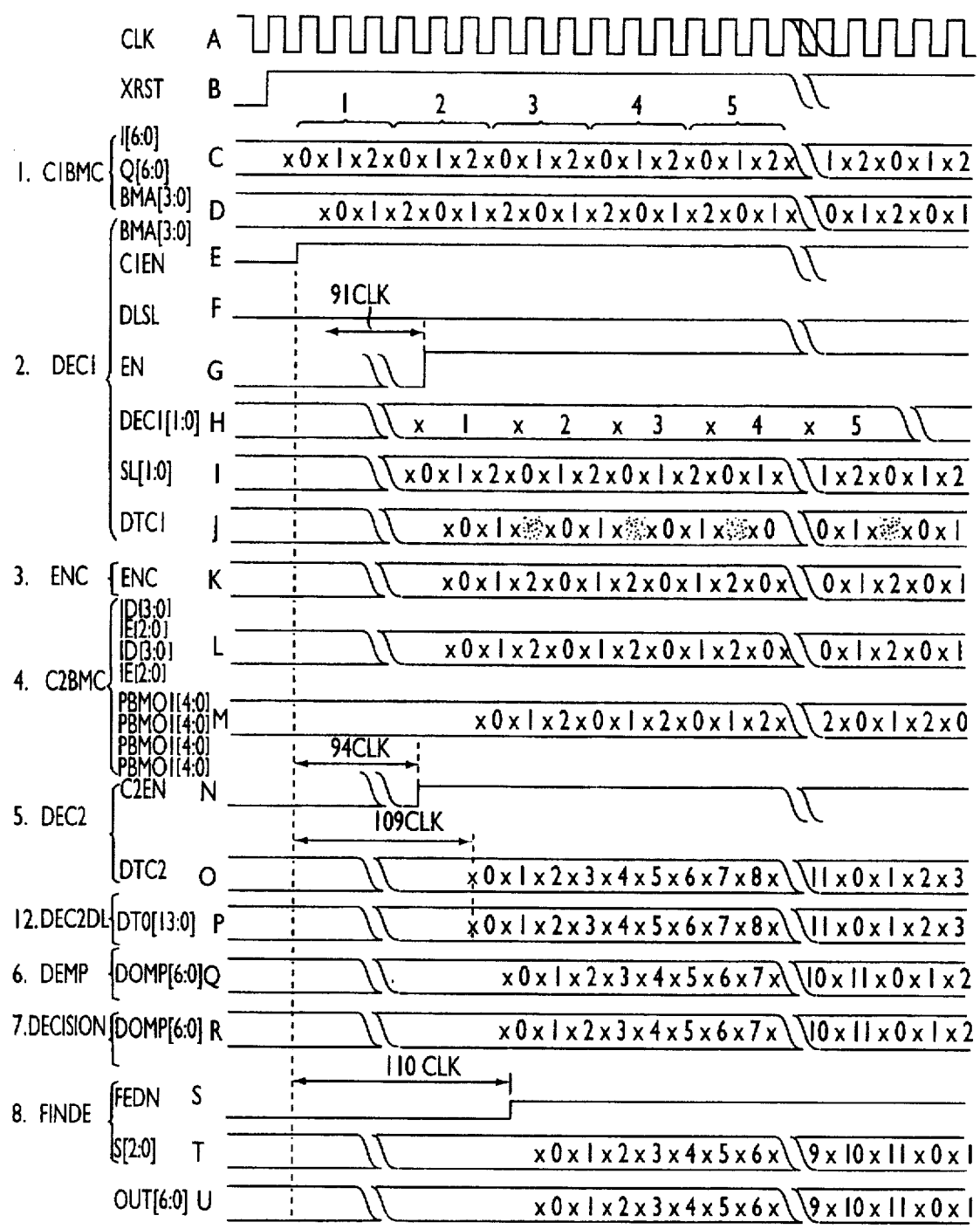
FIG. 2 is a diagram illustrating operation time chart (No. 1) according to the embodiment shown in FIGS. 1A and 1B.
Figure 3:
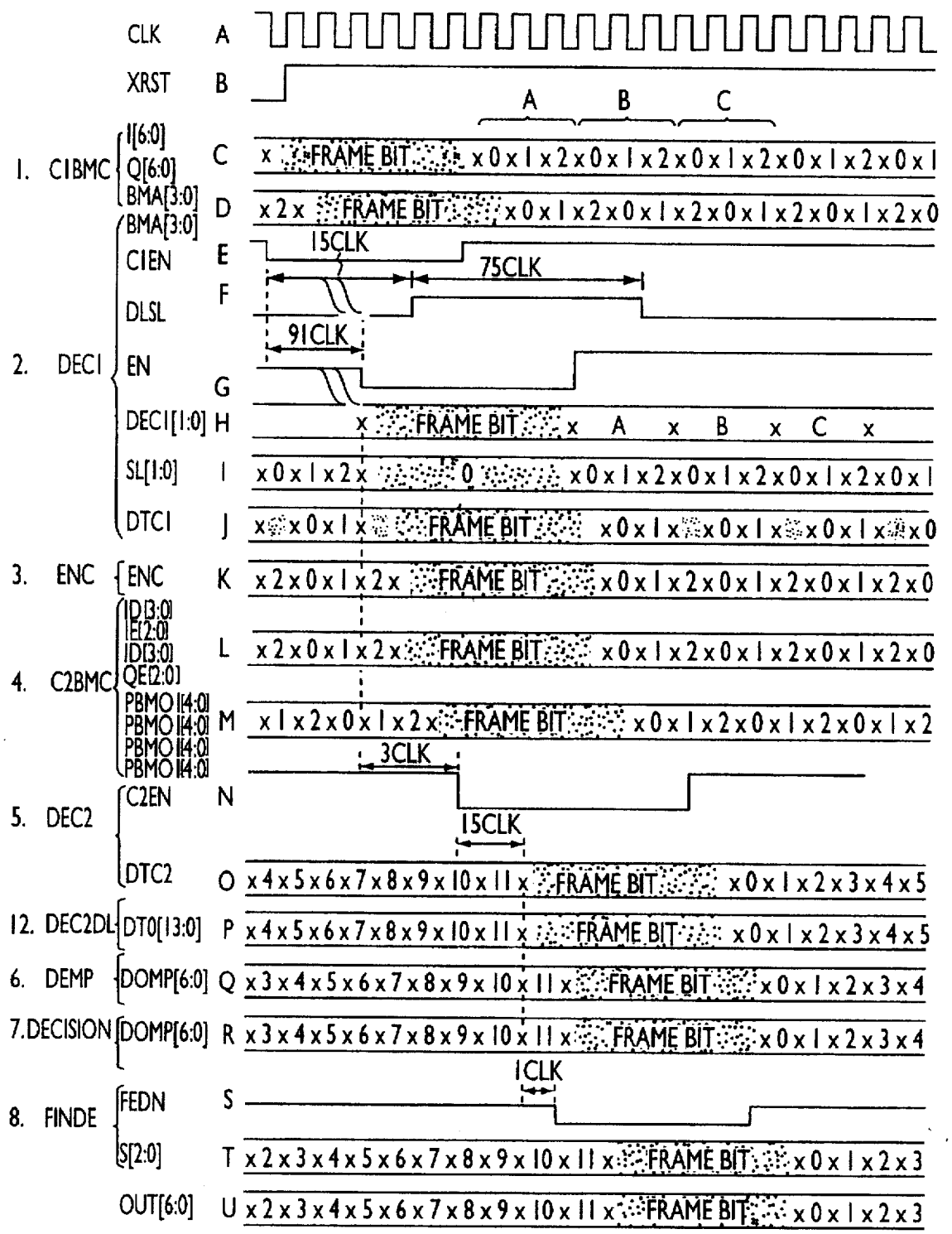
FIG. 3 is a diagram illustrating operation time chart (continued from FIG. 2) according to the embodiment shown in FIGS. 1A and 1B.

FIGS. 2 and 3 are operation time charts corresponding to each of the functional block diagrams shown in FIGS. 1A and 1B (In FIGS. 2 and 3, same reference numerals are used in the time charts corresponding to each of the functional block diagrams).

In FIGS. 2 and 3, CLK means a basic clock signal, and XRST denotes a receiving start signal, which becomes a high level during receiving status.

To understand following explanation of an embodiment according to the present invention, a structure of a code pattern and allocation (hereinafter referred to as mapping) of signal points corresponding to the structure will be explained.

Figure 4:
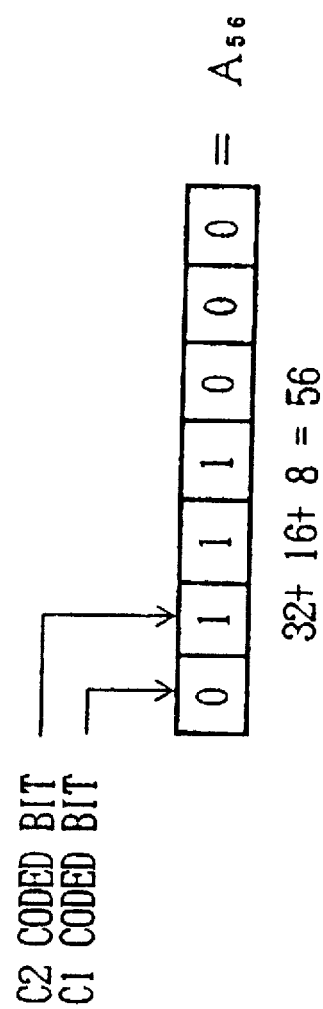
FIG. 4 is a diagram showing one example of coded pattern.

FIG. 4 shows an example of a coded signal pattern. The coded signal pattern includes a coded bit of level 1 (C1 coding) and a parity bit. The C1 coded bit is obtained by performing convolutional coding at the coded rate of ⅔. The parity bit is obtained by performing coding of level 2 (C2 coding) after the C1 coding.

In the coded signal having the coded pattern shown in FIG. 4, a first bit, i.e., MSB, is a C1 coded bit, and a second bit is a C2 coded bit. Further, the second bit to LSB indicate codes of which sizes are 0 to 63. Accordingly, the example shown in FIG. 4 indicates a signal $A_{56}$, of which code size is 32+16+8=56. As will be explained in following drawings, the signal $A_{56}$ is mapped to the coordinate of I=1011 and Q=0111.

FIG. 5 shows allocation (mapping) of signal points. Signals are divided into two subsets A and B with according to the value of the first bit, which is subject to the coding of level 1 (C1 coding). When the first bit is "0", the signal belongs to the subset A, whereas the signal belongs to subset B. In each set, a plurality of signal points are allocated on the plane formed of Ich and Qch axes crossed at a right angle.

In FIG. 5, A means a signal point of subset A, and B means a signal point of subset B. Returning to the example of the coded signal shown in FIG. 4, the first bit is "0" and the size is 56. Then, the signal $A_{56}$ is positioned at the location of $A_{56}$ in the subset A shown in FIG. 5, i.e., the signal is mapped to the coordinate of (I, Q)=(1011, 0111).

Consequently, the received signal having the coded pattern shown in FIG. 4 is demodulated by a demodulator provided on the input side of a decoder, for multi-valued coded signals, which uses a Viterbi decoding method according to the present invention, not shown in diagram. Then, signals corresponding to a mapping are outputted as Ich and Qch components from the demodulator.

When employing the 64-valued QAM system, each 3 bits of Ich and Qch components are outputted in correspondence with the mapping position. When employing the 128-valued QAM system, each 4 bits of Ich and Qch components are outputted.

Figure 6:
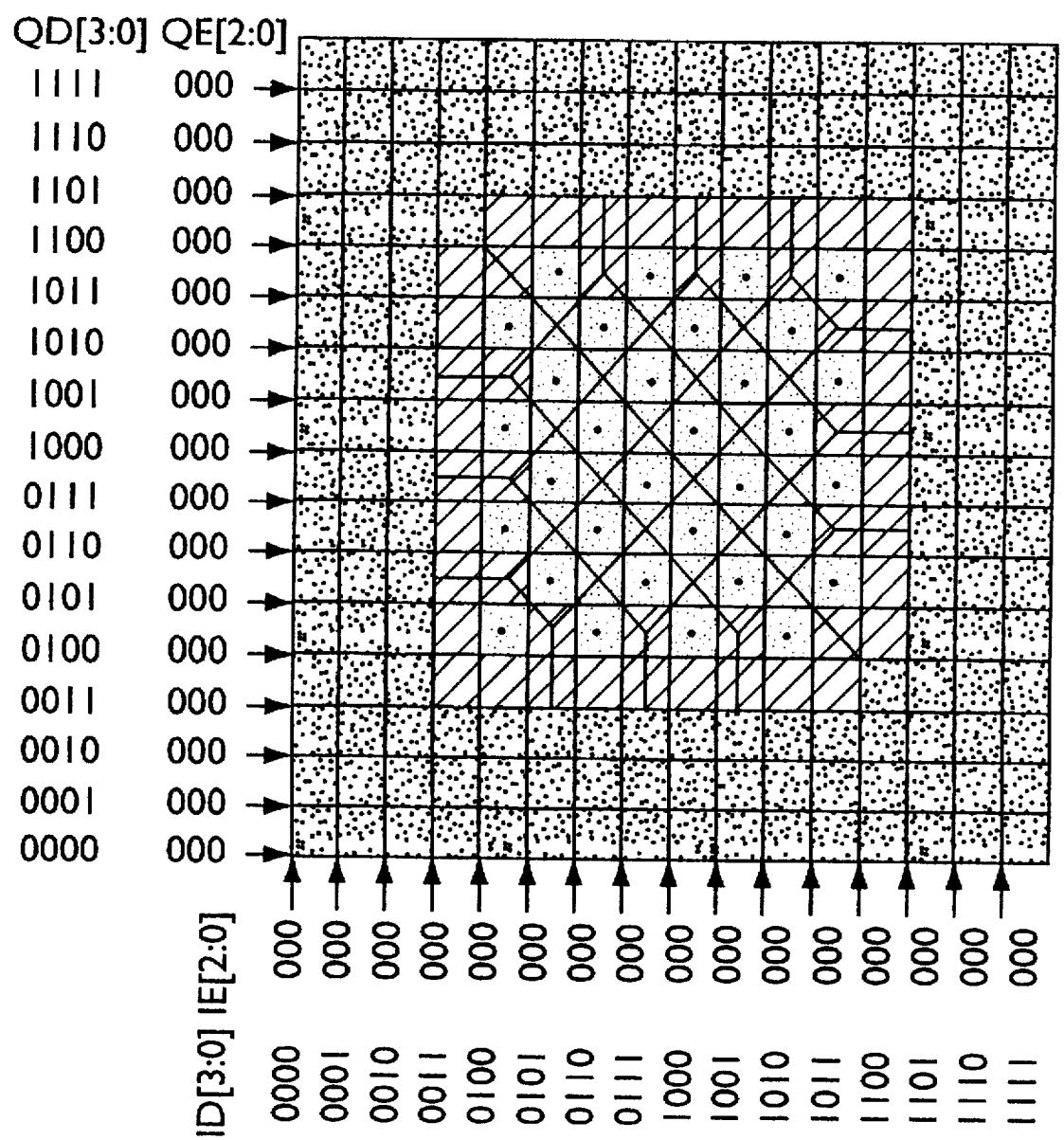
FIG. 6 is a diagram showing subset A of a distance calculation table at time of employing 64-valued QAM system.
Figure 7:
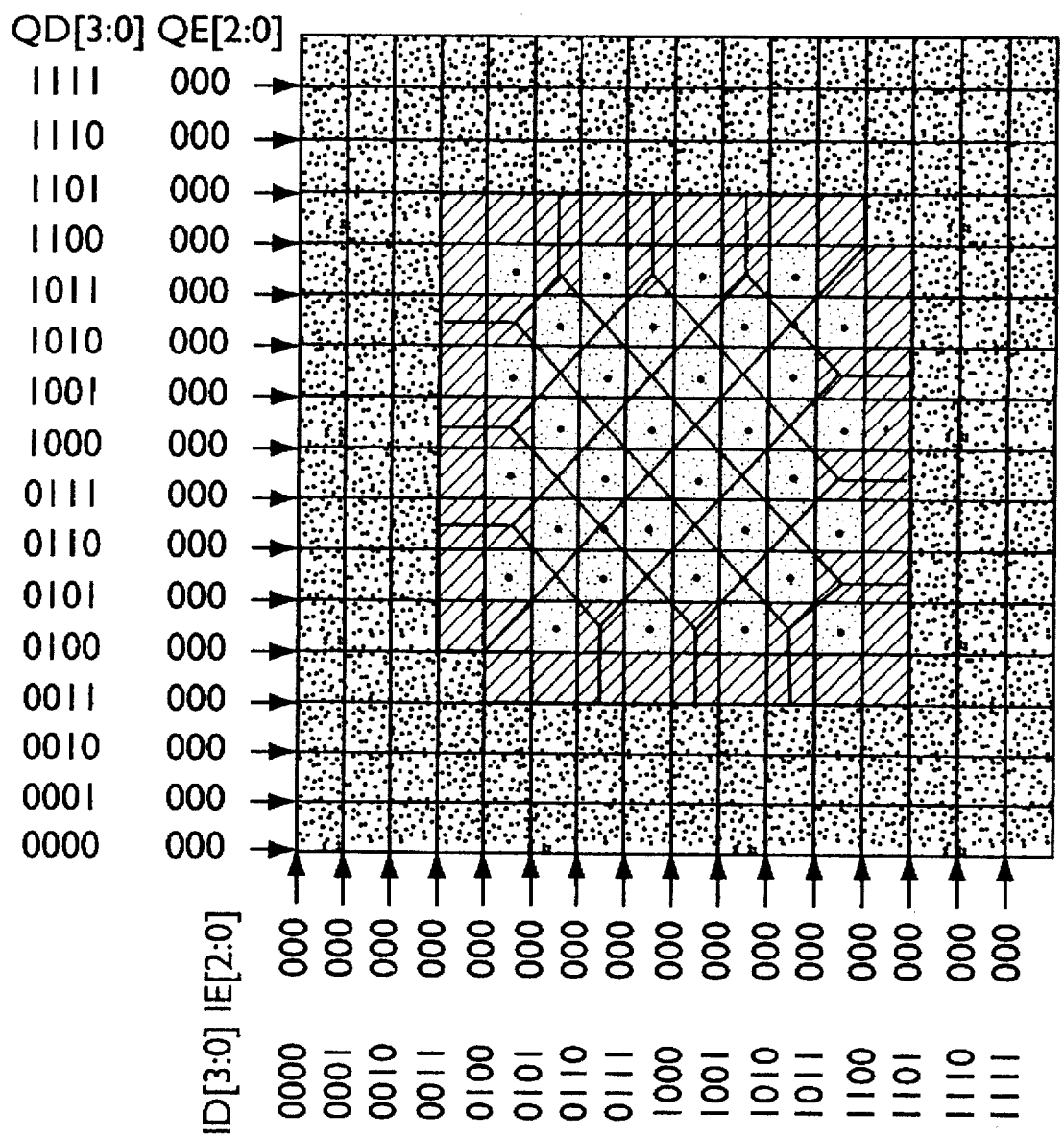
FIG. 7 is a diagram showing subset B of a distance calculation table at time of employing 64-valued QAM system.

FIGS. 6 and 7 show a table for calculating distance when employing the 64-valued QAM system, which are divided to subsets A and B. A table for calculating distance when 128-valued QAM system is employed, is also divided to subsets A and B, but a diagram to show the table is omitted. In FIGS. 6 and 7, black points show predetermined signal points.

Figure 8A:
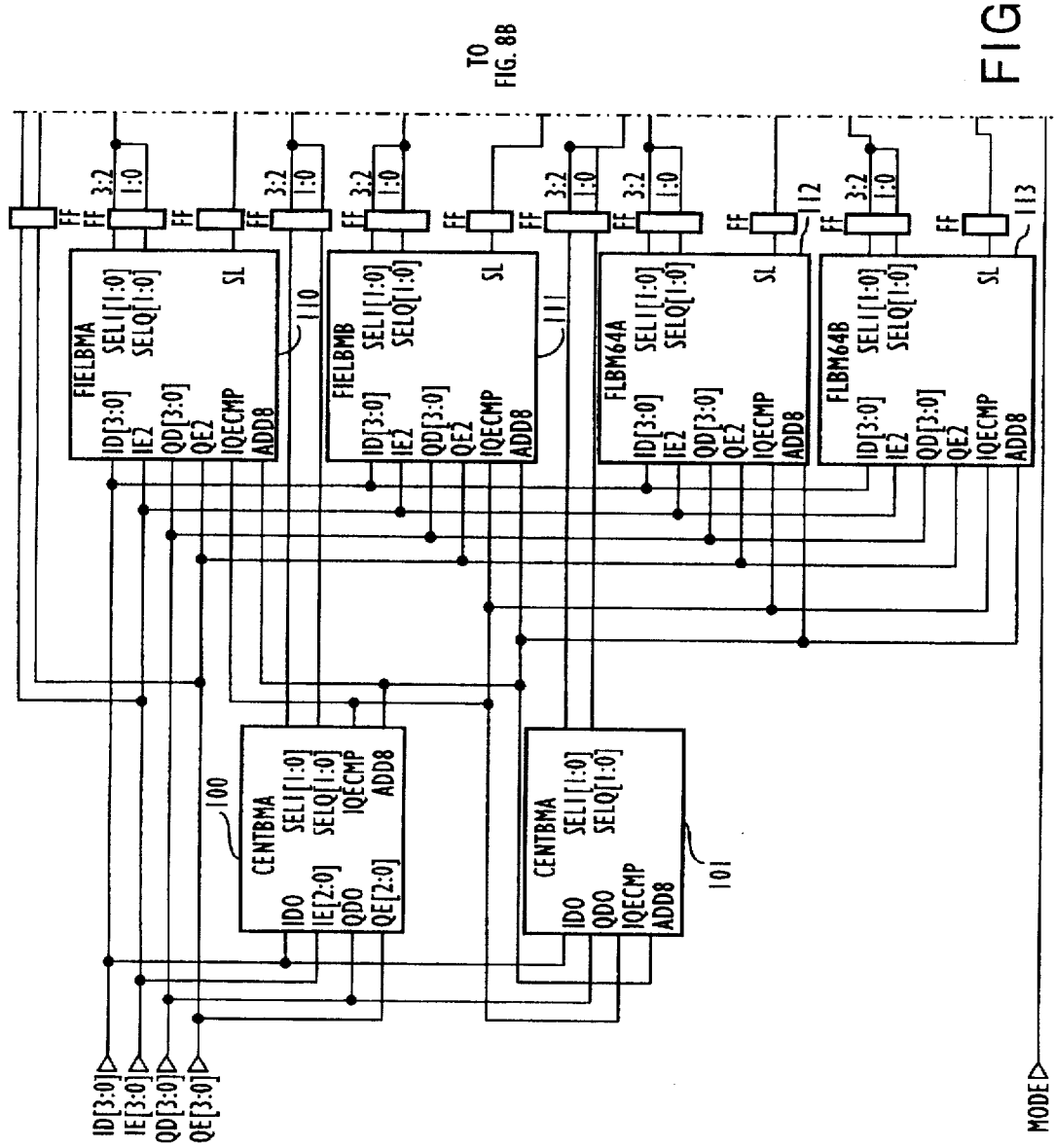
FIGS. 8A and 8B are diagrams illustrating a structural example of C1 branch-metric value calculator (C1BMC).
Figure 8B:
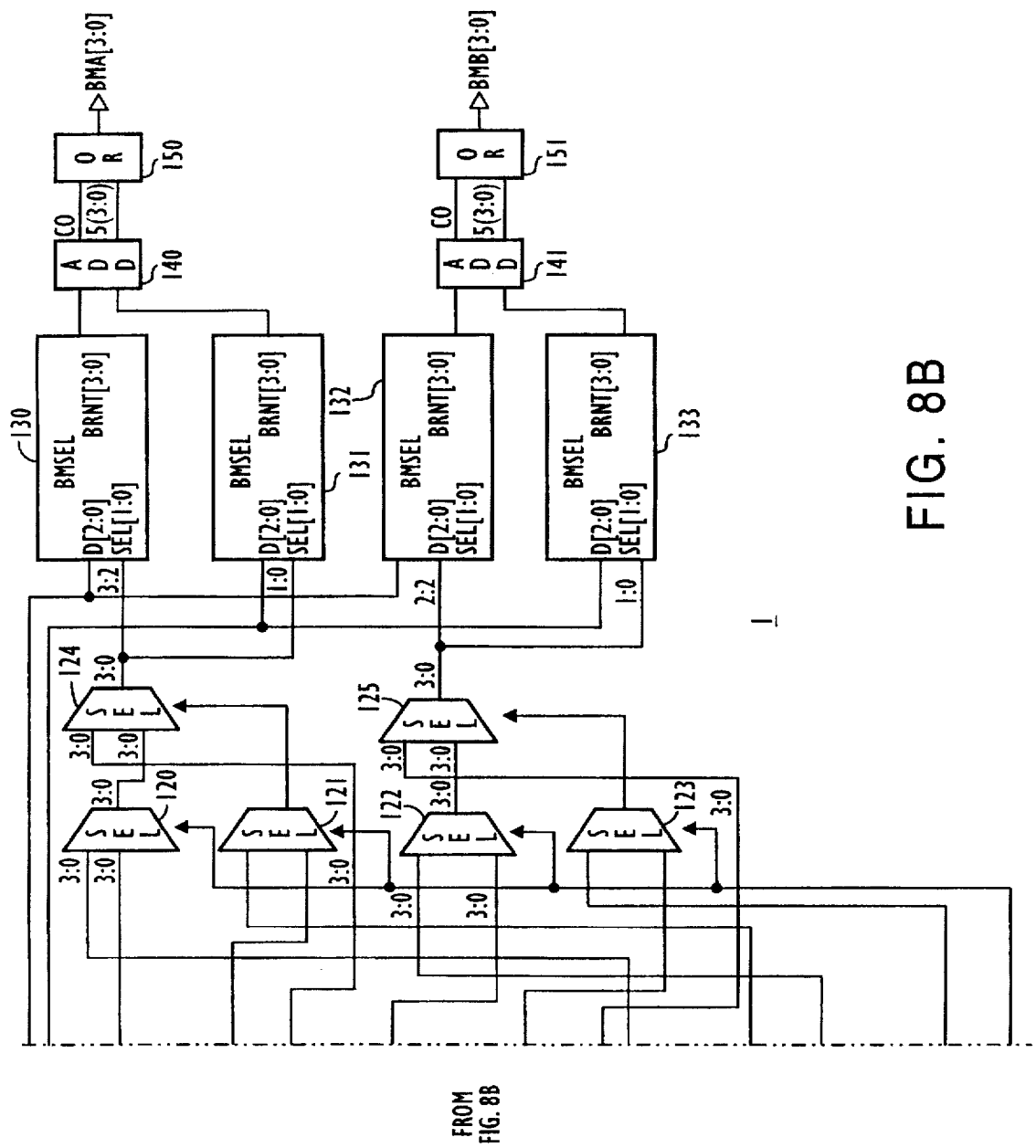

FIGS. 8A and 8B are block diagrams showing a detailed structural example of the C1 branch-metric value calculator 1. The C1 branch-metric calculator 1 is supplied with Ich and Qch components of the received signals and calculates Euclidean distance of a level 1 code (C1). More particularly, it calculates Euclidean distance BMA from the signal point of the received signal to the signal point of subset A (C1=0) and Euclidean distance BMB from the signal point of the received signal to the signal point of subset B (C1=1) and outputs them.

Timings of Ich and Qch components of the received signal and of an output BMA are shown in 1 (C1BMC) of the timing charts shown in FIGS. 2 and 3. Frame bits are inserted to repeated set of 3 bits of (012) [refer to FIG. 3].

The mode switching signal MODE is set to switch the equipment for the use are a 64-valued QAM system or a 128-valued QAM system. When the equipment is used as the 64-valued QAM system, the signal MODE is set to 0, while it is used as the 128-valued QAM system, the signal is set to 1.

Further, in FIG. 8A, an Ich main signal ID0 and an error signal IE are inputted to a first distance calculation table processing circuit 100 and the circuit 100 performs the processing for the domain enclosed with a bold line in the subset A of the distance calculation table [refer to FIG. 6]. Namely, the circuit 100 generates signals SELI and SELQ, which select an expression for calculating Euclidean distances are in the domain enclosed with a bold line.

The distance calculation table processing circuit 100 generates signals IQECMP and ADD8 which are used to signify domains described later, and outputs them to second distance calculation table processing circuits 110 to 113 along with the selecting signals SELI and SELQ.

A Qch main signal QD0 and an error signal QE are inputted to a second distance calculation table processing circuit 101 that performs the processing for the domain enclosed with a bold line in the subset B of the distance calculation table [refer to FIG. 7].

The circuit 101 outputs selecting signals SELI and SELQ and receives signals IQECMP and ADD8 instead of the error signals IE and QE.

Figure 9:
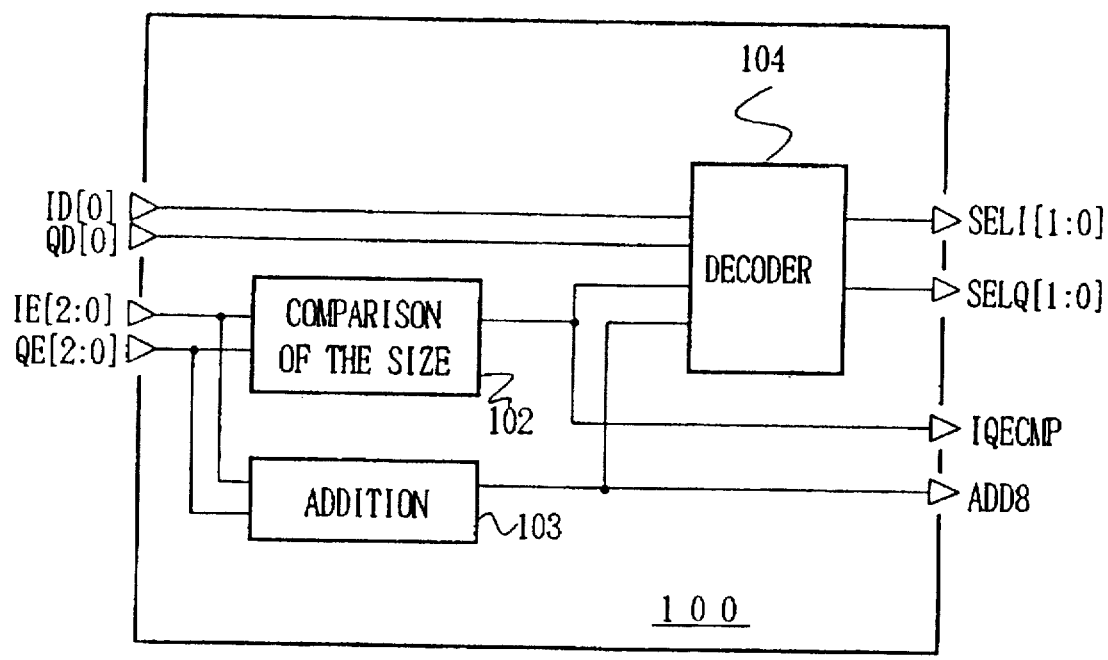
FIG. 9 is a diagram showing a distance calculation table processing circuit.

The distance calculation table processing circuits 100 and 101 have the structure shown in FIG. 9. The circuits 100 and 101 include a comparison circuit 102, an adding circuit 103 and a decoder circuit 104. In FIG. 9, the comparison circuit 102 compares the sizes of decimal number of the error signals IE and QE.

When IE is more than QE, the signal IQECMP becomes 1. When IE is smaller than QE, the signal IQECMP becomes 0. The signal ADD8 becomes 1 when the result of addition of IE and QE is not less than 8 (expressed with decimal number). When the result is less than 8, it becomes 0.

The decoder circuit 104 receives the Ich and Qch main signals ID and QD, the signal IQECMP outputted from the comparison circuit 102, and the signal ADD8 outputted from the adding circuit 103. The decoder circuit 104 outputs the selecting signals SELI and SELQ for selecting the expression for calculation according to the relationship described later, responding to these signals.

The signals inputted to the decoder circuit 104 show condition of the domain enclosed with bold lines in the distance calculation table shown in FIGS. 6 and 7, and the selecting signals SELI and SELQ outputted from the decoder circuit 104 are used for selecting the corresponding expression for calculation.

Figures 10A, 10B:
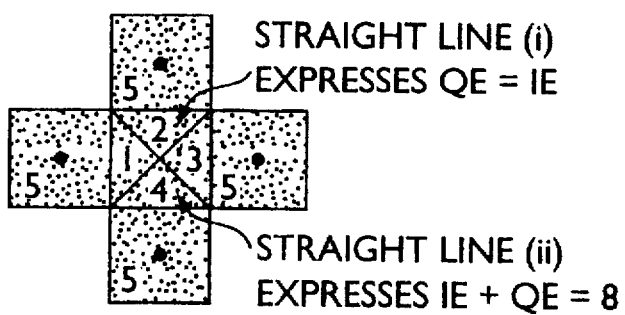
FIGS. 10A and 10B are diagrams showing one part enclosed with a bold line in the circuit shown in FIG. 6.

FIG. 10A is a diagram illustrating one section cut out from the domain enclosed with the bold lines shown in FIGS. 6 and 7. The domain has small triangle-shaped domains ① to ④ and square-shaped domains ⑤ each having a signal point.

A straight line (i) has a relationship of QE=IE. A straight line (ii) has a relationship of QE+IE=8 (expressed with decimal number). Accordingly, when IQECMP is equal to 1, IE is not less than QE. Then, the domain indicated with a in FIG. 10B is designated.

When ADD8 is equal to 1, the result of addition of IE and QE is not less than 8 (expressed with decimal number). In FIG. 10B, the domain indicated with b is designated.

Consequently, the small triangle-shaped domains ① to ④ are obtained from the inter-relationship between the domain indicated with a in FIG. 10B in the case of IQECMP=1, which becomes a reversed domain in the case of IQECMP=0 and the domain indicated with b in FIG. 10B in the case of ADD8=1, which becomes a reversed domain in the case of ADD8=0.

Considering the domain ② as an example, the domain ② is formed by overlapping a reversed domain of the domain indicated with a in the case of IQECMP=0 and the domain indicated with b.

FIG. 11 shows the relationship between each domain I and domain condition II in correspondence with the selecting signals SELI and SELQ.

It is apparent from FIG. 11 that the above-described small triangle-shaped domain ② is designated when the domain condition (II) is that ID is not QD, IQECMP is zero, and ADD8 is 1.

In FIG. 8, second distance calculation table processing circuits 110 to 113 perform the processing for the domains provided outsides of the bold lines in the distance calculation tables of subsets A and B shown in FIGS. 6 and 7.

The outputs of the distance calculation table processing circuits 110 and 111 become valid when employing the 128-valued QAM system and the outputs of the distance calculation, table processing circuits 112 and 113 become valid when employing the 64-valued QAM system, by controlling the selecting gates 120 to 123, described later with a MODE signal, that is, a switching signal which switches the 128-valued QAM system or the 64-valued QAM system.

Considering the distance calculation table processing circuits 112 and 113 as an example, the circuits 112 and 113 respectively perform the processing for the domains provided outsides of bold lines in the distance calculation tables of subsets A and B shown in FIGS. 6 and 7.

That is, the signals SELI and SELQ for selecting the expression for calculating Euclidean distance in the domain provided outside of bold lines are outputted based on the main signals ID and QD, the error signals IE and QE, the signals IQECMP and ADD8 outputted from the first distance calculation table processing circuit 100. Further, the signal SL, which selects the domain enclosed with bold lines and the domain provided outside of the bold lines in the distance calculation table processing circuit.

The second distance calculation table processing circuits 110 to 113 can be formed of a comparison circuit, an adding circuit and a decoder, as the same as the structure of the first distance calculation table processing circuits 100 and 101.

Figure 12:
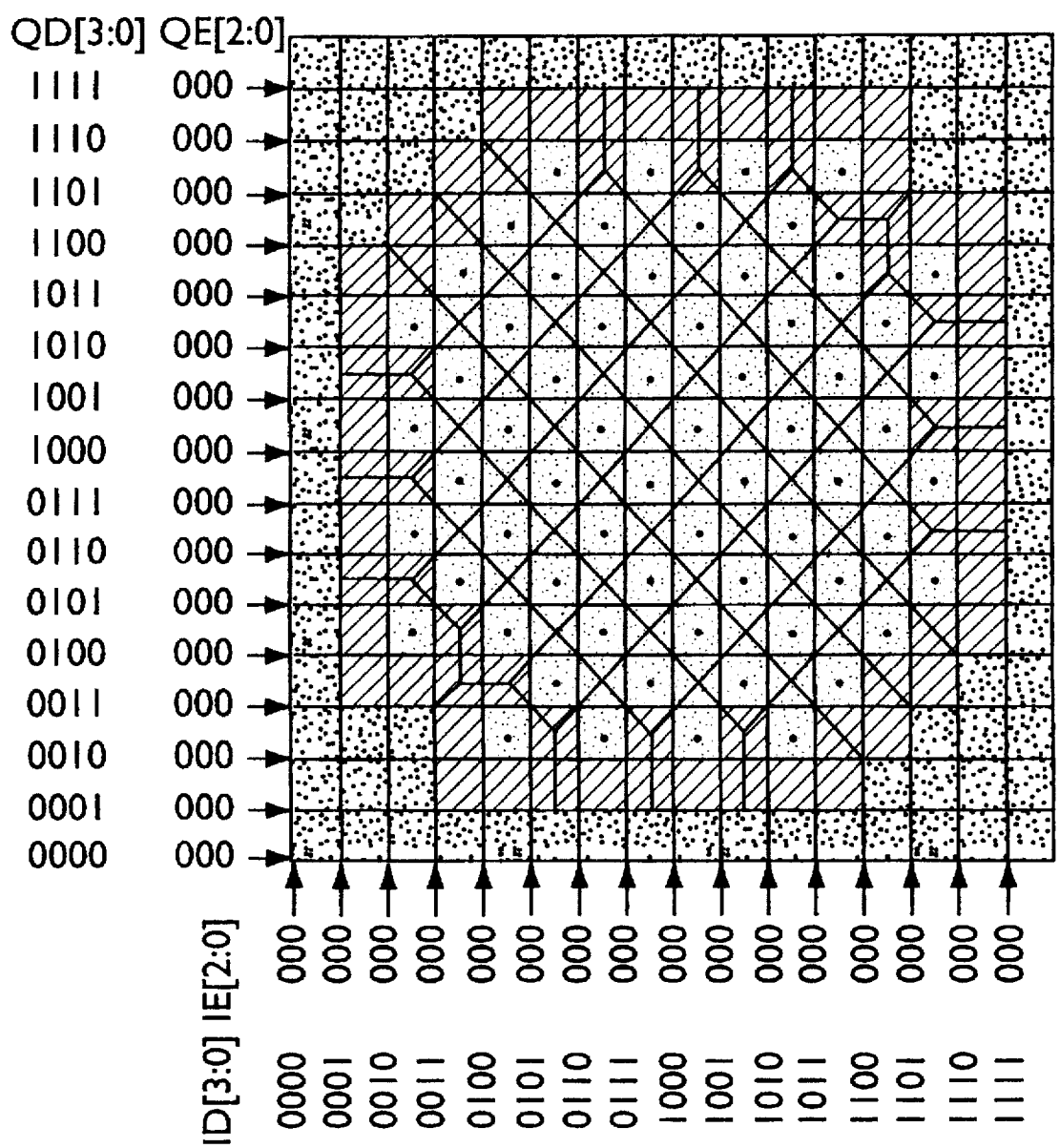
FIG. 12 is a diagram showing subset A of a distance calculation table at time of employing 128-valued QAM system.
Figure 13:
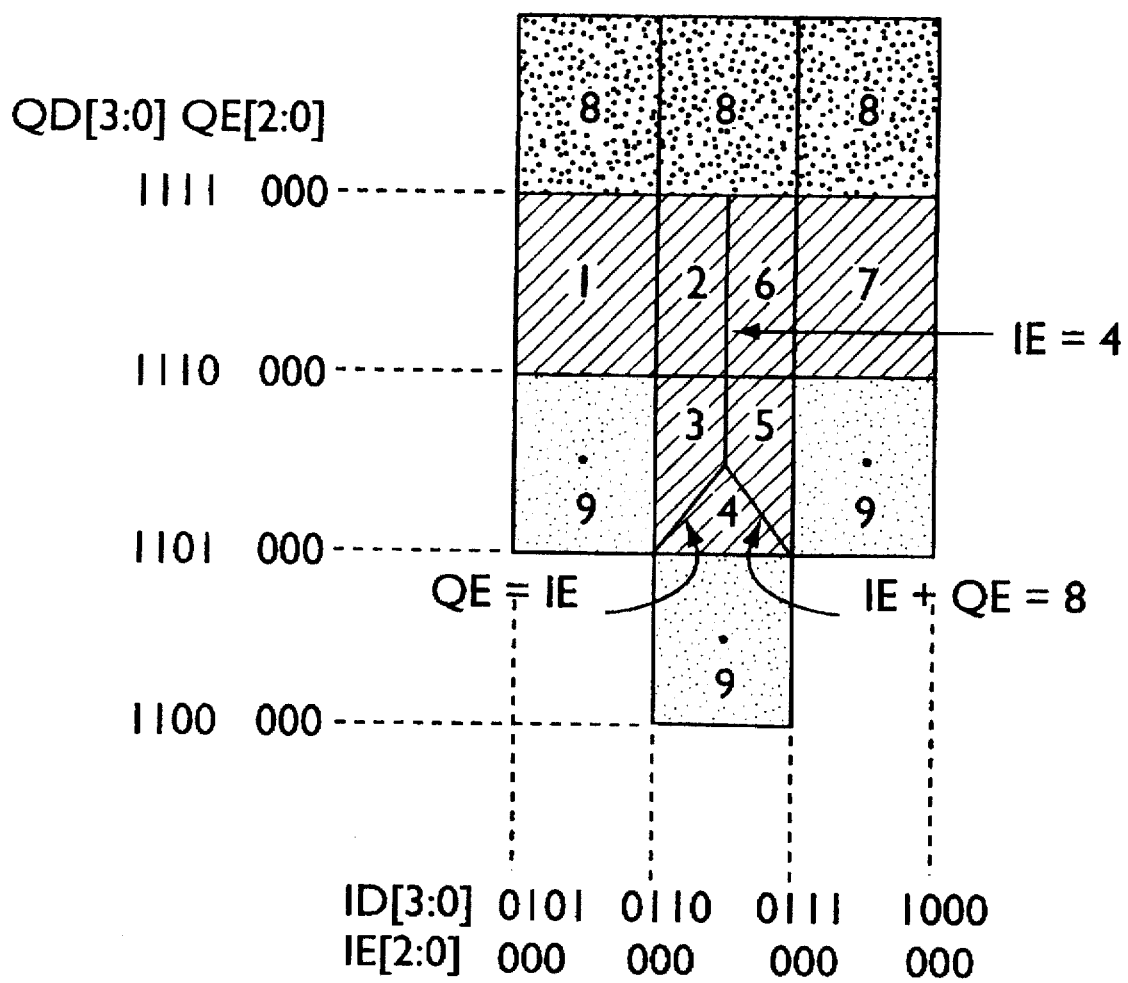
FIG. 13 is a diagram showing one part of domain cut out from a 128-valued QAM distance calculation table.

The operation will be explained by employing a distance calculation table of the 128-valued QAM system as an example. For simplicity, only a subset A of the distance calculation table in the case of employing 128-valued QAM system is shown in FIG. 12. FIG. 13 illustrates one part cut out from the distance calculation table for the 128-valued QAM system, as the same as that of FIG. 10. The domain includes small domains ① to ⑧ provided outside of the bold lines, and the domain ⑨ means one section of the domain enclosed with the bold lines.

FIG. 14 shows the relationship between the domain I (the small domains ① to ⑧) and the domain condition II (inputs to the distance calculation table processing circuits 110 and 111) and the selecting signals SELI and SELQ for selecting the expression for calculation.

As described in FIGS. 10 and 11, it becomes apparent from FIG. 13 that the small domain ④ is specified according to the Ich main signal ID=0110, the Qch main signal QD=1101, the signal IQECMP=1 and the signal ADD8=0. The selecting signals SELI=00 and SELQ=01 corresponds to the domain ④ and are outputted.

Returning to FIG. 8, the MODE signal, which becomes "0" when employing the 64-valued QAM system and becomes "1" when employing the 128-valued QAM system, controls the selecting gates 120 to 123.

When the MODE signal is 0, the selecting gates 120 and 122 select and make the selecting signals SELI and SELQ valid, which are outputted from the second distance calculation table processing circuits 112 and 113 for the 64-valued QAM system. The selecting gates 121 and 123 select and make the signal SL valid, which selects the domain enclosed with the bold lines and the domain provided outside of the bold lines in the distance calculation table.

When the MODE signal is 1, the selecting gates 120 and 122 and 121 and 123 select and make the selecting signals SELI and SELQ, and the signal SL for selecting the domain enclosed with the bold lines and the domain provided outside of the bold lines in the distance calculation table valid, which are outputted from the second distance calculation table processing circuits 110 and 111 for the 128-valued QAM system.

In this way, the selecting gates 120 and 122 output the selecting signals SELI and SELQ for the domains provided outside of the bold lines in the distance calculation table of subset A in the 128-valued QAM system or the 64-valued system, which is selected by the MODE signal and the selecting signals SELI and SELQ for the domains provided outside of the bold lines in the distance calculation table of subset B.

Further, the selecting gates 121 and 123 output the signal SL for signifying the domain enclosed with the bold lines and the domain provided outside of the bold lines in the distance calculation table of subset A for the 64-valued QAM system or 128-valued QAM system, which is selected by the MODE signal and the signal SL for signifying the domain enclosed with the bold lines and the domain provided outside of the bold lines in the distance calculation table of subset B.

Accordingly, the selecting gate 124 outputs the selecting signals SELI and SELQ outputted from the first distance calculation table processing circuit 100 of subset A or the selecting gate 120 or the selecting signals SELI and SELQ outputted from the second distance calculation table processing circuit 110 for the 64-valued QAM system or 112 for the 128-valued QAM system selected by the selecting gate 120 according to the signal SL which signifies the domain enclosed with bold lines and the domain provided outside of the bold lines in the distance calculation table of subset A selected from the selecting gate 121.

The selecting gate 125 outputs the selecting signals SELI and SELQ outputted from the first distance calculation table processing circuit 101 of subset B, or selecting signals SELI and SELQ outputted from the second distance calculation table processing circuit 111 for the 64-valued QAM system or 113 for the 128-valued QAM system of subset B, selected by the selecting gate 122 according to the signal SL which signifies the domain enclosed with bold lines and the domain provided outside of the bold lines in the distance calculation table of subset B selected from the selecting gate 123.

In FIG. 8, decoder circuits 130 to 133 output Ich or Qch component of Euclidean distance calculated according to the selecting signals SELI and SELQ outputted from the selecting gates 124 and 125 and the input error signals IE and QE.

The decoder circuits 130 to 133 receive the SL outputted from the second distance calculation table processing circuit 112 or 113 at time of employing the 64-valued QAM system, the selecting signal SEL selected by the SL outputted from the second distance calculation table processing circuit 110 or 111 at the time of employing the 128-valued QAM system and an error signal D, and output Ich or Qch component of Euclidean distance as a signal BRNT.

Further, the decoder circuit 130 outputs Ich component of Euclidean distance of the distance calculation table of subset A, the decoder circuit 131 outputs Qch component of Euclidean distance of the distance calculation table of subset A, the decoder circuit 132 outputs Ich component of Euclidean distance of the distance calculation table of subset B, and the decoder 133 outputs Qch component of Euclidean distance of the distance calculation table of subset B.

FIG. 15 shows one example of the relationships between inputs and outputs of the decoder circuits. In FIG. 15, the selecting signal SEL corresponds to the expression for calculating Euclidean distance. It is apparent from the distance calculation table that the input error signal D has the maximum size 8, so that the signal D is expressed with 3 bits.

The corresponding calculated value can be obtained by expressing the input error signal D with decimal number and applying the decimal numbered value to the expression for calculating Euclidean distance. Then, the upper 4 bits of the calculated value are outputted as BRNT outputted from the decoder circuit. When Euclidean distance is more than 64, the BRNT outputs the maximum value "1111".

In FIG. 8, the adding circuits 140 and 141 add the output BRNT of Euclidean distances of the Ich and Qch components per subset A and B. Therefore, each second power of the distances can be obtained from signal points.

An example will be considered in accompanying with FIG. 11. The Euclidean distance is the selecting signal SELI=0 0 and the signal SELQ=0 0 in a square-shaped domain having a signal point. Therefore, the decoder circuit 130 outputs the value corresponding to $(4-D)^2$ to the adder 140. The decoder circuit 131 also outputs the value corresponding to $(4-D)^2$ to the adder 140. Then, the adder 140 adds the values outputted from the decoder circuits 130 and 131, and outputs the value of $(4-D)^2+(4-D)^2$. Further, the Euclidean distance is the selecting signals SELI=1 0 and SELQ=0 0 in the domain ③. Therefore, the adding circuit 141 outputs the value of $(12-D)^2 +(4-D)^2$, simultaneously.

The outputs from adding circuits 140 and 141 are outputted via OR circuits 150 and 151 as signals BMA and BMB.

In the present invention, a method for calculating Euclidean distance is selected from three kinds of expressions for calculation shown in FIG. 15, a logic is expressed by only a signal SEL of two bits for selecting the expression for calculation and an error signal D of three bits, without any real calculation. By employing a decoder having such a function, the present invention can realize to perform the same function as subtraction and multiplication with high-speed, and to minimize the member of basic cells.

The signals BMA and BMB showing the Euclidean distances to subsets A and B are inputted to the C1 decoder 2 as shown in FIG. 1. The C1 decoder 2 decodes a code (C1) of the level 1 according to the principle of vitabi decoding. The decoder 2 finds a hamming distance (branch-metric value) between a received code and the branch code and obtains a path metric value in each node.

Then, the C1 decoder 2 selects the smaller one from the sums of branch-metric value and the path metric value, and stores the sum as a path metric value. Further, the decoder 2 compares the path metric value between conditions and finds a condition having a minimum value. Then, the decoder 2 finds a path from the contents of path memory corresponding to the condition of the minimum value and outputs it as a decoded code.

More particularly, the decoder 2 performs an acceptable calculation based on the input of Euclidean distance to the subsets A (C1=0) and B (C1=1) to obtain the result of decoding. The decoding can be stopped at the position of data that is not coded (frame bit). Therefore, control timing is given by inputs of C1EN, DLSL, EN, C2EN, FDEN or the like, as explained above in FIG. 1.

An enable signal C1EN for decoding, a timing pulse DLSL for correcting amplitude of data length according to the inserting frame bits, and an enable signal EN for serially converting the result of decoding are inputted to the C1 decoder 2 besides the Euclidean distance BMA to the signal point of subset A and the Euclidean distance BMB to the signal point of subset B.

Figure 16:
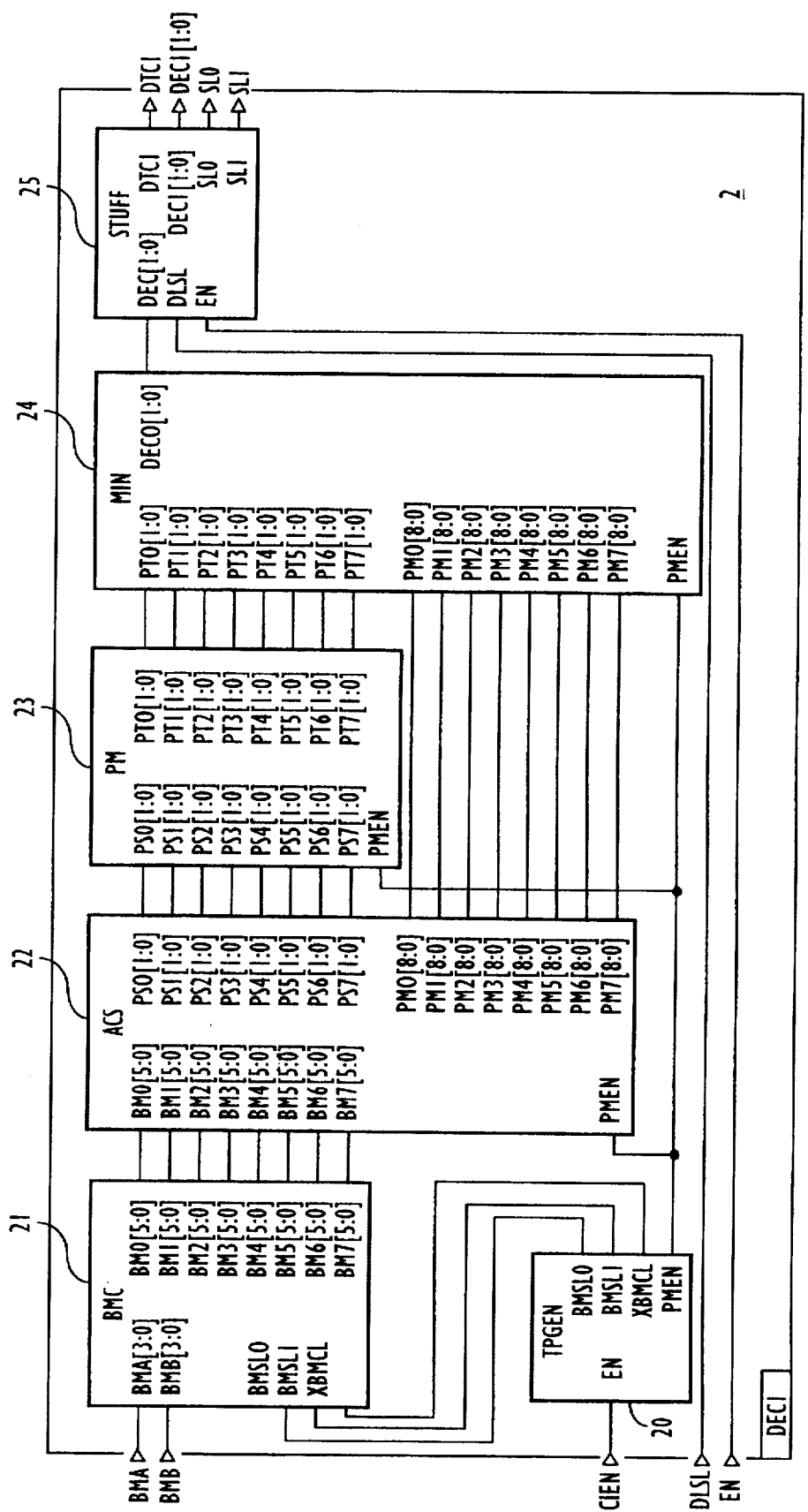
FIG. 16 is a diagram illustrating a structural example of C1 decoder (DEC1).

FIG. 16 shows a block diagram of a structural example of C1 decoder 2. C1 decoder 2 decodes C1 coded data that are convolutional coded data of level 1.

2 (DEC1) of FIGS. 2 and 3 shows a timing of each signal inputted and outputted to/from the C1 decoder 2. In FIGS. 2 and 3, numerals enclosed with a circle in DEC1 are expressed with decimal numbers.

In FIG. 16, a branch-metric accumulating circuit 21 accumulates the Euclidean distance per code length of 3-bits and calculates a branch-metric value per coded data that represents 8 ways.

The signals BMA and BMB showing the Euclidean distance, timing pulse BMSL0 and BMSL1 indicating which one of three clocks for one code, a clear signal XBMCL are inputted to the branch metric accumulating circuit 21. The circuit 21 generates BM0 to BM7 and outputs them.

BM0 means a branch-metric value when the received data is (0, 0, 0). Simultaneously, BM1 to BM7 are branch-metric values when the received data are (0, 0, 1) to (1, 1, 1).

Figure 17:
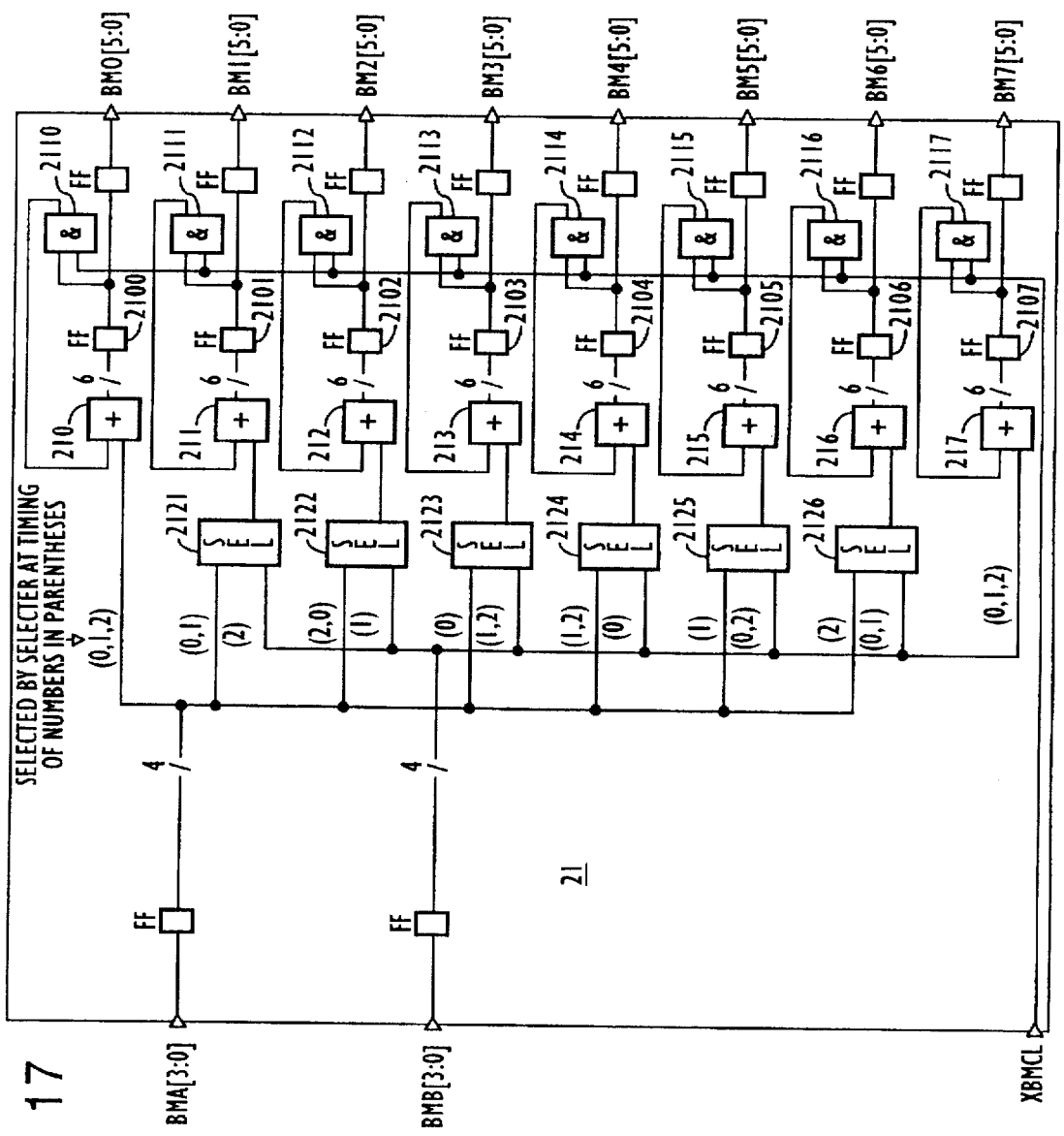
FIG. 17 is a diagram illustrating a structural example of branch-metric accumulating circuit (BMC).

FIG. 17 is a block diagram of a branch-metric accumulating circuit 21. The branch-metric accumulating circuit 21 has adders 210 to 217, flip flops 2100 to 2107, AND gates 2110 to 2117 corresponding to each of branch-metric values BM0 to BM7. Further, the circuit 21 has eight accumulating circuits formed by feed-backing the outputs of AND gates 2110 to 2117 to the inputs of adders 210 to 217.

If a clear signal XBMCL is inputted to the AND gates 2100 to 2117, the accumulated value is cleared. Further, the signals BMA and BMB showing the Euclidean distance are inputted to the adders 210 to 217 of the eight accumulating circuits by selectors 2121 to 2126 at the timing of a specified clock of 3 clocks (0 to 2) indicated in a parenthesis.

For example, the signal BMA showing the Euclidean distance is inputted to the adder 211 at the timing of clock (0, 1). The signal BMB showing the Euclidean distance is inputted at the timing of clock (2). The signal BMA showing the Euclidean distance is inputted to the adder 210 at the timing of clock (0, 1, 2), i.e., at each clock time. The signal BMB showing the Euclidean distance is inputted to the adder 217 at the timing of clock (0, 1, 2), i.e., at each clock time.

The branch-metric values BM0 to BM7 obtained in this way are inputted to the addition, comparison or selection circuit (ACS) 22 [refer to FIG. 16]. The ACS 22 adds the path metric value on the condition before inputting signals to a branch-metric value of an input signal to find the path metric value on the condition after inputting signals. The condition number is 8. Four transition ways can be considered for each condition.

Accordingly, the ACS 22 compares four ways of path metric values and selects minimum one from the four ways. Then, the ACS 22 outputs both of the selected path metric value and the selecting condition. Besides the branch-metric values BM0 to BM7, a timing pulse PMEN showing enable condition of the path metric value is inputted to the ACS 22.

Values PS0 to PS7 showing the selecting conditions for each path, which are transferred to conditions 0 to 7, are outputted from the ACS 22. The path metric values PM0 to PM7 respectively showing the conditions 0 to 7 are outputted.

FIG. 18 is a structural example of ACS 22. The ACS 22 has eight addition, comparison and selection circuits 220 to 227 corresponding to eight conditions 0 to 7. The structure of all addition, comparison and selection circuits 220 to 227 is the same. Each of the addition, comparison and selection circuits 220 to 227 has input terminals P0 to P3 and B0 to B3 and output terminals of PM, PS0 and PS1.

Combinations of the path metric values PM0 to PM7 inputted to the input terminals P0 to P3 and B0 to B3 become different from those of each of the addition, comparison, selection circuits 220 to 227. The outputs of the output terminals PM, PS0 and PS1 become different according to the combinations. FIG. 18 shows input and output in each addition, comparison and selection circuit.

Figure 19:
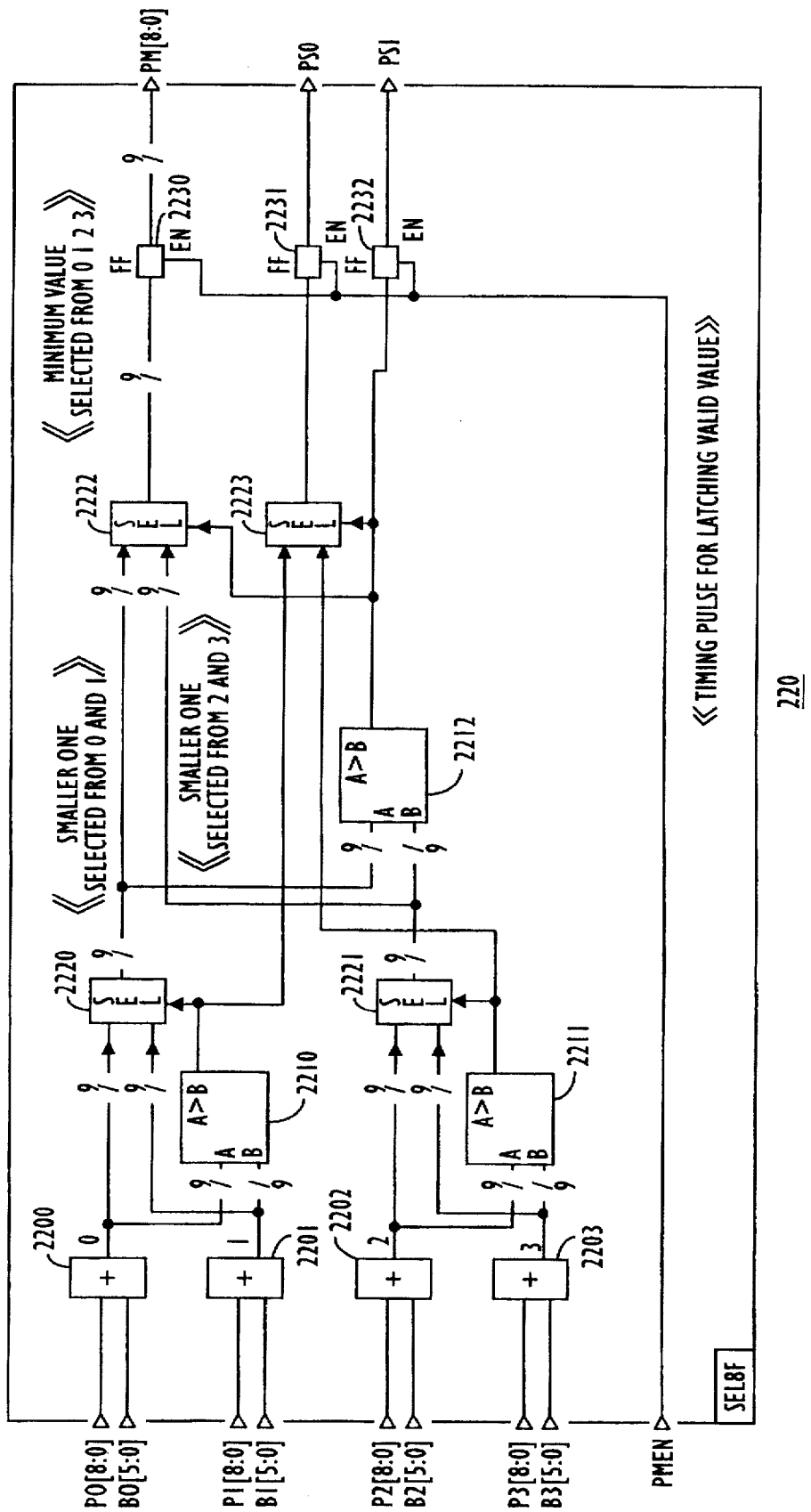
FIG. 19 is a diagram illustrating a structural example of individual addition, comparison or selection circuit (ACS).

FIG. 19 shows a detailed structure of the addition, comparison and selection circuit 220. The addition, comparison and selection circuit 220 is formed of four adding circuits 2200 to 2203, three comparison circuits 2210 to 2212, four selecting circuits 2220 to 2223 and three latch circuits 2230 to 2232.

Each of the adding circuits 2200 to 2203 finds each sum of the corresponding input terminals P0 and B0, P1 and B1, P2 and B2, and P3 and B3. The comparison circuit 2210 compares the outputs of adding circuits 2200 and 2201. When the output of the adding circuit 2200 is larger than that of the adding circuit 2201, the comparison circuit 2210 outputs "0".

The selecting circuit 2200 selects and outputs the smaller one from the outputs of the adding circuits 2200 and 2201, according to the output of the comparison circuit 2210.

The comparison circuit 2211 compares the outputs of the adding circuits 2202 and 2203 and outputs "0" when the output of the adding circuit 2202 is larger than that of the adding circuit 2203. The selecting circuit 2221 selects and outputs the smaller one from the outputs of the adding circuits 2202 and 2203.

The outputs from selecting circuits 2220 and 2221 are inputted to the selecting circuit 2222. Simultaneously, the outputs of selecting circuits 2220 and 2221 are inputted to the comparison circuit 2212. When the output of the selecting circuit 2220 is larger than that of the selecting circuit 2221, the comparison circuit 2212 outputs "0". Accordingly, the selecting circuit 2222 selects and outputs the smaller one, according to the output of the comparison circuit 2212.

The outputs of comparison circuits 2210 and 2211 are further inputted to the selecting circuit 2223 to output the smaller one according to the output of the comparison circuit 2212.

The output of the selecting circuit 2222 is inputted to the latch circuit 2230, the output of the selecting circuit 2223 is inputted to the latch circuit 2231, and the output of comparison circuit 2212 is inputted to the latch circuit 2232 to latch a valid value by the timing pulse PMEN.

According to the above-described structure, the minimum value selected from the outputs of the adding circuits 2200 to 2203 is outputted to each PM terminal of ACS circuits 220 to 227, and the minimum value selected from the outputs of the adding circuits 2200 to 2203 is specified with 2 bits according to the terminal PS0 and PS1.

Figures 1, 20:
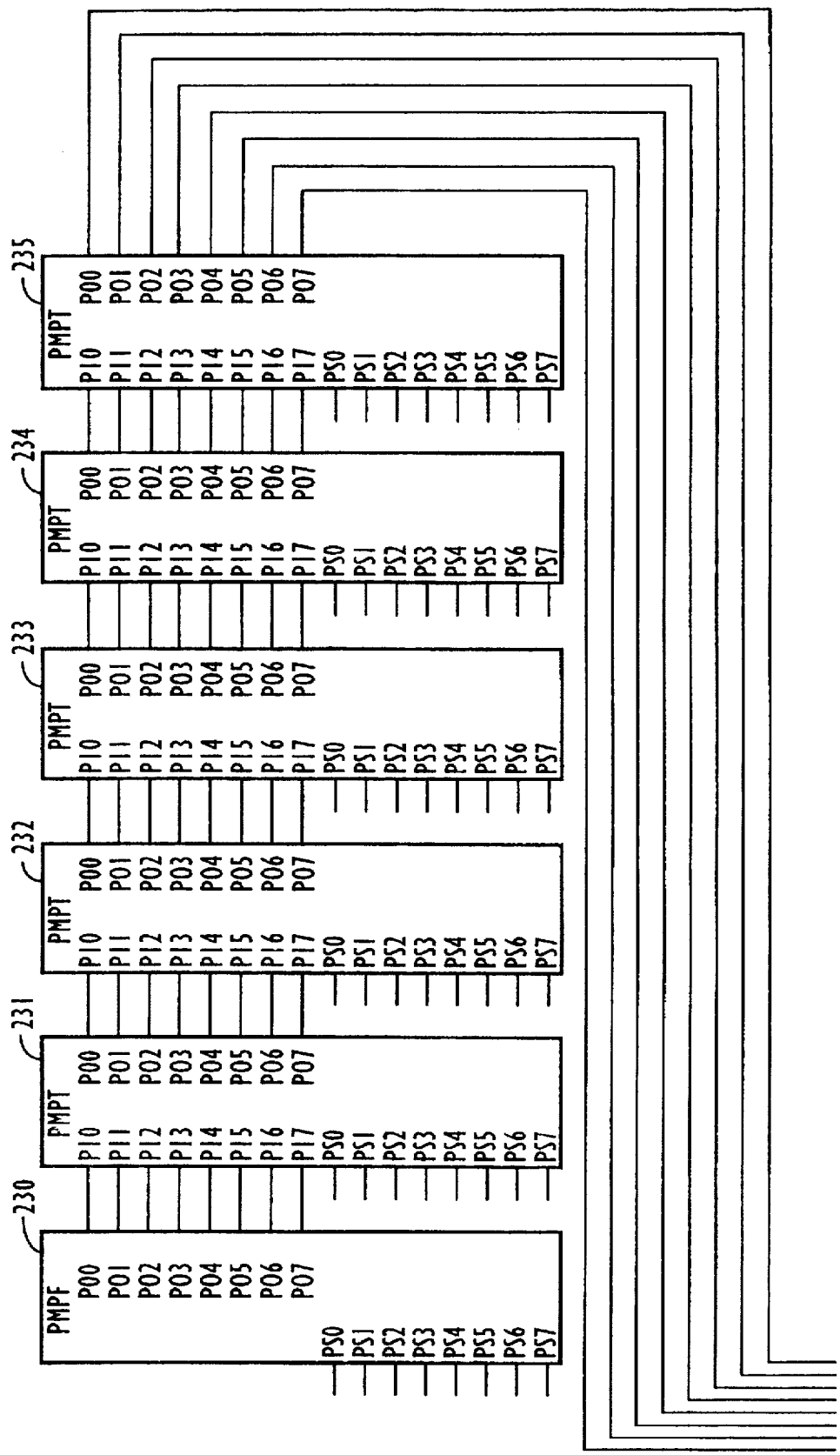
FIG. 20 is a diagram illustrating a structural example of path memory (PM).
Figures 2, 20:
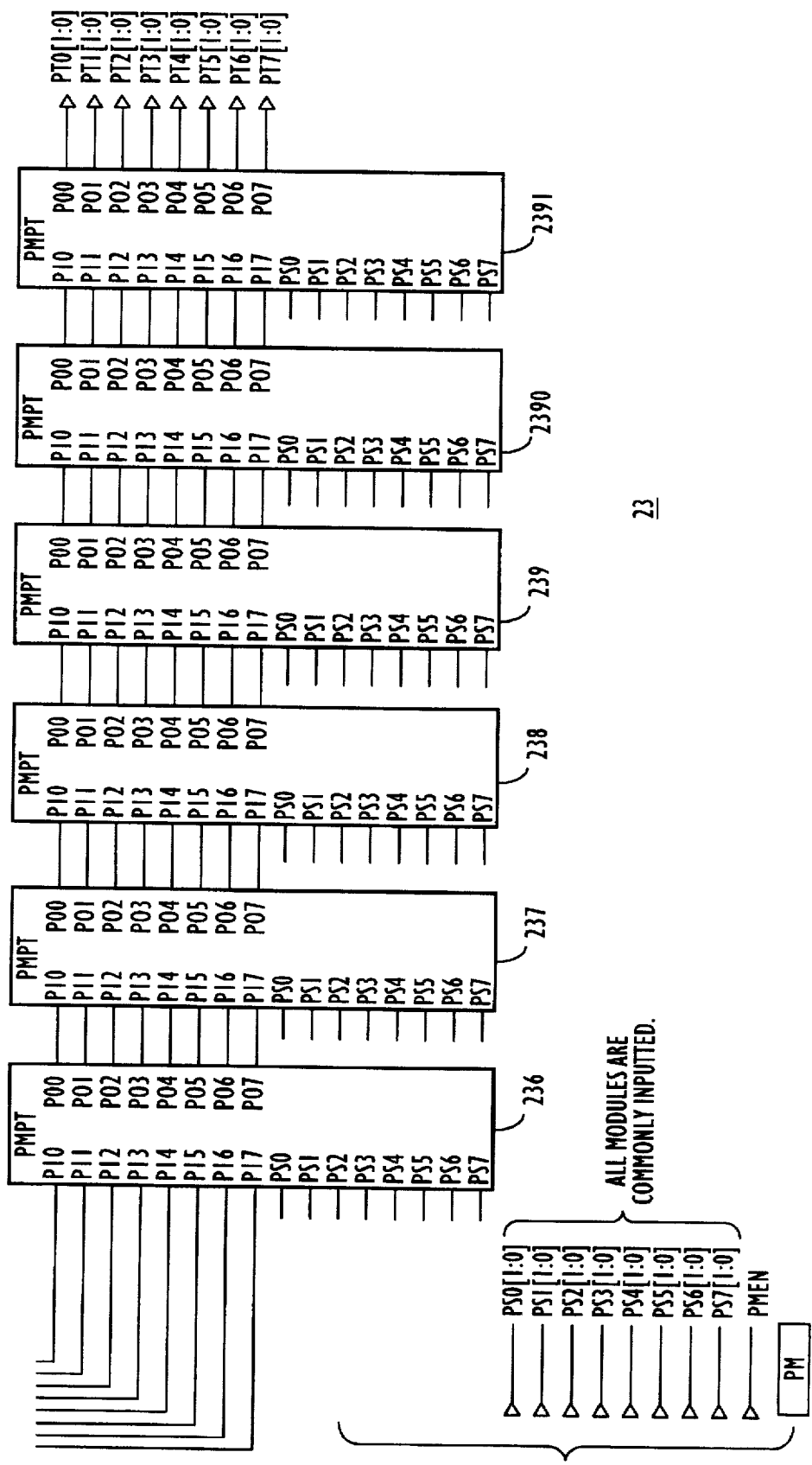

FIG. 20 is a detailed structural example of a path memory 23 shown in FIG. 16. The path memory 23 is formed of 24 stages of memories that operate based on the selecting condition of path. The PS0 to PS7 outputted from the ASC 22 are inputted to the path memory 23. Further, PMEN is a timing pulse showing enable condition of the inputted data. PT0 to PT7 are outputted to the output terminals of the path memory 23.

PS0 to PS7 indicate the selecting condition of paths, each of which is transferred to condition 0. The outputs PT0 to PT7 mean decoded data when each end of remained paths is the condition 0.

Figure 21:
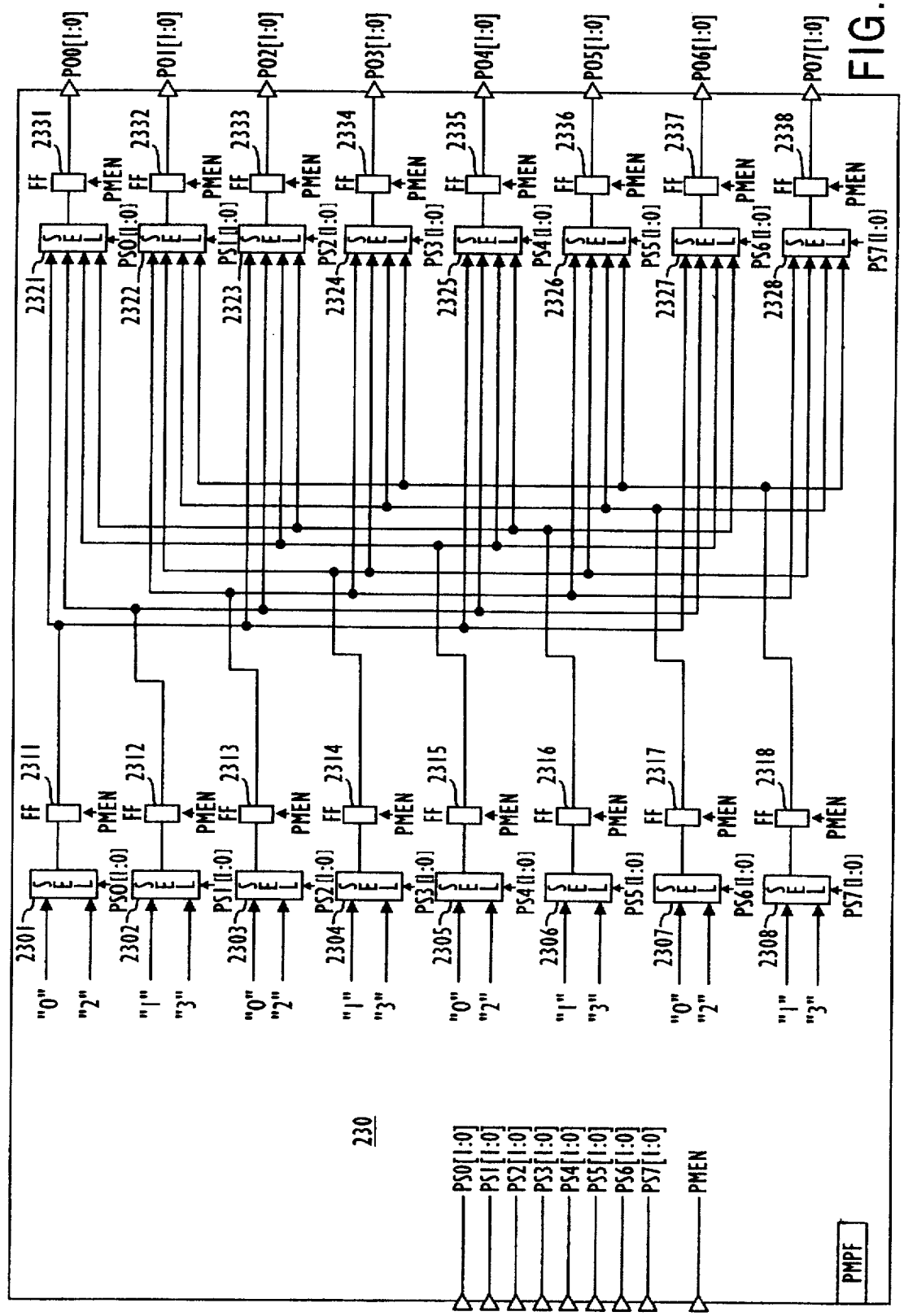
FIG. 21 is a diagram illustrating a structural example of PMPF.
Figure 22:
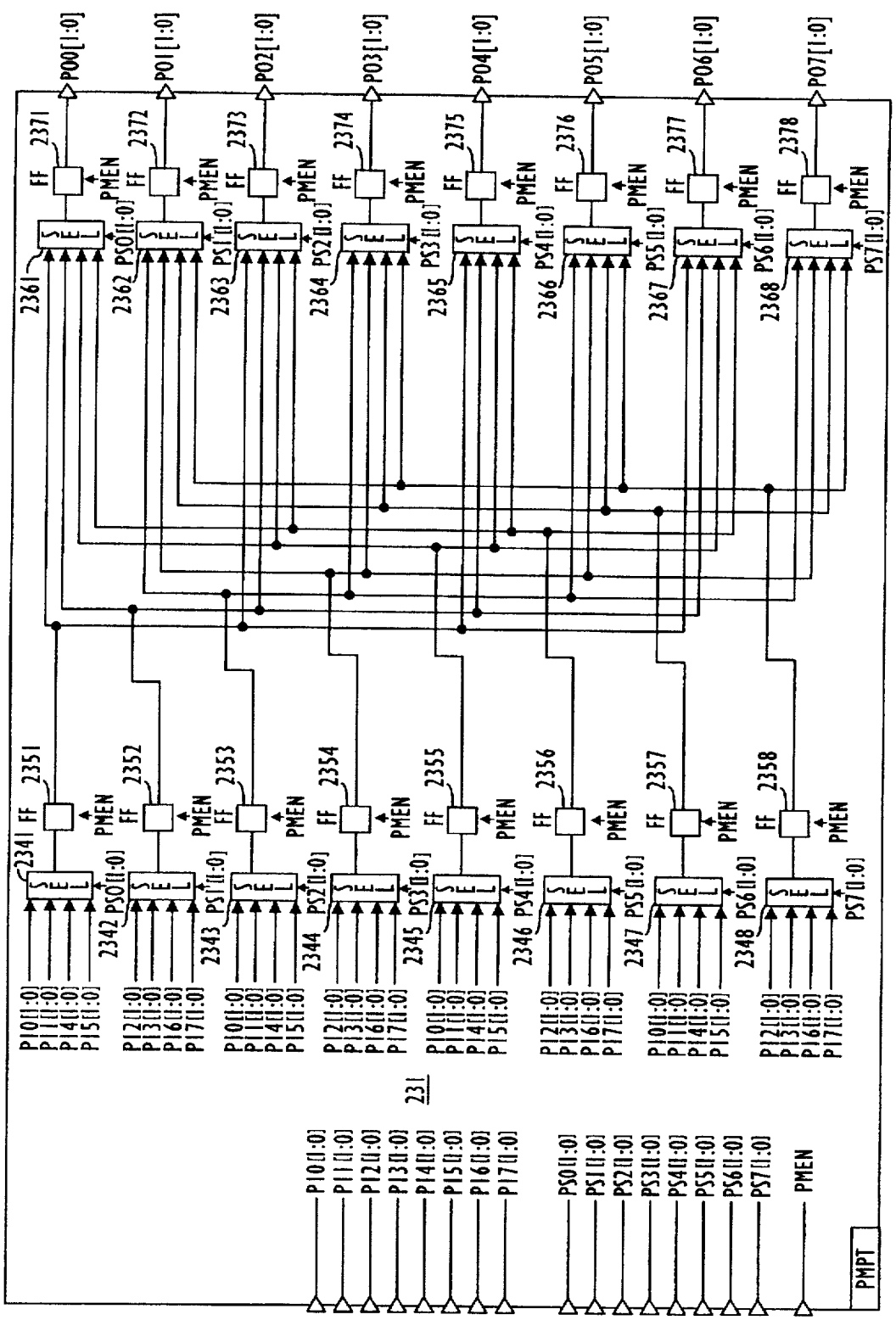
FIG. 22 is a diagram illustrating a structural example of PMPT.

FIGS. 21 and 22 show detailed structural examples of twelve path memory modules 230 to 239, 2390 and 2391 forming the path memory 23. More particularly, FIG. 21 shows the detailed structure of the first path memory module (PMPF) 230.

In FIG. 21, the first path memory module 230 includes first selecting gates 2301 to 2308, second selecting gates 2321 to 2328, and latch circuits 2311 to 2318 and 2331 to 2338.

The first path memory module 230 is formed of eight selecting circuits. Each selecting circuit includes a first selecting gate 2301, a latch circuit 2311, a second selecting gate 2321 and a latch circuit 2331.

The operation will be explained by employing the first selecting circuit formed of the first selecting gate 2301, the latch circuit 2311, the second selecting gate 2321 and the latch circuit 2331. The path numbers of "0" and "2" each expressed with 2 bits are inputted to the first selecting gate 2301.

The first bit in the 2 bits of PS0 outputted from the ASC 22 is further inputted as a selecting signal to the first selecting gate 2301. Accordingly, either of the path number "0" or "2" inputted to the first selecting gate 2301 is selected and outputted according to the selecting signal PS0.

The output of first selecting gate 2301 is latched in the first latch circuit 2311. Further, the output of the first selecting gate 2301 is inputted via the latch circuit 2311 to the second selecting gate 2321. Then, other outputs of selecting gates, i.e., the first selecting gates 2302, 2305 and 2306, are inputted to the second selecting gate 2321.

Consequently, the second selecting gate 2321 controls to select one from four inputs according to 2 bit outputs of PS0 from the ASC 22. Further, the output selected in the second selecting gate 2321 is latched by the second latch circuit 2331, and is outputted as PO0.

FIG. 22 is a block diagram showing a detailed structure of the path memory module (PMPT) 231 as representative of the path memory modules (PMPT) 231 to 239, 2390 and 2391. The path memory module 231 has the same structure as that of the first path memory module 230. However, PO0 to PO7 outputted from the first path memory module (PMPF) 230 are inputted to the input terminals P10 to P17, in addition to the outputs PS0 to PS7 of the ASC 22.

Further, the first selecting gates 2341 to 2348 have four input terminals to which four of PO0 to PO7 inputted to the corresponding input terminals P10 to P17 are inputted. For example, PO0, PO1, PO4 and PO5 outputted from the first path memory module 230 that are inputted to the input terminals P10, P11, P14 and P15 are inputted to the first selecting gate 2341 of the path memory module 231.

One of the PO0, PO1, PO4 and PO5 is selected by 2 bits of PS0 outputted from the ASC 22 and outputted. Other structure is the same as that of the first path memory module 230 explained in FIG. 21.

The outputs PO0 to PO7 are outputted from the path memory module 231 as the same as the first path memory module 230. As shown in FIG. 19, the outputs PO0 to PO7 are subsequently connected to the following path memory modules 232 to 239, 2390 and 2391.

The outputs PT0 to PT7 are outputted from the path memory module 2391 on the end stage. Each of PT0 to PT7 means decoded data when the end of remained path is condition 0, or data obtained by decoding the C1 coded data when the end of the remained path is condition 7.

Figure 23:
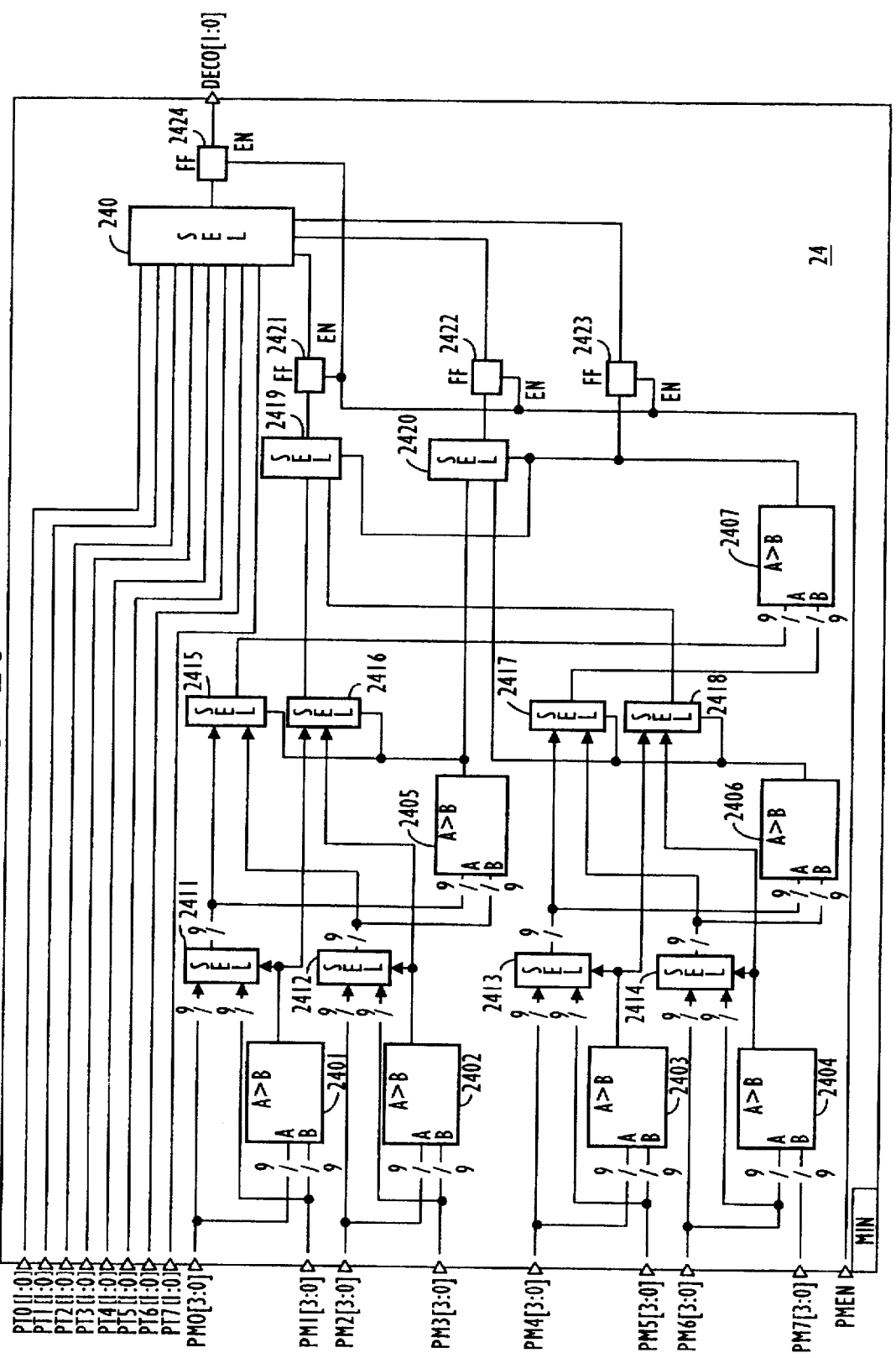
FIG. 23 is a diagram illustrating a structural example of minimum path selecting circuit (MIN).

FIG. 23 is a block diagram illustrating the detailed structural example of the most acceptable path selecting circuit 24 shown in FIG. 16. The circuit 24 compares the path metric values PM0 to PM7 outputted from the ASC 22, and selects and outputs the decoded data PT0 to PT7 outputted from the path memory 23 corresponding to the minimum value.

In FIG. 23, eight decoded data PT0 to PT7 are inputted from the path memory 23 to the selecting gate 240. One of the decoded data is selected according to the combination of three outputs latched to the latch circuits 2421 to 2423. The decoded data is outputted via a latch circuit 2424.

The combination of three outputs latched to the latch circuits 2421 to 2423 is corresponding to a code for specifying the minimum value within the path metric values PM0 to PM7. The code for specifying the minimum value within path metric values PM0 to PM7 is decided according to the structure of the comparators 2401 to 2407 and the selecting gates 2411 to 2420 shown in FIG. 23.

The comparator 2401 compares the size of path metric values PM0 and PM1, the comparator 2402 compares the size of path metric values PM2 and PM3, the comparator 2403 compares the size of path metric values PM4 and PM5, and the comparator 2404 compares the size of path metric values PM6 and PM7.

The comparators output "1" if A is larger than B, whereas the comparators output "0". The selecting gates 2411 to 2414 are controlled to output the smaller one selected from A and B, based on the result of comparison in the comparators 2401 to 2404.

The comparators 2405 and 2406 respectively compare the outputs of the selecting gates 2411 and 2412 and the selecting gates 2413 and 2414, and output "1" if A is larger than B, whereas the comparators outputs "0".

The selecting gate 2415 outputs the smallest value selected from the path metric values PM0 to PM3, based on the result of comparison in the comparator 2405. The selecting gate 2416 selects and outputs the outputs from the comparators 2401 and 2402 based on the result of comparison in the comparator 2405 to specify the smallest value from the path metric values PM0 to PM3.

Simultaneously, the selecting gate 2417 outputs the smallest value selected from the path metric values PM4 to PM7, based on the result of comparison in the comparator 2406. The selecting gate 2418 selects and outputs the outputs from the comparators 2403 and 2404 based on the result of comparison in the comparator 2406 to specify the smallest value within the path metric values PM4 to PM7.

The comparator 2407 outputs the smaller value selected from the outputs of the selecting gates 2415 and 2417, i.e., the smallest value of the path metric values PM0 to PM7, and latch it to the latch circuit 2423 based on PMEN pulse.

The selecting gates 2419 and 2420 specify the smallest value selected from the path metric values PM0 to PM7, based on the result of comparison in the comparator 2407, and latch it to the latch circuits 2421 and 2422.

Then, the selecting gates 2419 and 2420 control the selecting gate 240 to output the smallest path metric value selected from the path metric values PM0 to PM7 described above, based on the latch data in the latch circuits 2421 to 2423.

Returning to FIG. 16, an output from an most acceptable selecting circuit 24 is inputted to a data length correction circuit (STUFF) 25. Then, the circuit 25 performs the correction of data length to insert a frame bit, according to the result of decoding outputted from the most acceptable path selecting circuit 24.

Therefore, the data length correction circuit 25 converts parallel data showing the decoding result to serial data and further generates a timing pulse employed in the encoder 3 described later.

Figure 24:
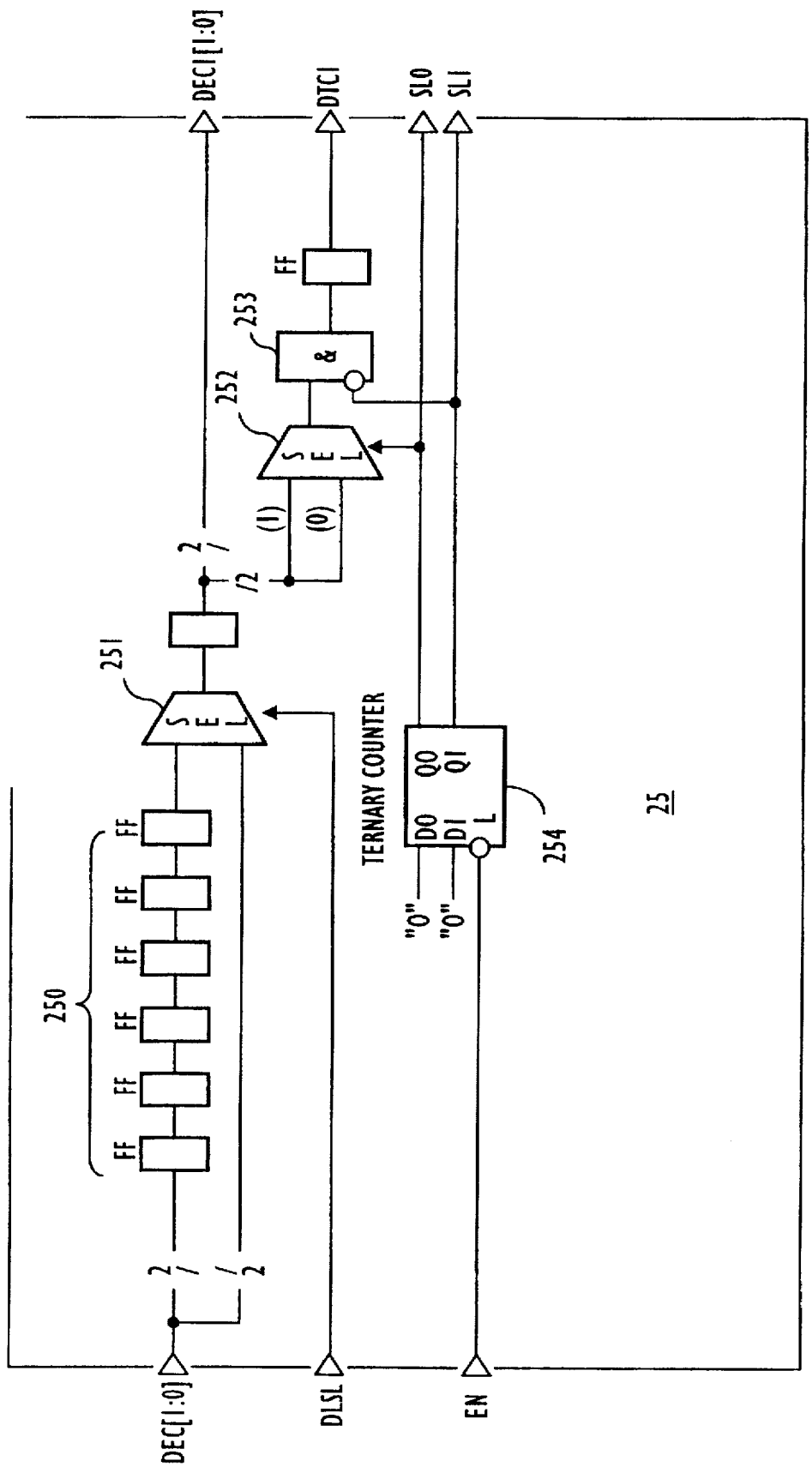
FIG. 24 is a diagram illustrating a structural example of data length correcting circuit (STUFF).

FIG. 24 is a detailed structural example of the data length correction circuit 25. The data length correction circuit 25 has six stages of flip flops FF 250 and a selecting gate 251 for selecting whether the decoding result DEC is directly outputted or the result DEC is outputted via six stages of flip flops FF 250 by a timing pulse DLSL for correcting a data length caused by inserting a frame bit.

Further, the data length correction circuit 25 includes a ternary counter 254 to which an enable signal EN for converting the decoding result to serial data is inputted, a selecting gate 252 for alternatively switching and outputting the output from the selecting gate 251, and an AND gate 253 having a negative input terminal.

Then, the decoding result DTC1 that is obtained by converting the output of C1 decoder 2 [refer to FIG. 1] to serial data is outputted from the AND gate 253. Further, SL0 and SL1 outputted from the ternary counter 254 become operation timings of the encoder (ENC) 3 described later.

Figure 25:
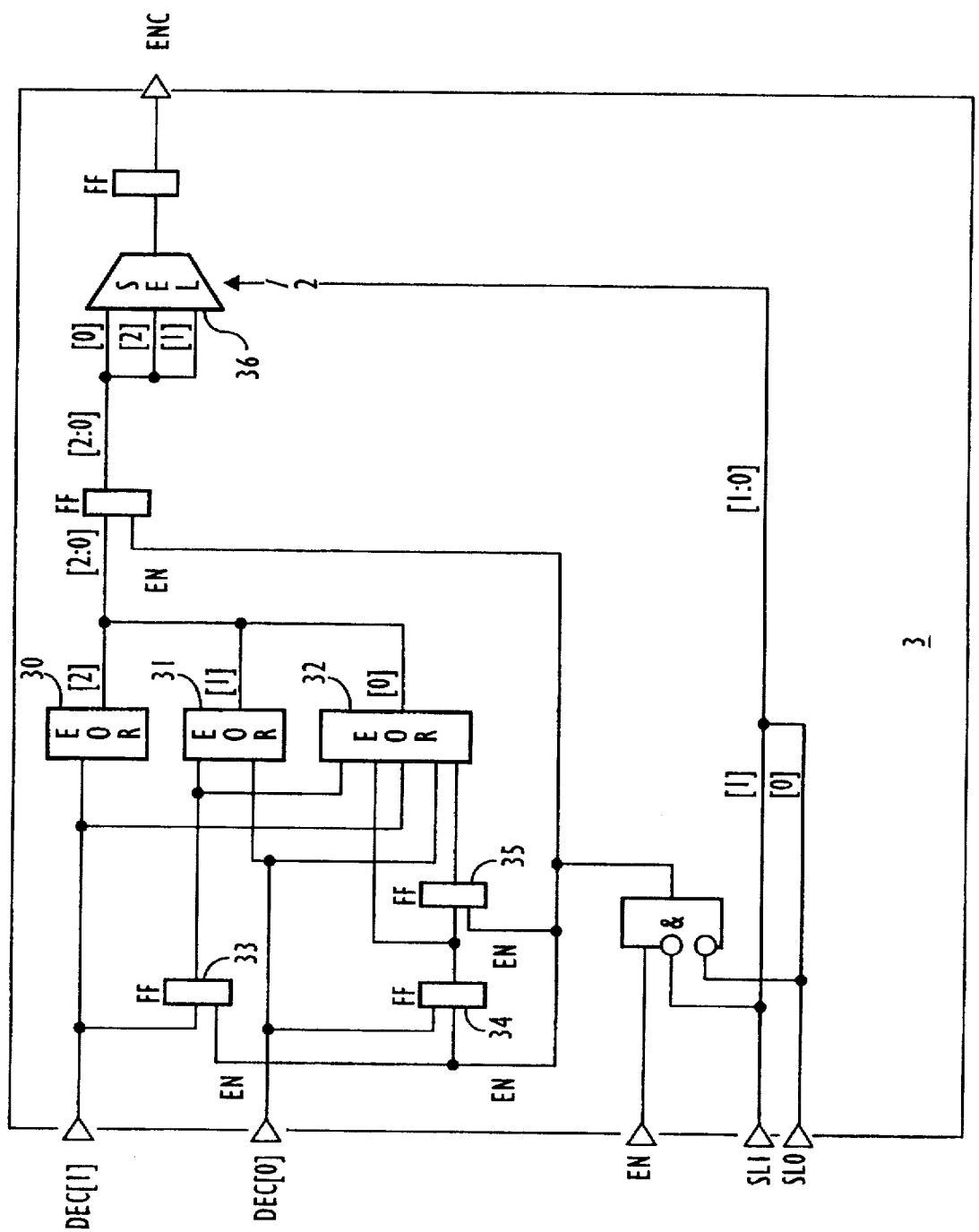
FIG. 25 is a diagram illustrating a structural example of encoder (ENC).

Returning to FIG. 1A, the output from the C1 decoder 2 is inputted to the encoder 3. FIG. 25 illustrates a detailed structural example of the encoder 3. The encoder 3 performs convolutional re-coding to the decoding result of C1 decoder 2 at the coding rate of ⅔. The coding rate of ⅔ means bound length of 2 bits, and code series of 3 bits. Decoding can be stopped at the location of data (frame bit) that is not coded [refer to 3 (ENC) shown in the time chart of FIG. 3].

In FIG. 25, each 1 bit of the decoding result shown with parallel data of the C1 decoder 2 is inputted to two terminals DEC. The enable signal for the encoder 3 is inputted to the terminal EN. SL0 and SL1 mean operation timings of the encoder.

The encoder 3 includes EOR gates 30 to 32. The EOR gate 30 outputs the bits of decoding result inputted to one terminal DEC as it is. Further, the EOR gate 31 outputs an EXOR between the bit of decoding result inputted to one terminal DEC and the bit of decoding result inputted to another terminal DEC.

The flip flops FF 33 to 35 delay bits of decoding result inputted to one terminal DEC and the decoding result inputted to another terminal DEC. Accordingly, the EOR gate 32 outputs the bit of decoding result inputted to one terminal DEC, the bit before one bit of decoding result of one terminal DEC, the bit of decoding result inputted to another terminal DEC, and an EXOR between the bit before one bit of decoding result inputted to the other terminal DEC and the bit before two bits.

The selecting gate 36 subsequently selects and outputs the above-described outputs from the EOR gates 30 to 32 according to operation timings SL0 and SL1 of the encoder.

Figure 26:
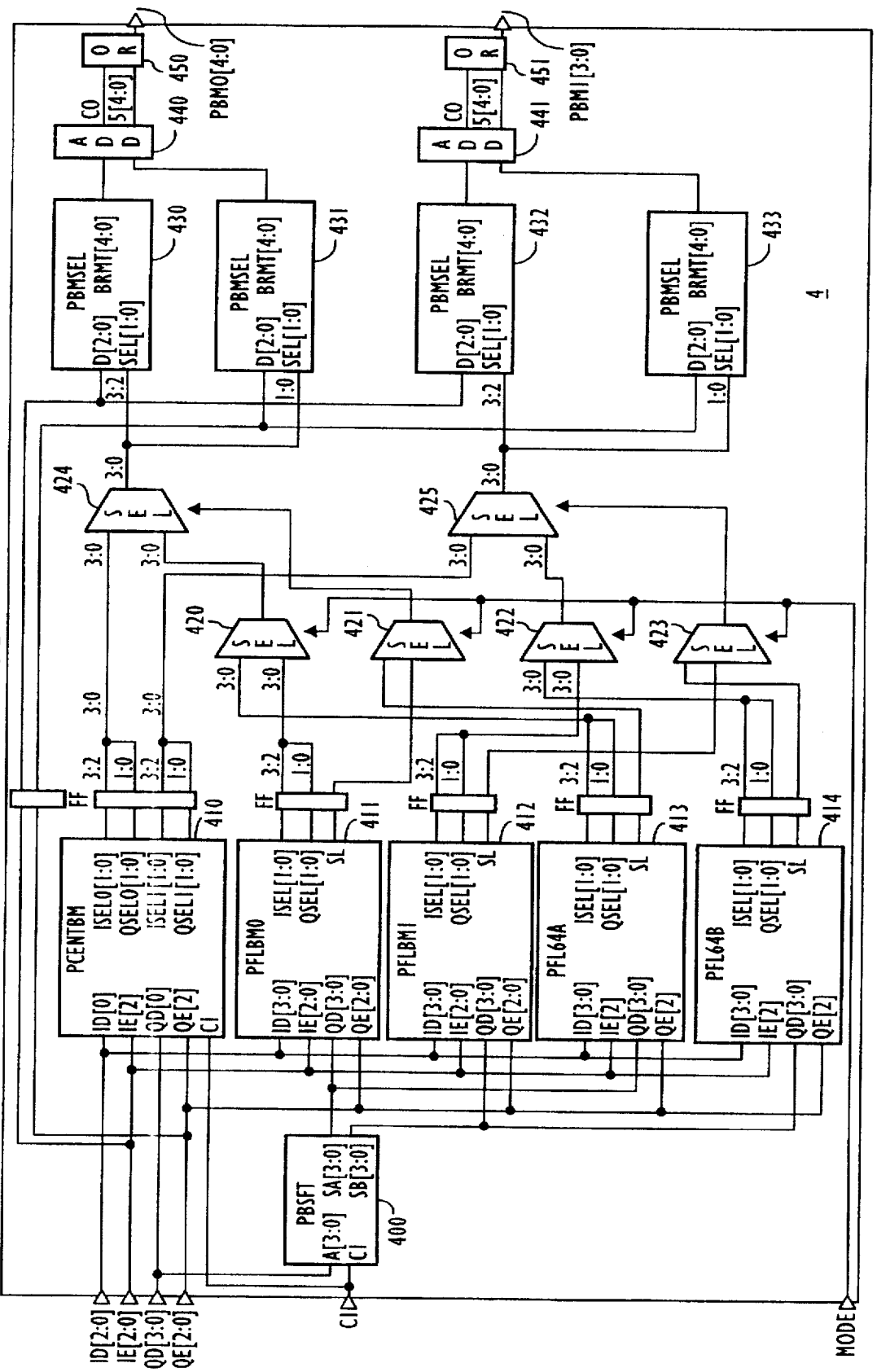
FIG. 26 is a diagram illustrating a structural example of C2 branch-metric value calculator (C2BMC).

FIG. 26 illustrates a detailed structural example of C2 branch metric value calculating circuit 4 shown in FIG. 1. The C2 branch metric value calculating circuit 4 is inputted a main signal ID of Ich component, an error signal IE and a main signal QD of Qch component, and an error signal QE and calculates Euclidean distance of code (C2) of level 2, based on an output of the encoder 3.

Timings of input and output signals of C2 branch metric value calculating circuit 4 are shown in 4 (C2BMC) of time charts shown in FIGS. 2 and 3.

The C2 branch metric value calculating circuit 4 calculates and outputs the Euclidean distance to the signal point of subset A (C2=0) and the Euclidean distance to the signal point of subset B (C2=1) when C1=0. Further, the calculating circuit 4 calculates and outputs the Euclidean distance to the signal point of subset A (C2=0) and the Euclidean distance to the signal point of subset B (C2=1) when C1=1.

The calculating circuit 4 can switch the operation employing 64-valued QAM system or 128-valued QAM system, according to the mode switching signal MODE.

A distance calculation table of C2 level for a parity bit will be explained. If a case of C2 level is compared to a case of C1 level, the distance calculation tables are formed not by subsets A and B, but by four subsets A, B, C and D, shown in FIGS. 27 through 30. FIGS. 27 to 30 show the subsets at the time of employing the 64-valued QAM system. The subsets at the time of employing the 128-valued QAM system is not shown in the diagram.

Returning to FIG. 26, the C2 branch metric value calculating circuit 4 has the same basic structure as that of the C1 branch metric value calculating circuit 1 described in FIG. 8. Distance calculation table processing circuits 411 to 414 have the same structure as those of the distance calculation table processing circuits 101 to 113 of the C1 branch metric value calculation circuit 1 shown in FIG. 8.

Figure 27:
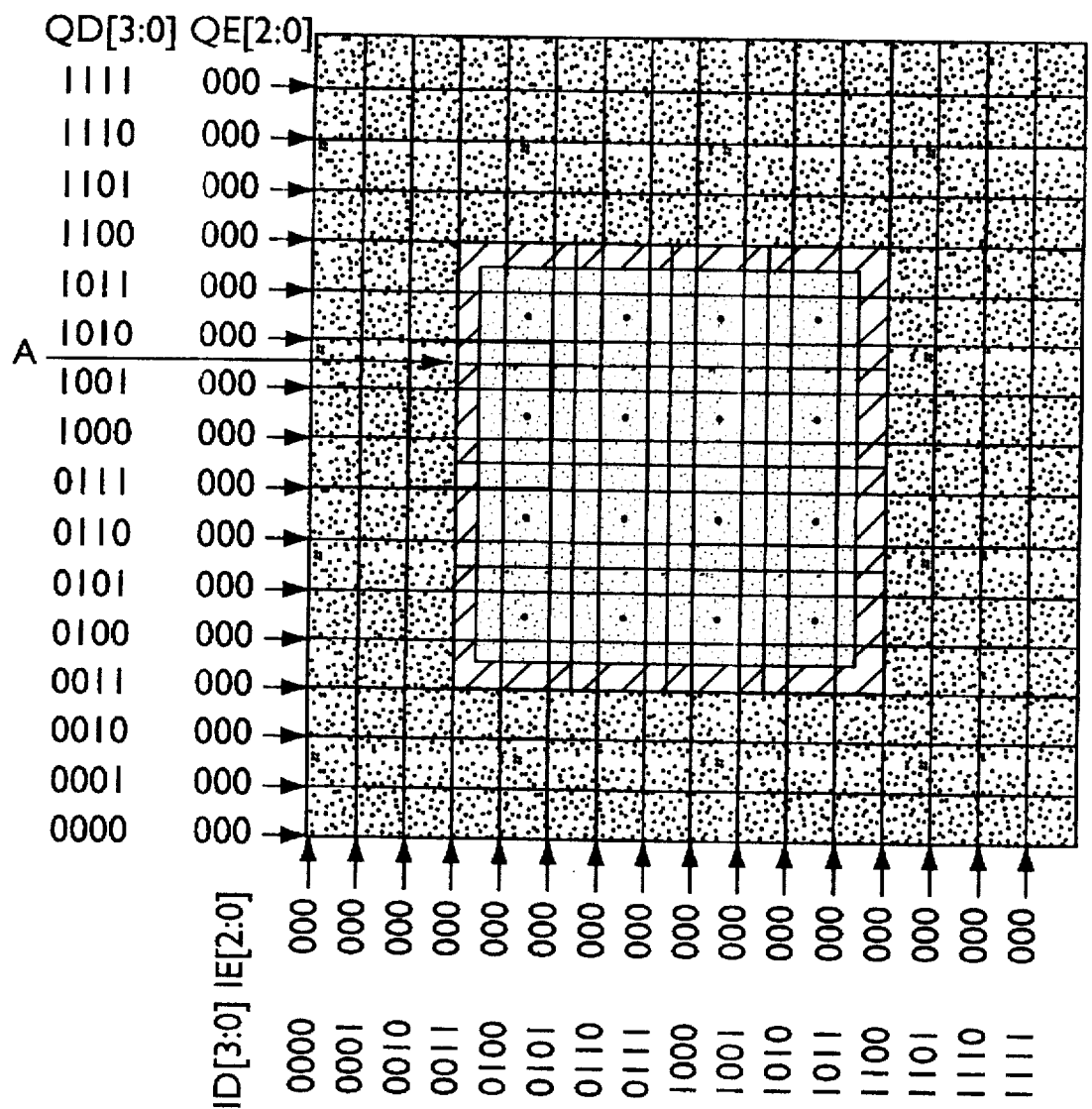
FIG. 27 is a diagram showing subset A of a distance calculation table at time of employing 64-valued QAM system.
Figure 28:
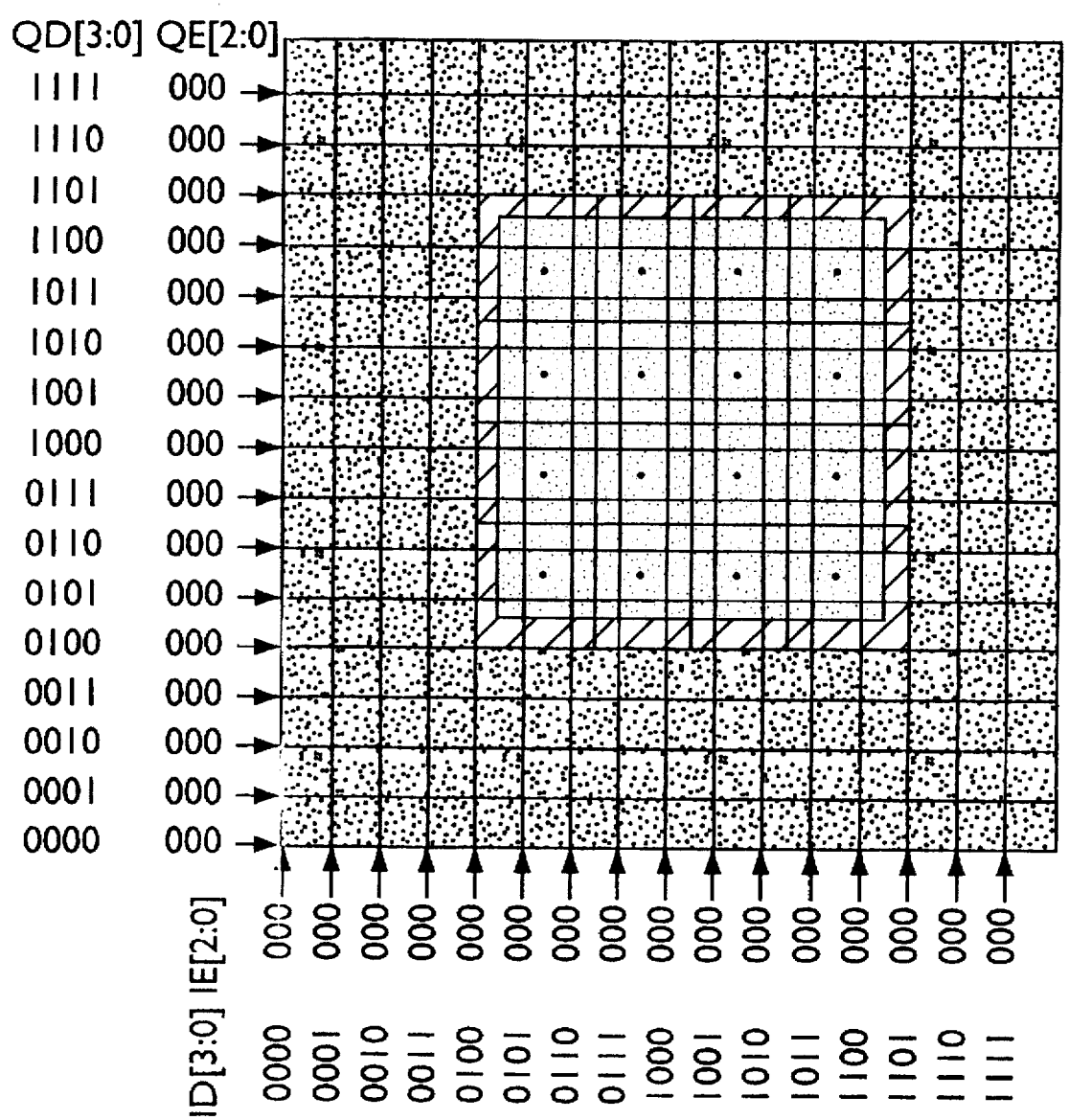
FIG. 28 is a diagram showing subset B of a distance calculation table at time of employing 64-valued QAM system.
Figure 29:
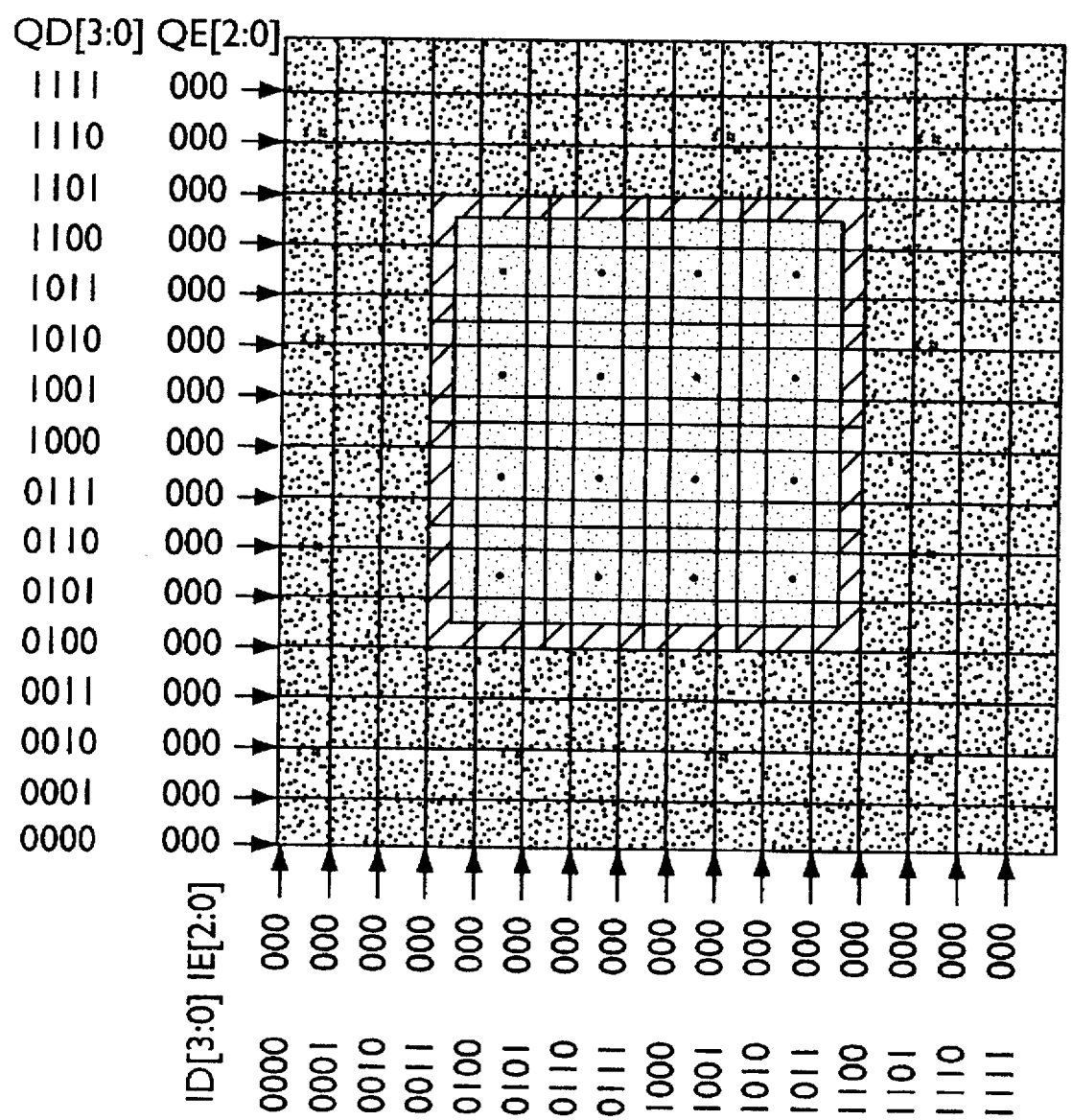
FIG. 29 is a diagram showing subset C of a distance calculation table at time of employing 64-valued QAM system.
Figure 30:
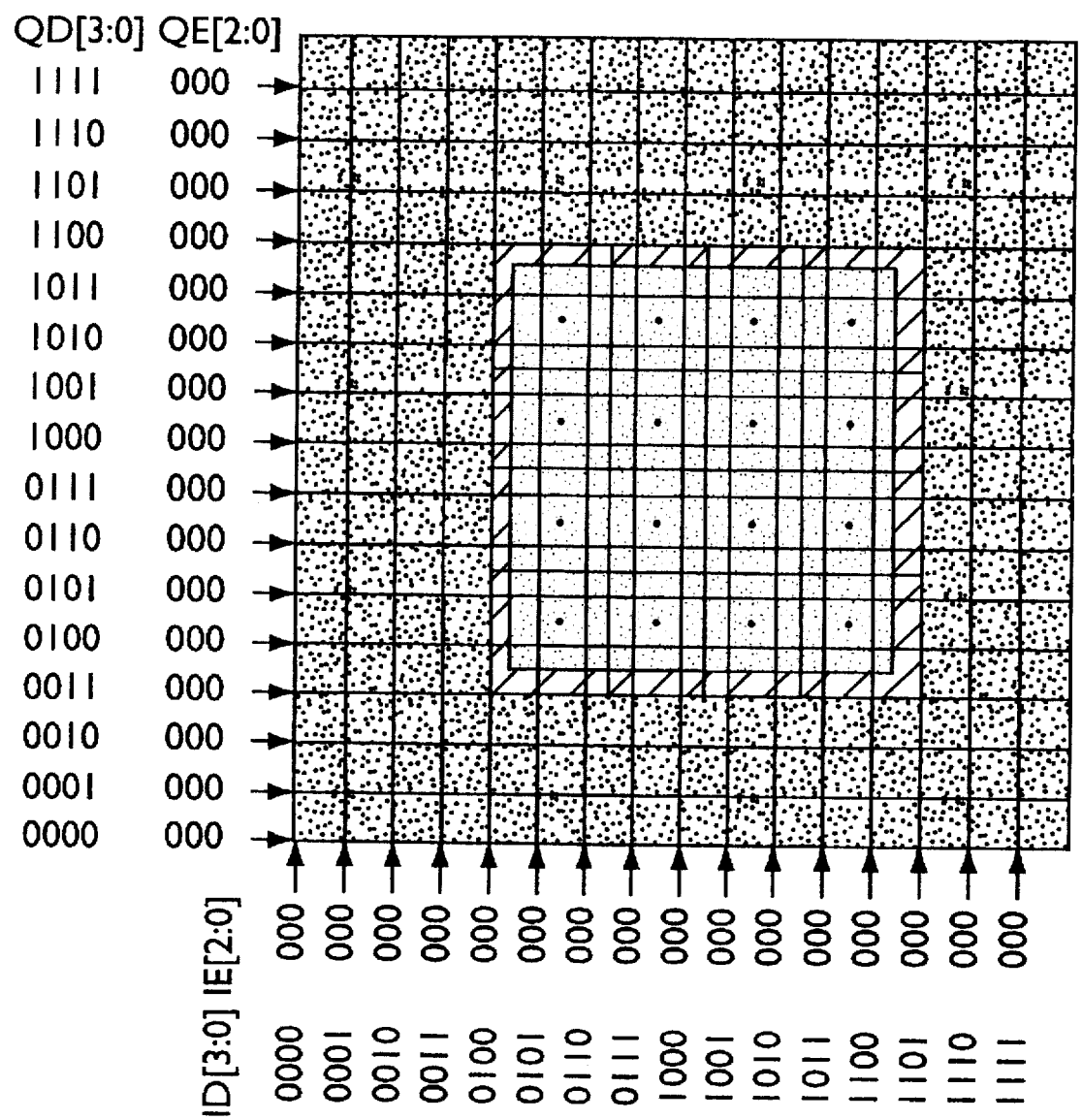
FIG. 30 is a diagram showing subset D of a distance calculation table at time of employing 64-valued QAM system.

In FIG. 26, a circuit (PBSFT) 400 has a function for shifting the received signal point to use the same distance calculation table, even if C1 is 0 or 1 in the distance calculation table processing circuits (PFLBM0 and PFLBM1) 411 and 412, by employing its principle that the distance calculation tables C and D [refer to FIGS. 29 and 30] become the same tables as those of the distance calculation tables A and B [refer to FIGS. 27 and 28] if the distance calculation tables C and D are shifted in parallel.

Accordingly, the circuit (PBSFT) 400 outputs the input A to the terminals SA (subset A) and SB (subset B) as it is, when C1=0. The circuit 400 outputs the number subtracted one from main data of Qch component from the terminal SA to obtain a distance between the subsets C and D and outputs the number added one to the main data of Qch component from the terminal SB.

To calculate the distance to subset C in the distance calculation table A, the received data is shifted in parallel by −1 in the Qch direction. To calculate the distance to subset D in the distance calculation table B, the received data is shifted in parallel by +1 in the Qch direction.

The distance calculation table processing circuits 413 and 414 are made valid at the time of employing the 64-valued QAM system. The circuits 413 and 414 are corresponding to the distance calculation table processing circuits 411 and 412. Accordingly, the distance calculation tables C and D are commonly processed by shifting the distance calculation tables A and B as described above.

Circuit (PCENTBM) 410 processes domain enclosed by bold lines in the distance calculation table [refer FIGS. 27 to 30]. The circuit 410 outputs ISEL0 and QSEL0 are outputted for the table A (or C) [refer to FIGS. 27 and 29], and ISEL1 and QSEL1 for the table B (or D) as a signal for selecting an expression for calculating a branch metric value.

Figure 31:
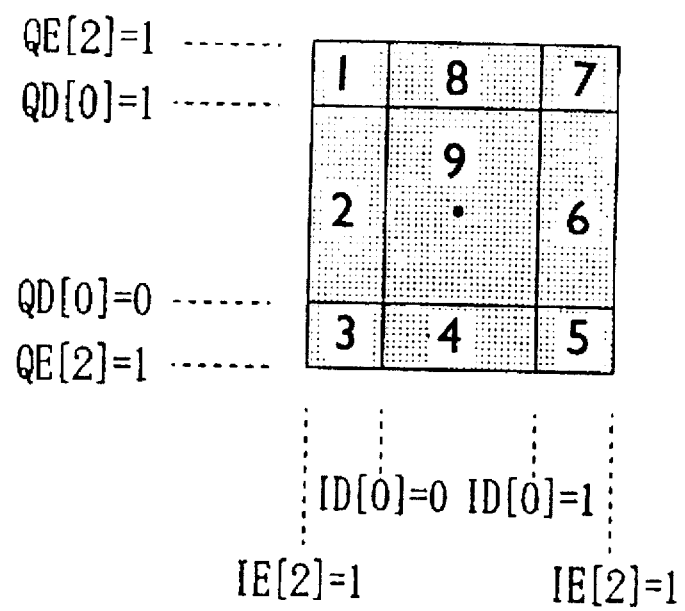
FIG. 31 is a diagram illustrating one part cut out from the domain enclosed with a bold line in a distance calculation table A.

The relationship between a domain and the selecting signal ISEL will be explained. FIG. 31 shows one section cut out from the domain enclosed with bold lines in the distance calculation table A [refer to FIG. 27] when C1=0. In FIG. 31, domains ① to ⑨ will be now considered. FIG. 32 shows the relationship between each of the domains ① to ⑨, domain conditions and outputs ISEL0, QSEL0.

Further, the distance calculation table processing circuit 413 (or 414) at the time of employing the 64-valued QAM system processes the domain outside of the bold lines in the distance calculation table 64A or 64C (64B or 64D) [refer to FIGS. 27 to 30].

Figure 33:
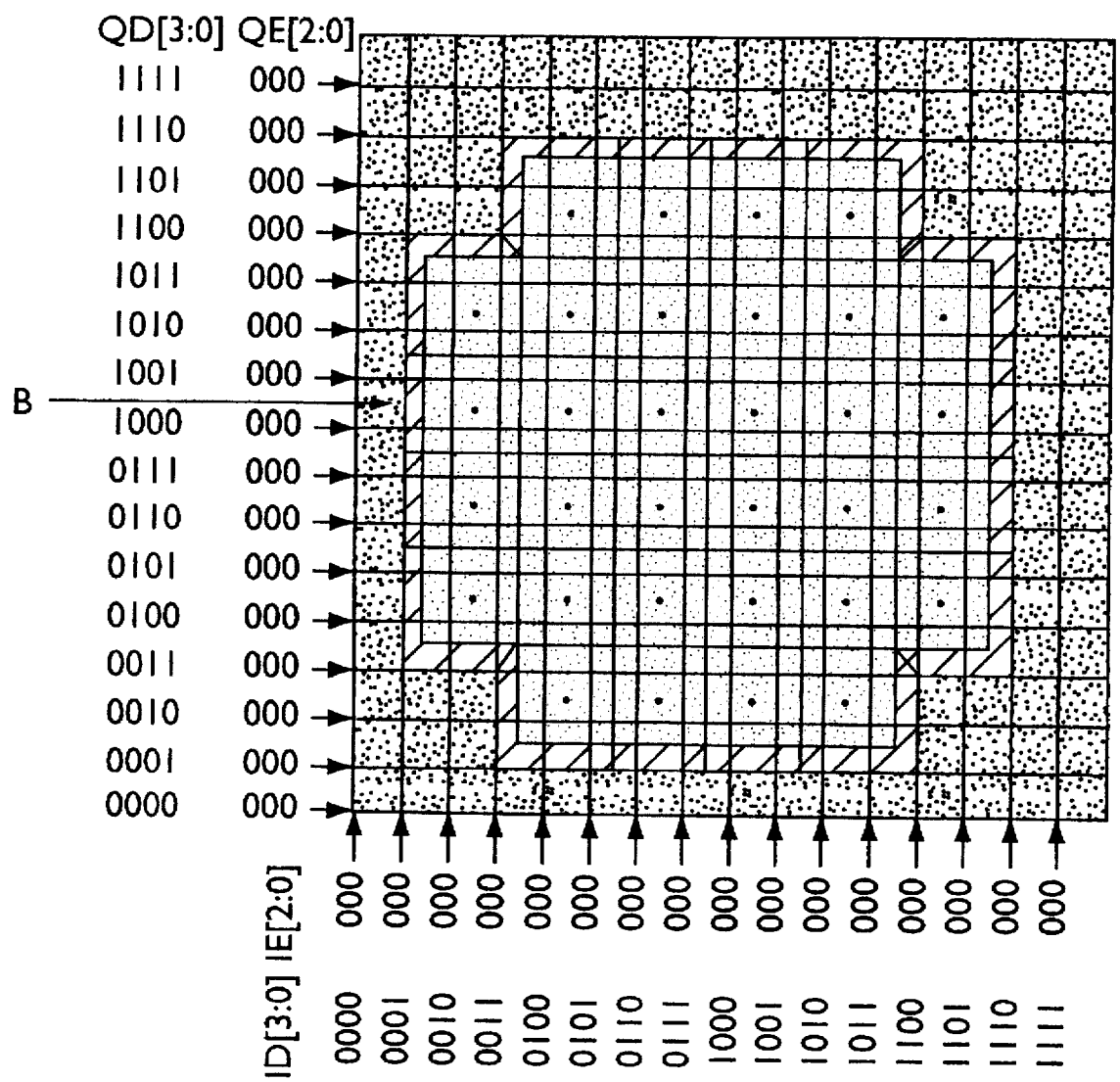
FIG. 33 is a diagram showing subset A of a distance calculation table at time of employing 128-valued QAM system.

Simultaneously, the distance calculation table processing circuit 411 (or 412) at the time of employing the 128-valued QAM system processes the domain outside of bold lines in the distance calculation tables 128A or 128C (128B or 128D). For simplicity, only a subset A of distance calculation table at time of employing the 128-valued QAM system is shown in FIG. 33.

Each circuit 411, 412, 413 or 414 outputs signals ISEL (1, 0) and QSEL (1, 0) for selecting an expression for calculating the Euclidean distance and outputs a signal SL for distinguishing the domain enclosed with bold lines from the domain outside of the bold lines in the distance calculation table. When the received signal is in the domain enclosed with bold lines in the distance calculation table, the circuit outputs SL=0, whereas the circuit outputs SL=1.

Figure 34:
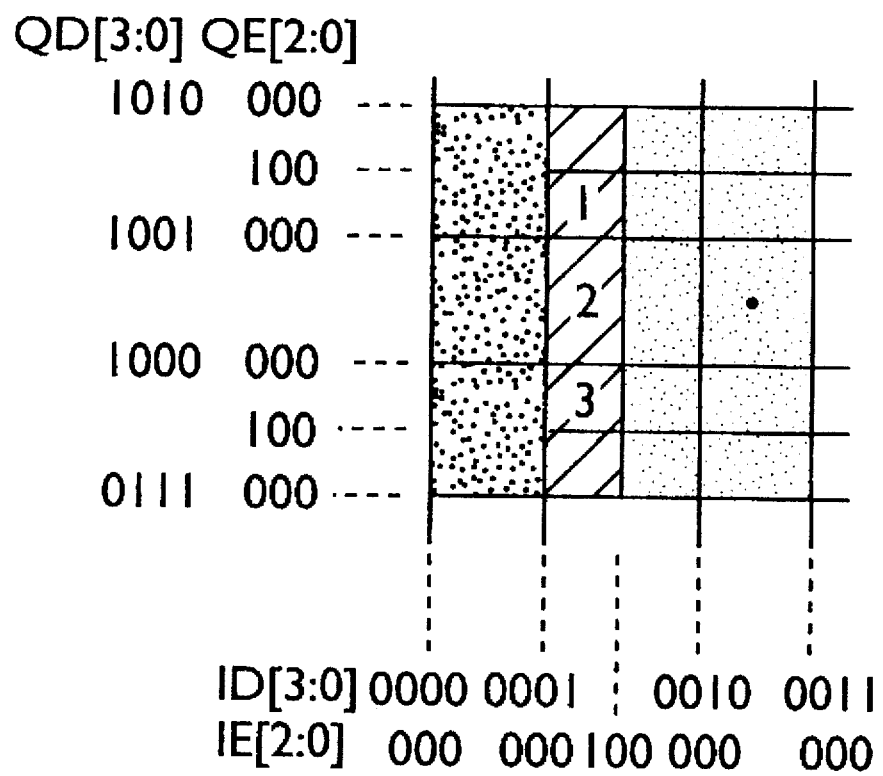
FIG. 34 is a diagram showing one part cut out from a domain shown in FIG. 33.

A signal for selecting the domain condition and the expression for calculation of the domain shown in FIG. 34 will be considered as an example. FIG. 34 illustrates the domain cut out from the range shown with B in FIG. 33. In this domain, the domain between ID (0000) and IE (0001) and the domains ① to ③ will be considered. FIG. 35 is a table showing the domains, each of domain conditions, and corresponding selecting signals ISEL and QSEL.

For example, the domain condition of domain ① becomes ID =0001, QD=1001, IE=0 and QE=0. The corresponding selecting signal is set to ISEL=1 0 and QSEL=0 1.

The domain condition of domain ③ becomes ID=0001, QD=0111, IE=0, QE=1. The corresponding selecting signal is set to ISEL=1 0, QSEL=1 0.

In FIG. 26, decoder circuits 430 to 433 are the same as the decoder circuit 130 shown in FIG. 8. The decoder circuits 430 to 433 output Ich and Qch components of the Euclidean distance as BRNT based on the selecting signals SELI and SELQ outputted from the selecting gates 424 and 425 and the input error signals IE and QE.

FIG. 36 is a diagram illustrating a correspondence between the selecting signal SEL and the expression for calculating branch metric value. A calculated value can be obtained by inserting a value of the main signal expressed by decimal numbers to D shown in the expression for calculating branch metric value.

The domain ① shown in FIG. 35 will be considered. The selecting signal SEL is ISEL=1 0 and QSEL=0 1. Therefore, $(12-D)^2 + (4+D)^2$ is given as an expression for calculating branch metric value. $(12-D)^2$ is outputted from the decoder 430 and $(4+D)^2$ is outputted from the decoder circuit 431, both $(12-D)^2$ and $(4+D)^2$ are added in the adding circuit 440 and become $(12+D)^2 + (4+D)^2$.

In the domain ③, the selecting signals ISEL=1 0 and QSEL=1 0. Therefore, $(12-D)^2 + (12-D)^2$ are outputted from the adding circuit 440.

When the Euclidean distance becomes more than 128, the output BRNT outputs the maximum value 11111.

Figure 37A:
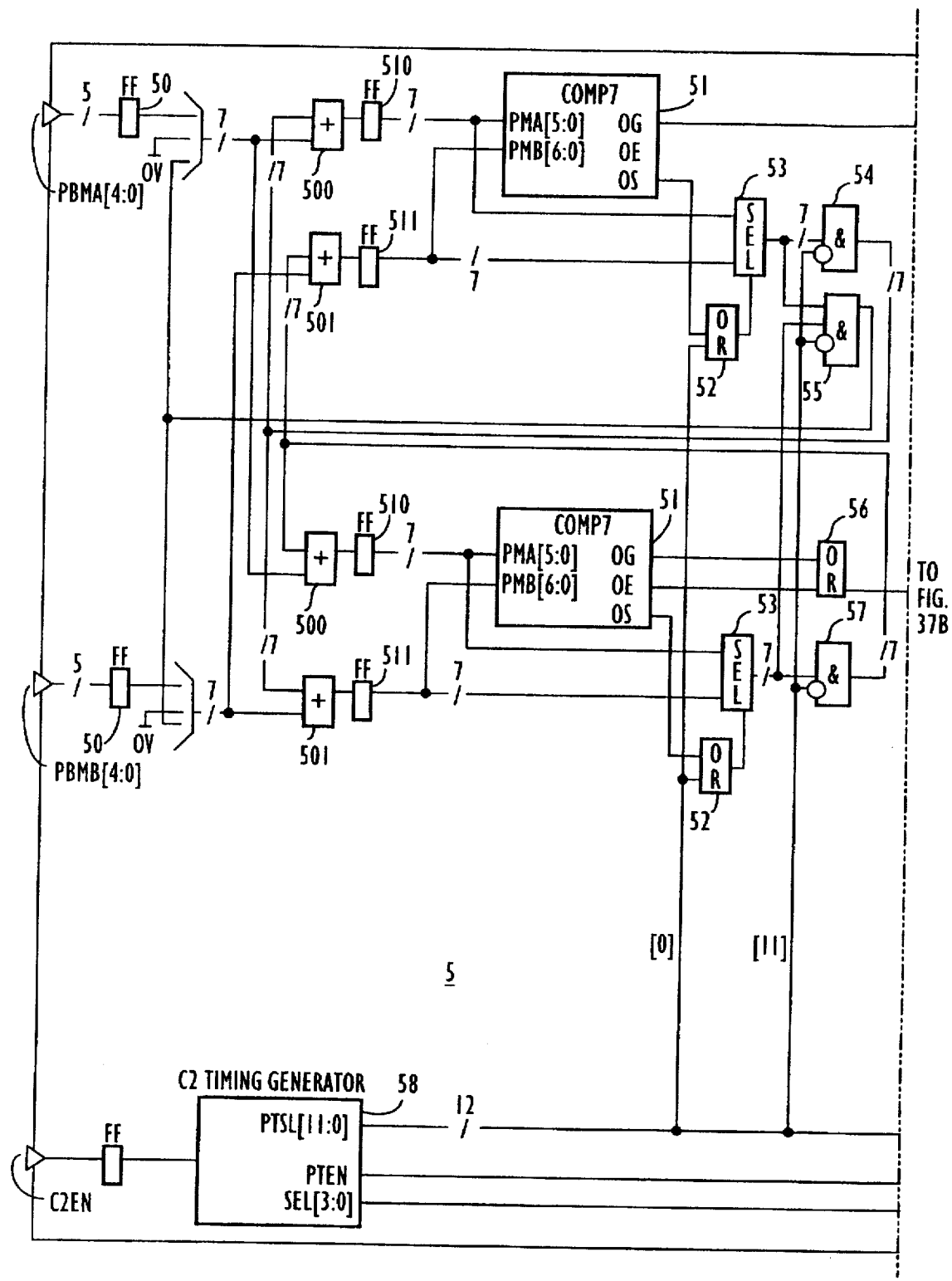
FIGS. 37A and 37B are diagrams illustrating a structural example of C2 decoder (DEC2).
Figure 37B:
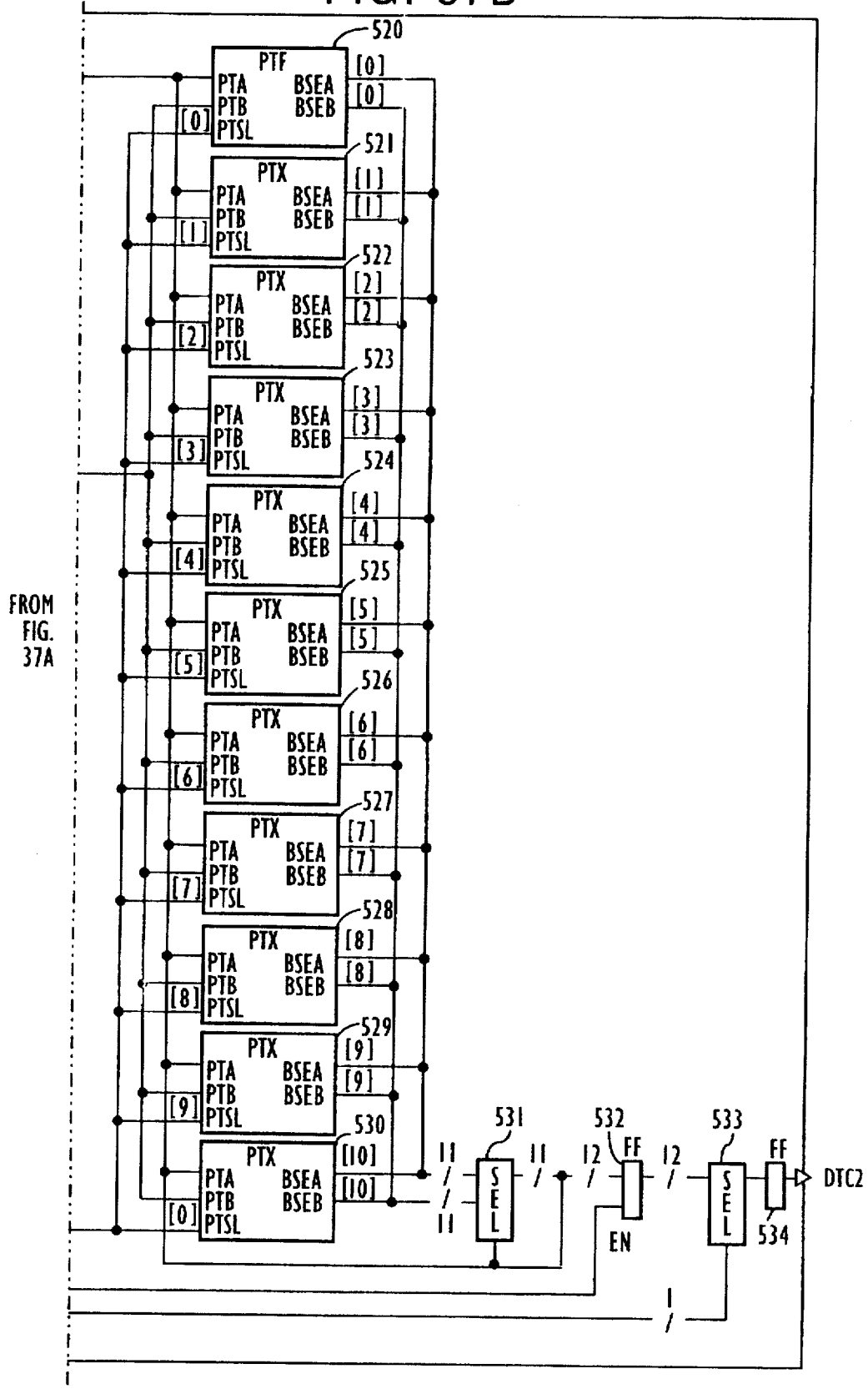

FIGS. 37A and 37B are structural examples of the C2 decoder (DEC2) 5 [refer to FIG. 1]. The C2 decoder 5 obtains the Euclidean distance to the signal point of subset C (C2=0) and the Euclidean distance from subset D (C2=1) when C1 =0 according to the result of C1 decoding. The C2 decoder 5 decodes the C2 code that is the result of parity arithmetic based on the input of distances.

Figure 38:
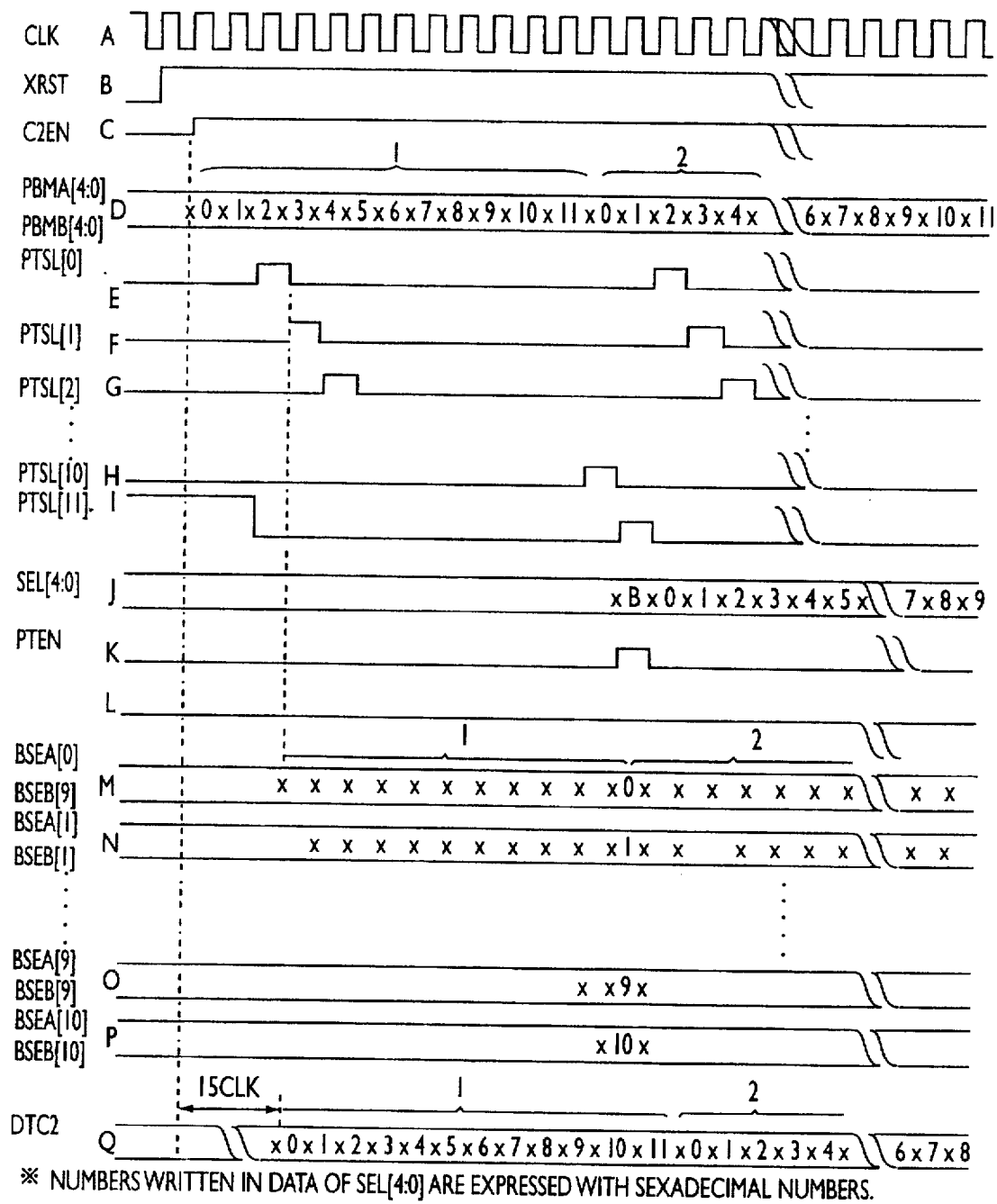
FIG. 38 is a diagram showing operation time chart (No. 2).
Figure 39:
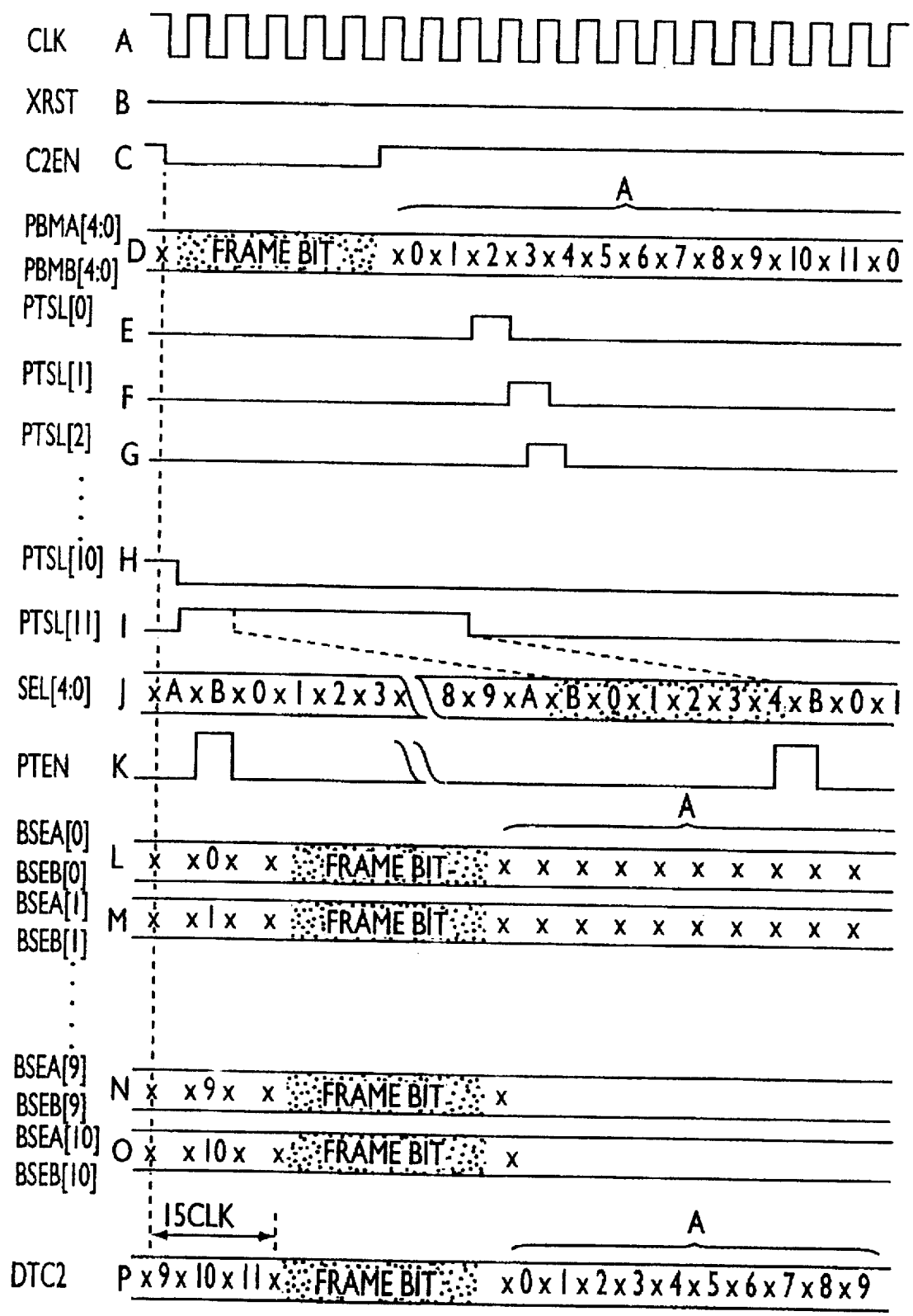
FIG. 39 is a diagram showing operation time chart (continued from FIG. 38).

FIGS. 38 and 39 show operation time charts in which a signal timing of each section in the C2 decoder (DEC2) 5 shown in FIG. 36 corresponds to a reference numeral. In FIGS. 38 and 39, the numeral in data of SEL is expressed by sexadecimal number.

In FIGS. 2 and 3, timings of an enable input signal C2EN for decoding in the C2 decoder 5 and an output signal DTC2 are shown in FIGS. 2 and 3 in relation to the signals shown in other schematic block diagrams.

Further, decoding can be stopped at the position of data (frame bit: refer to FIGS. 3 and 39) which is not decoded.

In FIGS. 37A and 37B, inputs PBMA and PBMB respectively mean the Euclidean distance to the signal point of subset A (or C) and the Euclidean distance to the signal point of subset B (or D).

C2EN means an enable signal for decoding. Further, the output DTC2 means the decoding result. In FIGS. 37A and 37B, the decoder 5 includes a pair of flip flops FF 50, adding circuits 500 and 501, flip flops FF 510 and 511, comparison circuits 51, an OR gates 52 and selecting gates 53 for the inputs PBMA and PBMB.

The output from the selecting gate 53 on the input PBMA side is inputted to AND gates 54 and 55 each of which has one input terminal of a NOT logic. The outputs from the AND gates 54 and 55 are feed-backing to the adding circuits 500 and 501 on the sides of inputs PBMA and PBMB, respectively.

The output from the selecting gate 53 on the input PBMB side is inputted to the AND gate 57 which has one input terminal of a NOT logic. The output of AND gate 57 is feed-backing to the adding circuit 501 on the input PBMA side and the adding circuit 500 on the input PBMB side.

The output OG from the comparison circuit 51 on the input PBMA side is inputted to the PTA terminals of the first stage of path memory 520 and path memories 521 to 530. OR logic of OE and OS outputs of the comparing circuit 51 on the input PBMA side is inputted to the PTB terminals of a first stage of path memory 520 and the path memories 521 to 530.

The comparing circuit 51 compares two path metric values (7 bits×2) inputted to the terminal PMA and PMB and outputs the path selecting signal and path metric value selecting signal to the path memories 520 to 530. In FIG. 37, the path metric value input A is inputted to the terminal PMA and the path metric value input B is inputted to the terminal PMB.

"1" is outputted to the output terminal OG when the path metric value input A is larger than the path metric value input B. "1" is outputted to the output terminal OE when the path metric value input A is equal to path metric value input B. Further, "1" is outputted to the output terminal OS when the path metric value input A is smaller than the path metric value input B.

Figure 40:
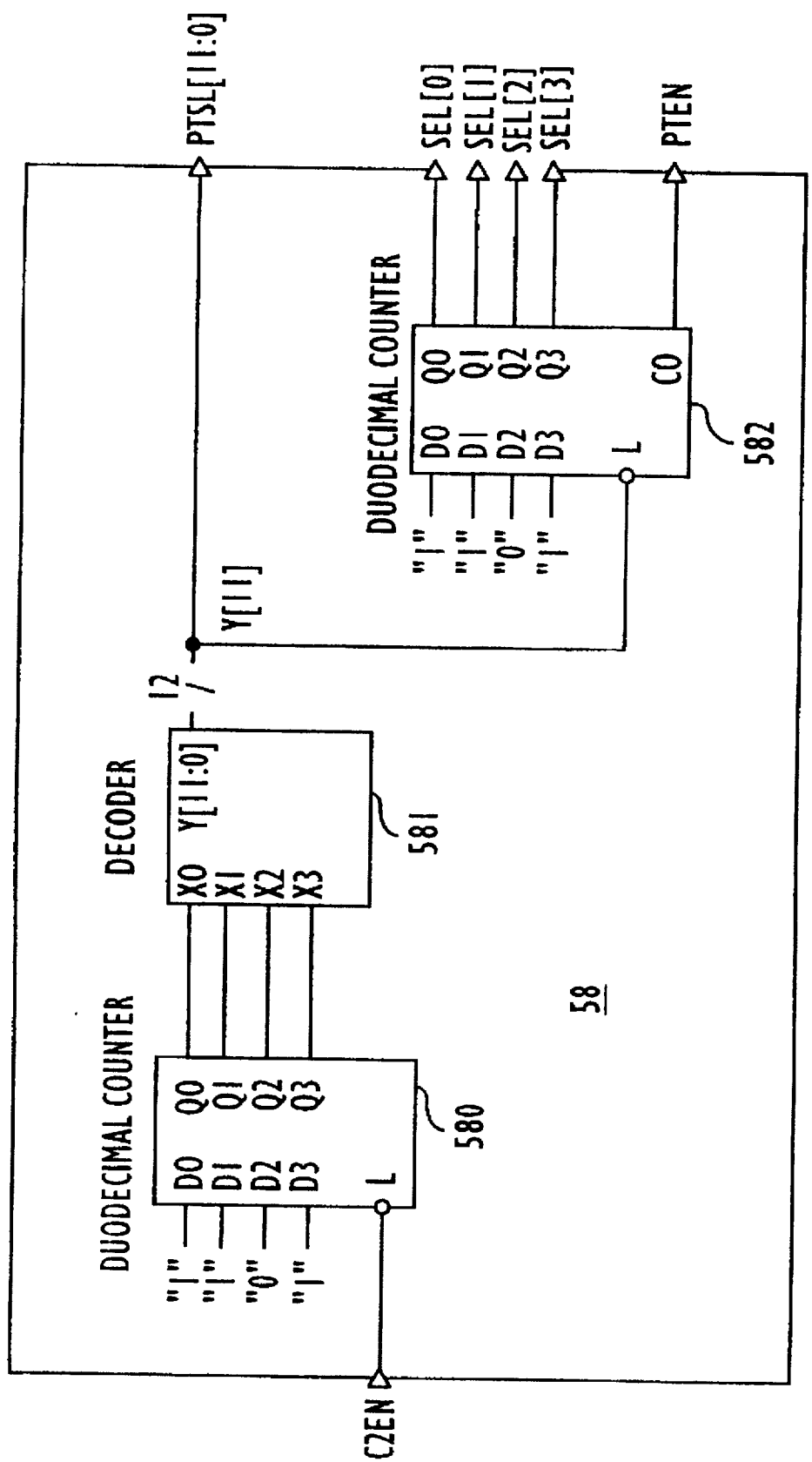
FIG. 40 is a diagram illustrating a structural example of C2 timing generator.

FIG. 40 illustrates a block diagram of a detailed structural example of timing generator 58 shown in FIG. 37. The timing generator 58 generates and outputs timing for writing paths to the path memories 520 to 530 and for serially outputting the outputs of path memories 520 to 530.

In FIG. 40, the timing generator 58 includes a duodecimal counter 580, a decoder 581 and a duodecimal counter 582. The input C2EN to the duodecimal counter 580 is a C2 decoding enable signal.

With such a structure, the generator 58 generates PTSL that is a timing pulse output for writing a path to the path memory, PTEN that is a timing pulse output for serially outputting the output of path memory and SEL[0 to 3] that is a timing pulse output for serially outputting the output of path memory, as output clocks.

The timing pulse output PTSL for writing a path to the path memory is .inputted to the OR gate 52 and AND gates 54, 55 and 57 of the C2 decoder 5. Further, the PTSL is inputted to the PTSL terminals of path memories 520 to 530.

In FIGS. 37A and 37B, the timing pulse output PTEN for serially outputting the outputs of the path memories 520 to 530 is inputted to the flip flop FF 532. Further, the timing pulse output SEL for serially outputting the outputs of path memories 520 to 530 is inputted to the selecting gates 531 and 533.

Figure 41:
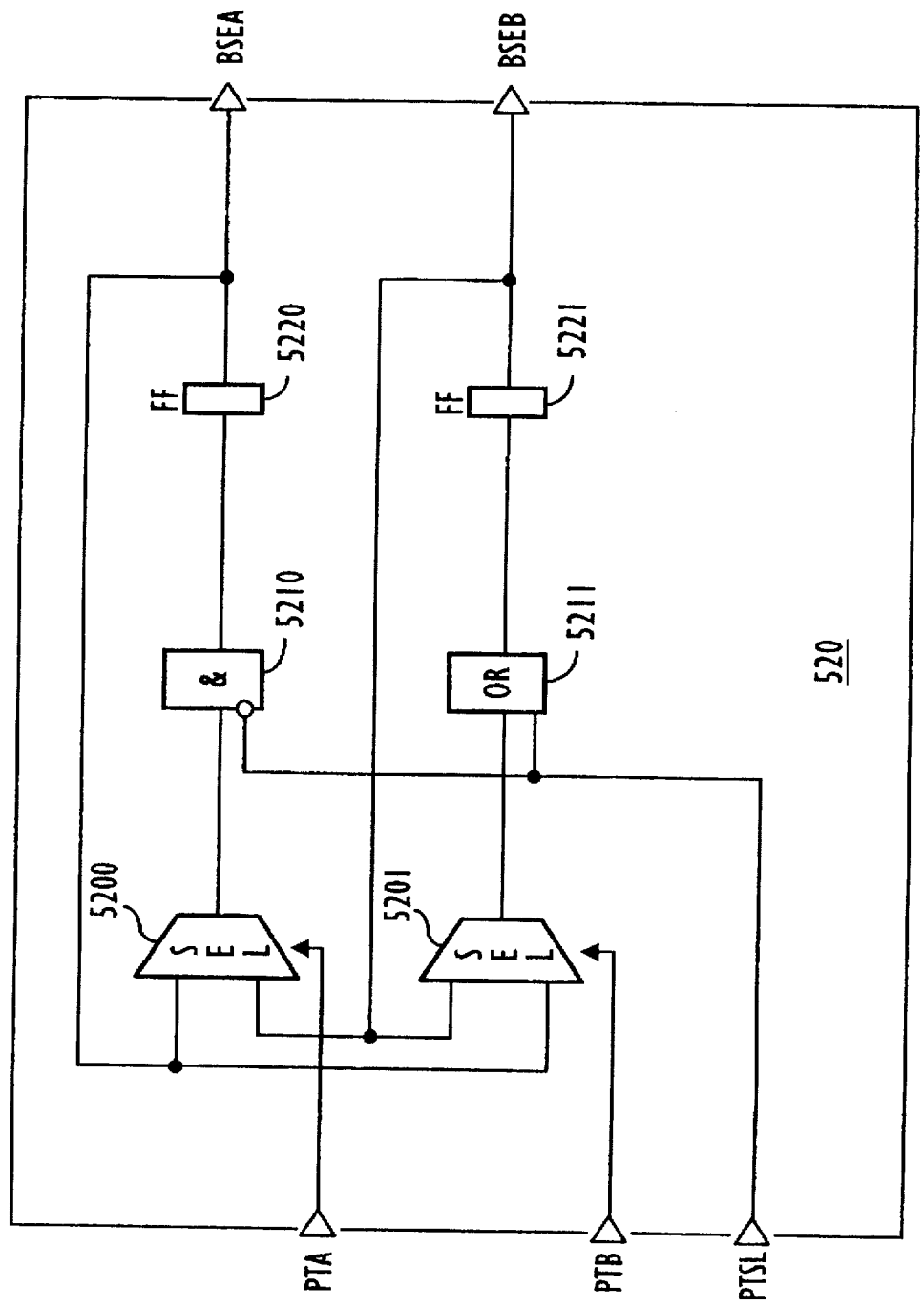
FIG. 41 is a diagram illustrating a structural example of first path memory (PTF).

FIG. 41 is a block diagram illustrating structural example of the first path memory 520. The path memory 520 includes selecting gates 5200 and 5201, AND gates 5210 and 5211 and flip flops FF 5220 and 5221.

The outputs from the flip flops FF 5220 and 5221 are respectively fed-back the selecting gates 5200 and 5201. A selecting signal PTA for the path that is transferred to the condition 0, i.e., the output of the comparison circuit 51 in the C2 decoder 5, and a selecting signal PTB for the path which is transferred to the condition 1 can select and switch the selecting gates 5200 and 5201.

The outputs from the selecting gates 5200 and 5201 are respectively inputted to the AND gate 5210 and the OR gate 5211. The timing signal PTSL for writing to the path memory in the timing generator 58 is inputted to the AND gate 5210 via a NOT logic circuit and is directly inputted to the OR gate 5211.

Then, the flip flop FF 5220 outputs the output BSEA of the path memory on the condition 0, and the flip flop FF 5221 outputs the output BSEB of the path memory on the condition 1.

Figure 42:
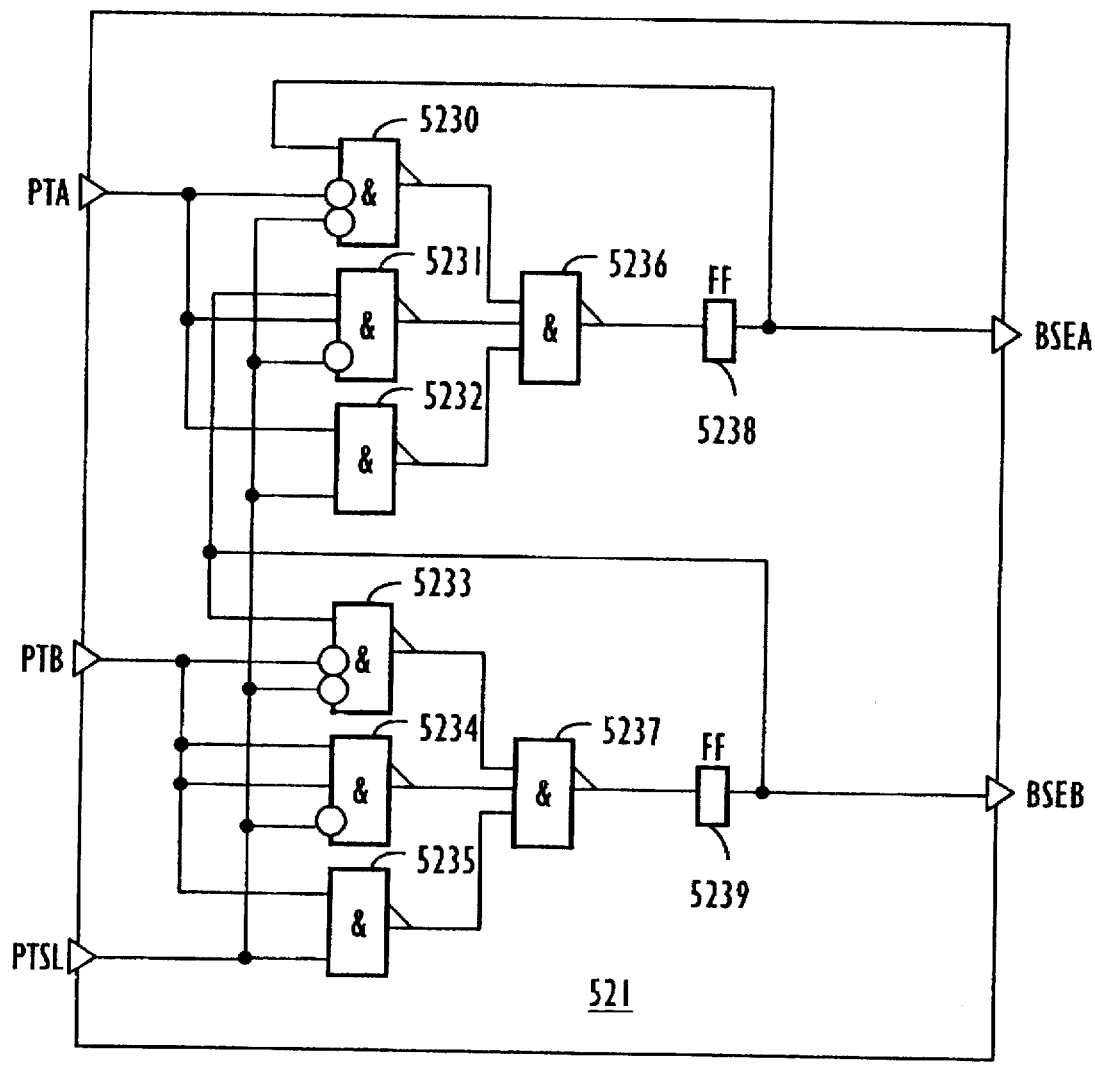
FIG. 42 is a diagram illustrating a structural example of path memory (PTX).

FIG. 42 is a block diagram of a common structural example of path memories (PTX) 521 to 530. The path memories 521 to 530 include NAND gates 5230 to 5237 and flip flops FF 5238 and 5239.

The path selecting signal PTA which is transferred to the condition 0 is inputted to the NAND gate 5230 via a NOT logic. Further, the path selecting signal PTA is directly inputted to the NAND gates 5231 and 5232. Simultaneously, the path selecting signal PTB which is transferred to the condition 1 is inputted to the NAND gate 5233 via a NOT logic. Further, the path selecting signal PTB is directly inputted to the NAND gates 5234 and 5235.

The outputs from the NAND gates 5230 to 5232 are inputted to the NAND gate 5236, the outputs from the NAND gates 5233 to 5235 are inputted to the NAND gate 5237, and the outputs of the NAND gates 5236 and 5237 are inputted to the flip flops FF 5238 and 5239, respectively.

The output of the flip flop FF 5238 is fed-back to the NAND gate 5230 and 5234, and the output from the flip flops FF 5238 is feed-backing to the NAND gates 5231 and 5233.

Further, the timing pulse PTSL for writing the path memories is inputted to the NAND gates 5230, 5231, 5233 and 5234 via a NOT logic. The timing pulse PTSL is directly inputted to the NAND gate 5232 and 5235.

With the above-described structure, the flip flop FF 5238 outputs BSEA of the path memory on the condition 0, and the flip FF 5239 outputs BSEB of the path memory on the condition 1.

The above-described BSEA and BSEB of the path memories 520 to 530 are serially converted and outputted as the decoding result DTC2 via the selecting gate 531, the flip flop FF 532, the selecting gate 533 and flip flop FF 534 according to the timings PTEN and SEL outputted from the C2 timing generator 58.

Figure 43:
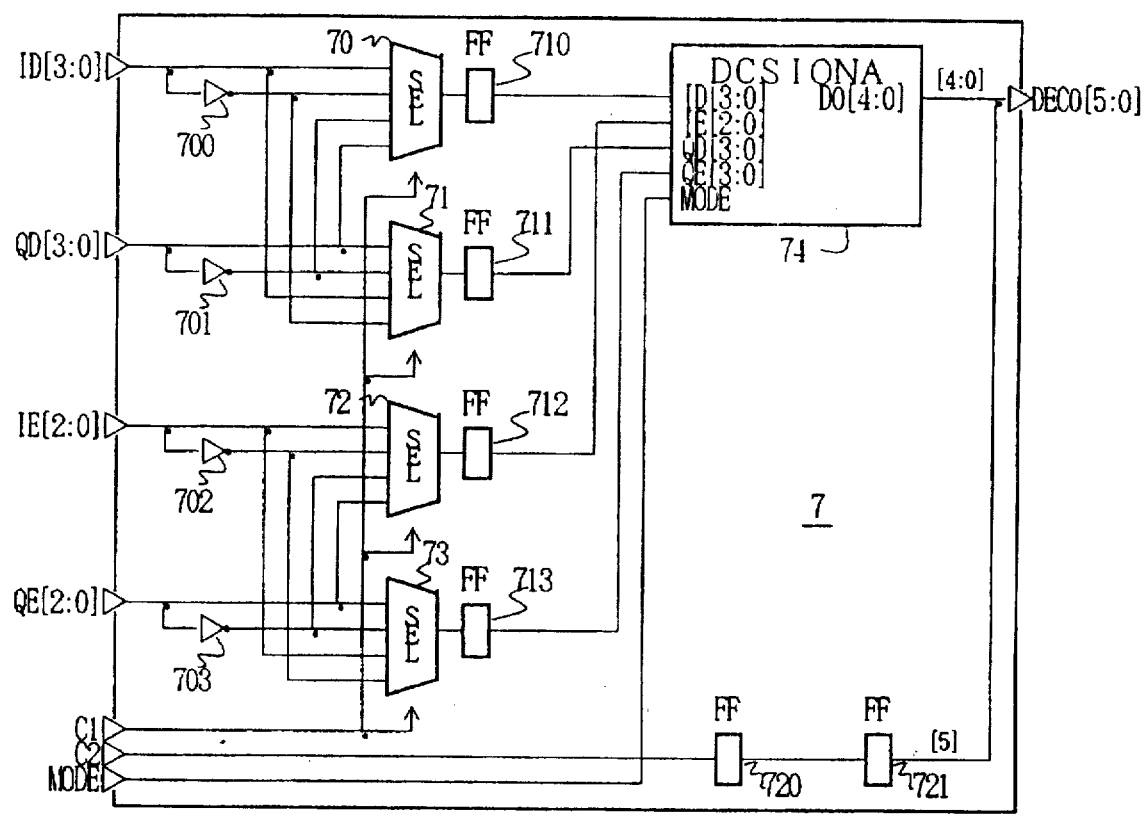
FIG. 43 is a diagram illustrating a structural example of signal decision section (DECISION).

FIG. 43 is a block diagram of a detailed structural example of the signal decision section 7 [refer to FIG. 1]. The section 7 performs demapping of subset A of received input data ID and QD, based on DTC1 that is the decoding result of C1 code of level 1 and DTC2 that is the decoding result of C2 code of level 2.

The signal decision section 7 simultaneously performs demapping of subsets B, C and D by rotating the received input data at zero degree, at a right angle, or at 180 degrees, respectively by setting the C1 and C2 codes as selecting signals.

Ich main signal ID and Ich error signal IE and Qch main signal QD, Qch error signal QE are inputted to the signal decision section 7. Then, code DTC1 of level 1, code DTC2 of level 2 and a switching signal MODE of switching to 64-valued QAM system and the 128-valued QAM system ("0" at the time of employing the 64-valued QAM system and "1" at the time of employing the 128-valued QAM system) are simultaneously inputted to the section 7. After then, the section 7 generates and outputs demapping data DECO obtained according to the decoding result.

The demapping data DECO is shown in 7 (DECISION) of operation time charts shown in FIGS. 2 and 3.

The signal decision section 7 shown in FIG. 43 is formed of selecting gates 70 to 73 having four input terminals, a decision circuit 74, inverters 700 to 703, and flip flops FF 710 to 713, 720 and 721.

Four signals ID, /ID, QD, /QD are inputted to the selecting gate 70 to select and output a signal "1" according to DTC1 that is the decoding result of code C1 of level 1 and DTC2 that is the decoding result of code C2 of level 2.

The output from the selecting gate 70 is inputted to the decision circuit 74 via the flip flops FF 710 to 713. Further, a mode signal MODE is inputted to the decision circuit 74.

The DTC2 which is the decoding result of code C2 of level 2 is outputted via the flip flops FF 720 and 721 for timing adjustment.

Figure 44:
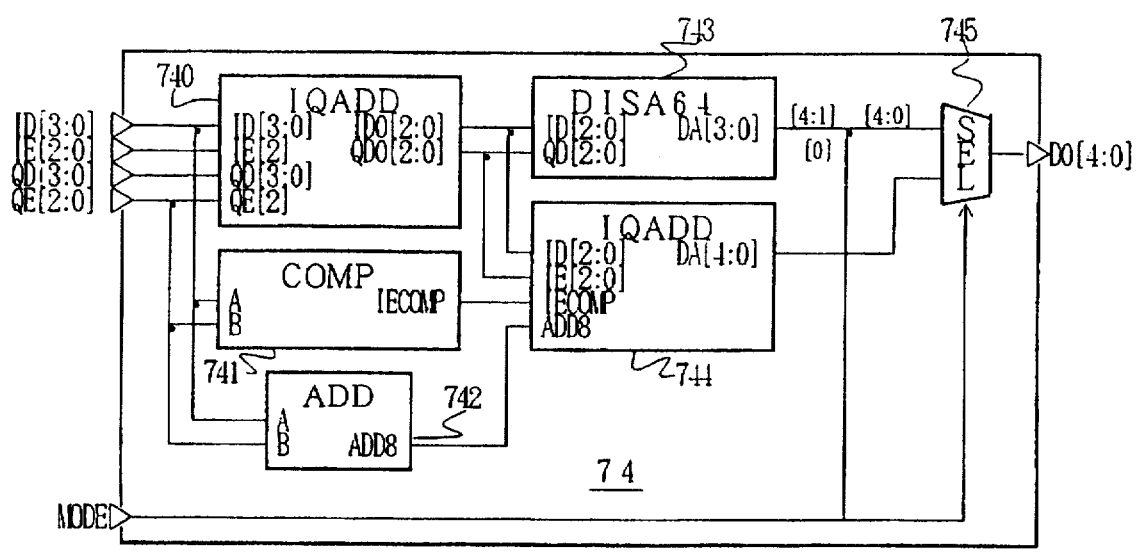
FIG. 44 is a diagram illustrating a structural example of decision section (DECISIONA).

FIG. 44 is a detailed structural block diagram of the decision circuit 74. The error signals IE and QE will be considered as decimal numbers in FIG. 44. A comparison circuit 741 compares the size of signals IE and QE. When IE is not less than QE, the output IECOMP becomes 1.

Further, an adding circuit (ADD) 742 indicates ADD=1 when the result of adding of the error signals IE and QE is more than 8 (expressed with a decimal number). When the result is less than 8, the circuit 742 indicates ADD=0.

A correcting circuit (IQADD) 740 corrects a main signal to store the received signal point into A and outputs the corrected main signal. Then, the subset A is corrected as a table at the time of employing a 256-valued QAM system. FIG. 43 illustrates a detailed structural example of the correcting circuit (IQADD) 740.

Figure 45:
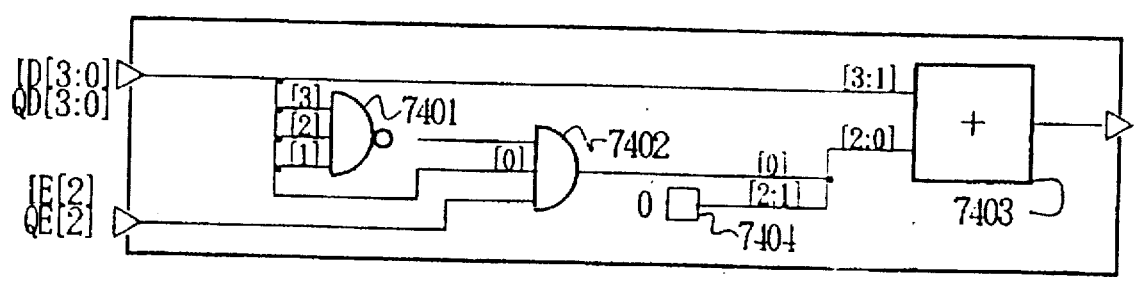
FIG. 45 is a diagram illustrating a structural example of IQADD.

In FIG. 45, the correcting circuit (IQADD) 740 is formed of a NAND gate 7401, an AND gate 7402 and an adding circuit 7403. The upper level of 3 bits of the signals ID and QD are inputted to the NAND gate 7401, and the output from the NAND gate 7401, the lowest level of 1 bit of the signals ID and QD and the signals IE and QE are inputted to the AND gate 7402.

The signals ID and QD, the output from the AND gate 7402 and zero setting data 7404 are inputted to the adding circuit 7403. After then, the output ID0 and QD0 are outputted from the correcting circuit (IQADD) 740.

Figure 46:
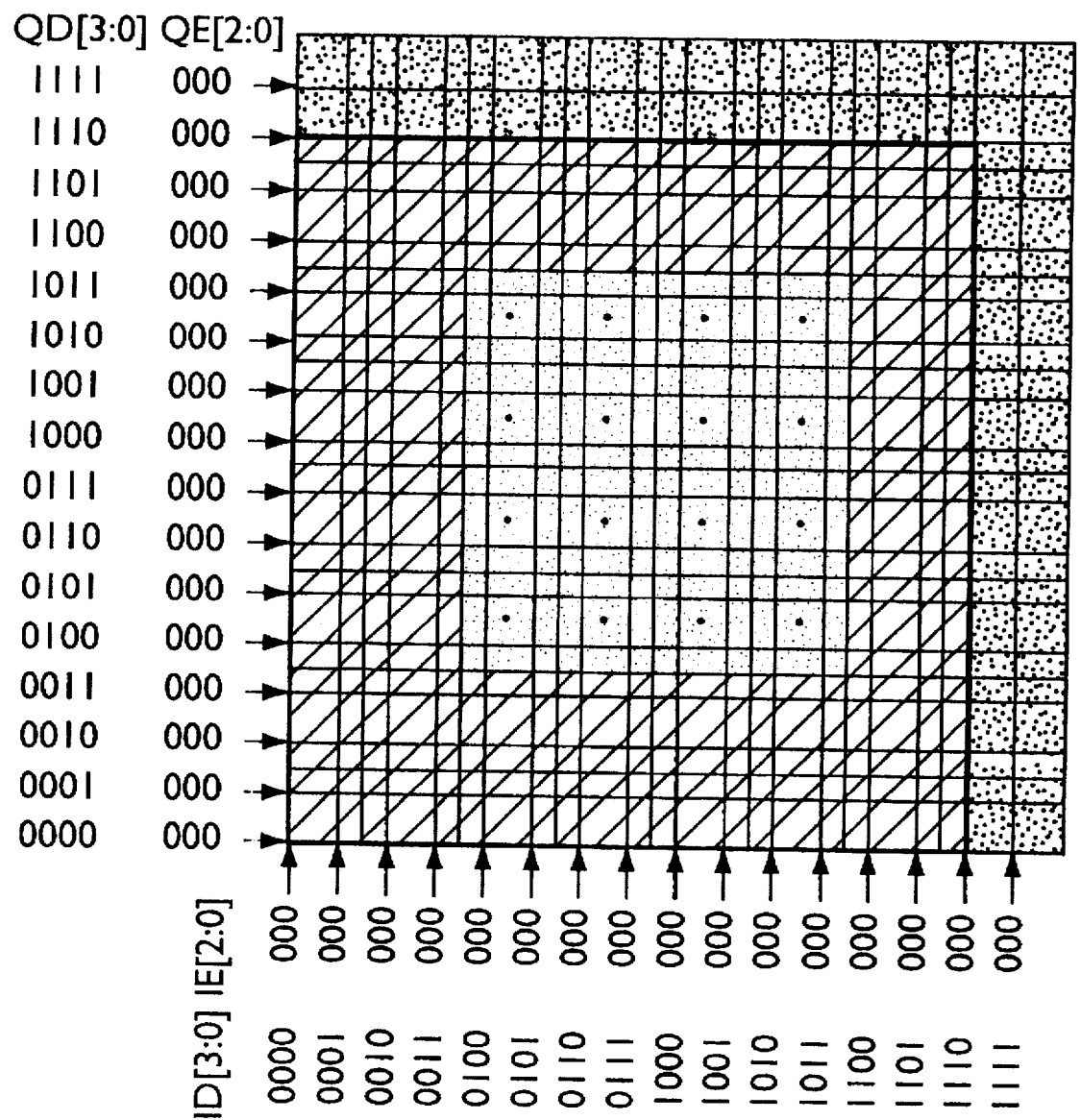
FIG. 46 is a diagram showing subset A of demapping table at time of employing 64-valued QAM system.
Figure 47:
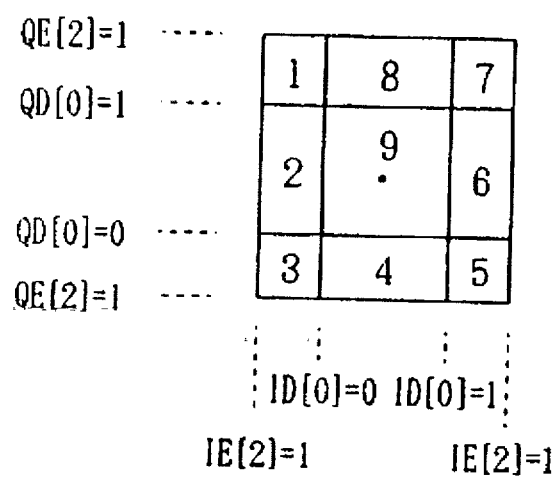
FIG. 47 is a diagram showing one section (domain enclosed with a bold line) of demapping table cut out from the table shown in FIG. 46.

FIG. 46 shows a demapping table of subset A at the time of employing the 64-valued QAM system. Functions of the correcting circuit (IQADD) 740 will be explained in accompany with FIG. 46. FIG. 47 shows one part cut out from a domain enclosed with bold lines in the demapping table shown in FIG. 46, which has small domains ① to ⑨. FIGS. 48 and 49 show the small domains ① to ⑨, the domain condition and the corresponding outputs ID0 and QD0 in one table.

It is apparent from FIG. 48 that, for example, the domain ② is specified under the condition of ID=1, QD=1 and IE =1. The corresponding output ID0 becomes ID+1, and the output QD0 becomes QD outputted as it is.

Further it is apparent from FIG. 49 that the domain ⑨ is specified under the condition of ID=0 and QD=0. Then, the corresponding output ID0 becomes ID and QD outputted as they are.

Figure 50:
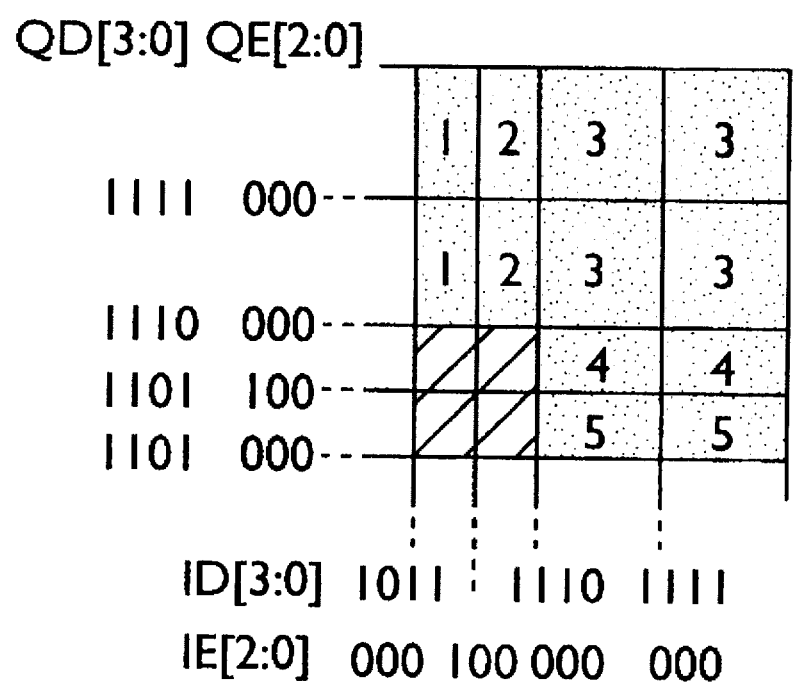
Figure 51:
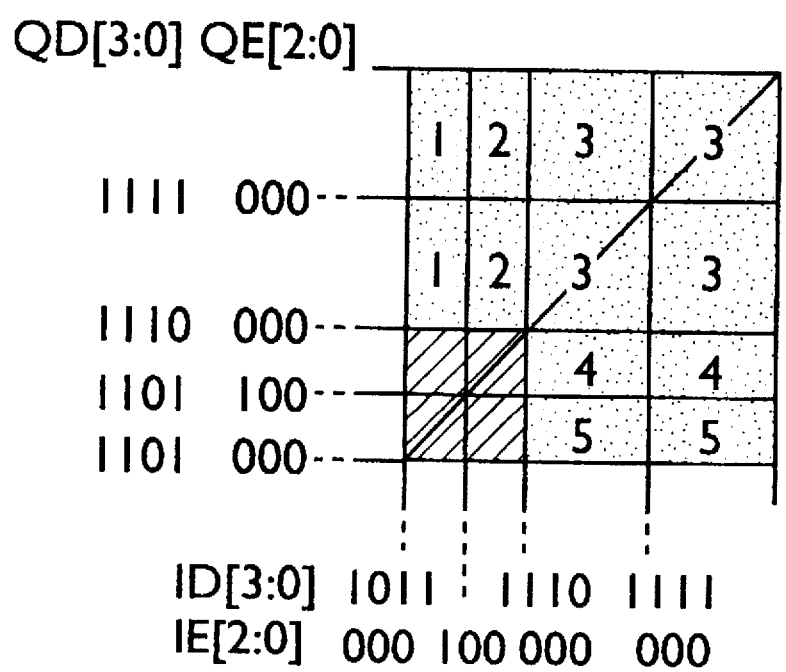
FIG. 51 is a diagram showing one section of 128-valued QAM system corresponding to the section shown in FIG. 50.

FIG. 50 shows one part cut out from the domain outside of the bold lines in the demapping table shown in FIG. 46. FIG. 51 shows one part cut out from the domain outside of the bold lines in the 128-valued QAM demapping table (not shown in the diagram), as the same as that of the 64-valued QAM demapping table.

FIG. 52 is a table showing the relationship between the domains I, domain condition II and outputs ID0 and QD0 corresponding to those of FIGS. 50 and 51. For example, the domain ② is specified with ID=1, QD=111 and IE=1. The output ID0 is ID added one. The output QD0 becomes QD outputted as it is.

Further, the domain ⑤ is specified with ID=111, QD=1 and IE=0. The outputs ID0 and QD0 becomes ID and QD as they are.

Returning to FIG. 44, the circuit 743 of the decision circuit 74 selects subset A that is the closest in the demapping table A at the time of employing the 64-valued QAM system. Further, the circuit 744 selects the closest subset A in the demapping table A at the time of employing the 128-valued QAM system.

The outputs from the circuits 743 and 744 are inputted to the selecting gate 745. The closest subset A is selected in the demapping table A at the time of employing the 64-valued QAM system or the 128-valued QAM system, according to the mode selecting signal MODE, and outputted as D0. Further, the output DEC0 can be obtained by composing D0 to the code C2 [refer to FIG. 43].

In FIG. 43, the flip flops FF 720 and 721 control timing for composing the output from the decision circuit 74 and the code C2.

Figure 53:
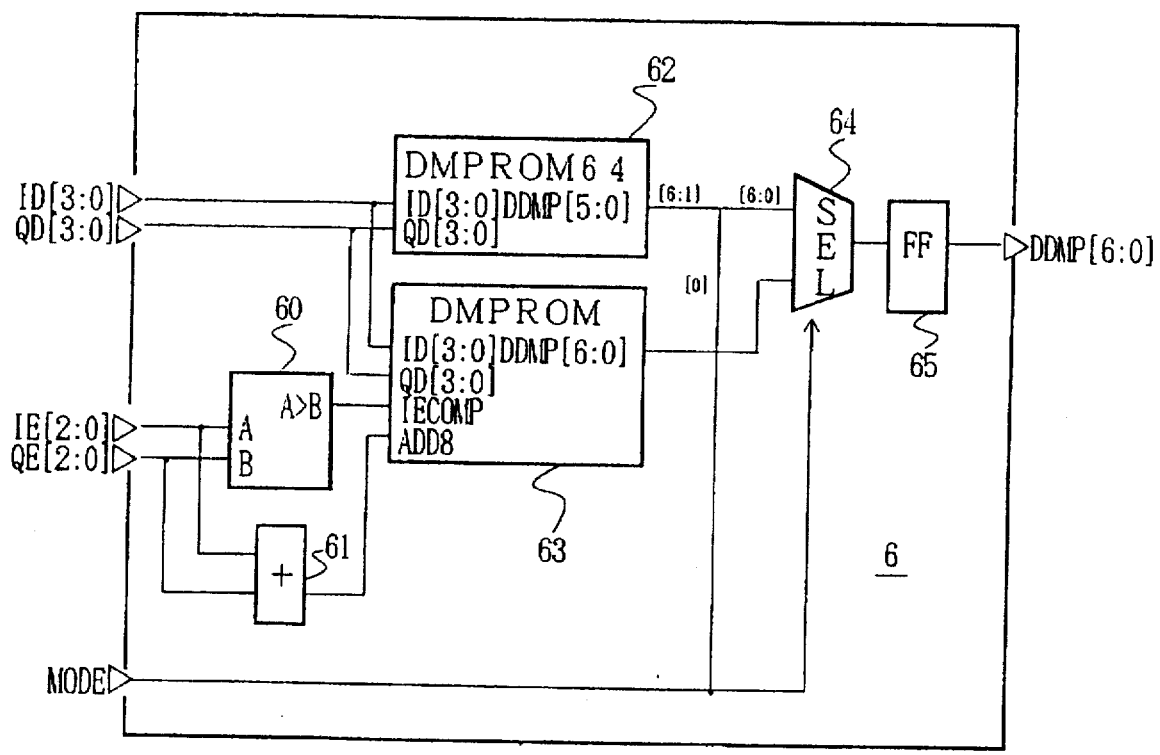
FIG. 53 is a diagram illustrating a structural example of demapping section (DEMP).

FIG. 53 illustrates a detailed block diagram of a structural example of demapping section 6. In FIG. 53, a comparison circuit 60 compares the sizes of error signals by employing decimal numbers of the error signals as the signal IE and QE. When IE is not less than QE, the comparison circuit 60 generates the output of IECMP=1.

An adding circuit 61 generates and outputs ADD8=1 when the result of adding IE and QE is more than 8 (expressed with a decimal number). The circuit 61 further generates and outputs ADD8=0, when the result is less than 8. ROMs 62 and 63 store demapping data for the 64-valued QAM and 128-valued QAM systems, respectively.

The ROM 62 for the 64-valued QAM system selects the closest subset in the demapping table corresponding the received signals ID and QD as addresses. The ROM 63 for the 128-valued QAM system selects the closest subset in the demapping table, based on IECMP outputted from the comparison circuit 60 and ADD8 outputted from the adding circuit 61.

Demapping data outputted from the ROM 62 for the 64-valued QAM system and the ROM 63 for the 128-valued QAM system are led to the selecting gate 64. The demapping data outputted from the ROM 62 for the 64-valued QAM system and the ROM 63 for the 128-valued QAM are selected and outputted based on the mode switching signal MODE for alternatively switching 64-valued QAM to 128-valued QAM.

The output from the selecting gate 64 is latched in the flip flop 65 and is outputted as a demapping result DDMP. Timing of the output DDMP are shown in 6 (DEMP) of FIGS. 2 and 3.

Figure 54:
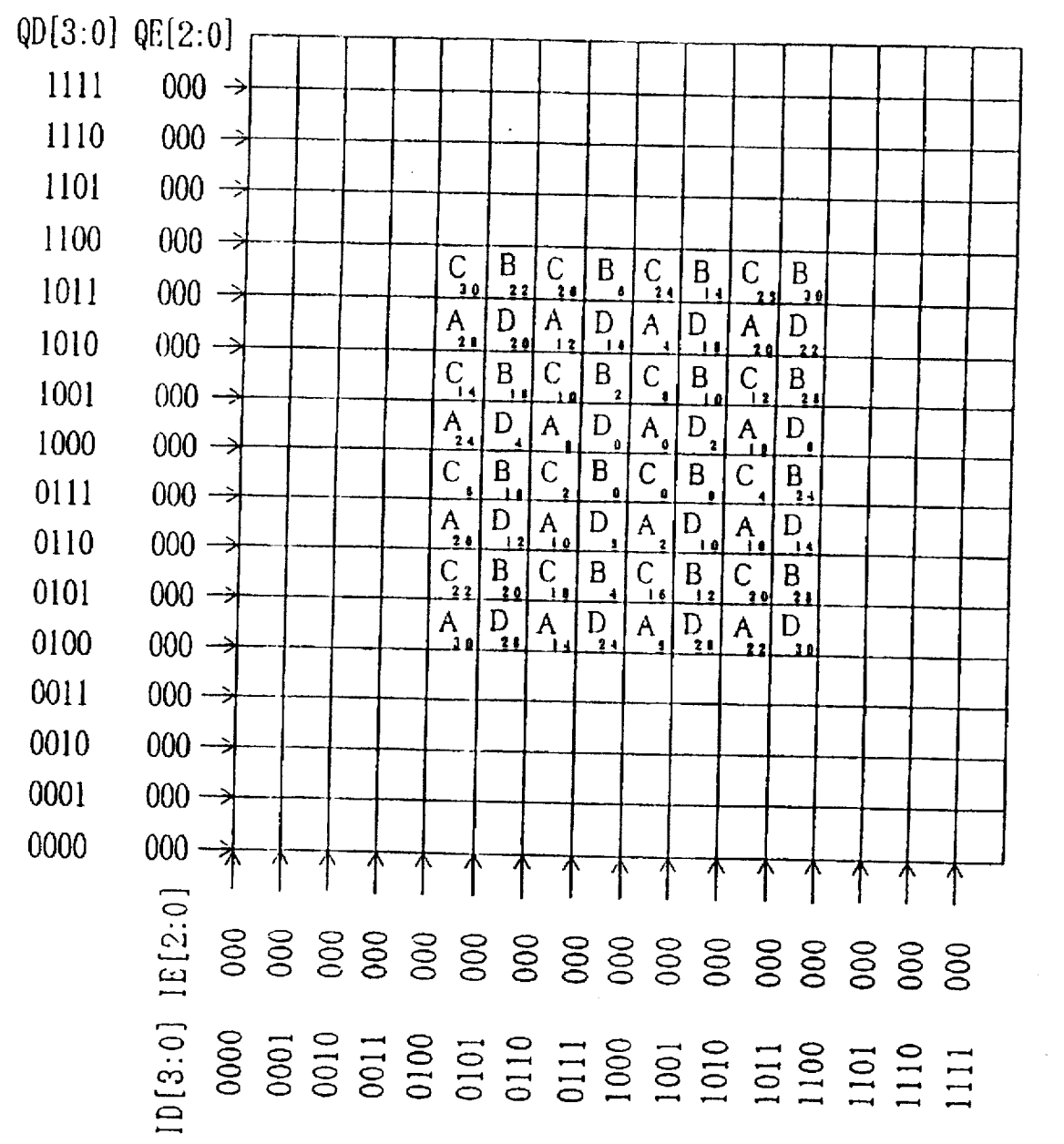

FIG. 54 illustrates a demapping table at the time of employing the 64-valued QAM system. In A, B, C and D shown in FIG. 54, 2 bits of MSB of demapping data DDMP outputted from the demapping section 6 fulfill the condition, that is, A: {0 0}, B: {0 1}, C: {1 0}, and D: {1 1}.

Figure 55:
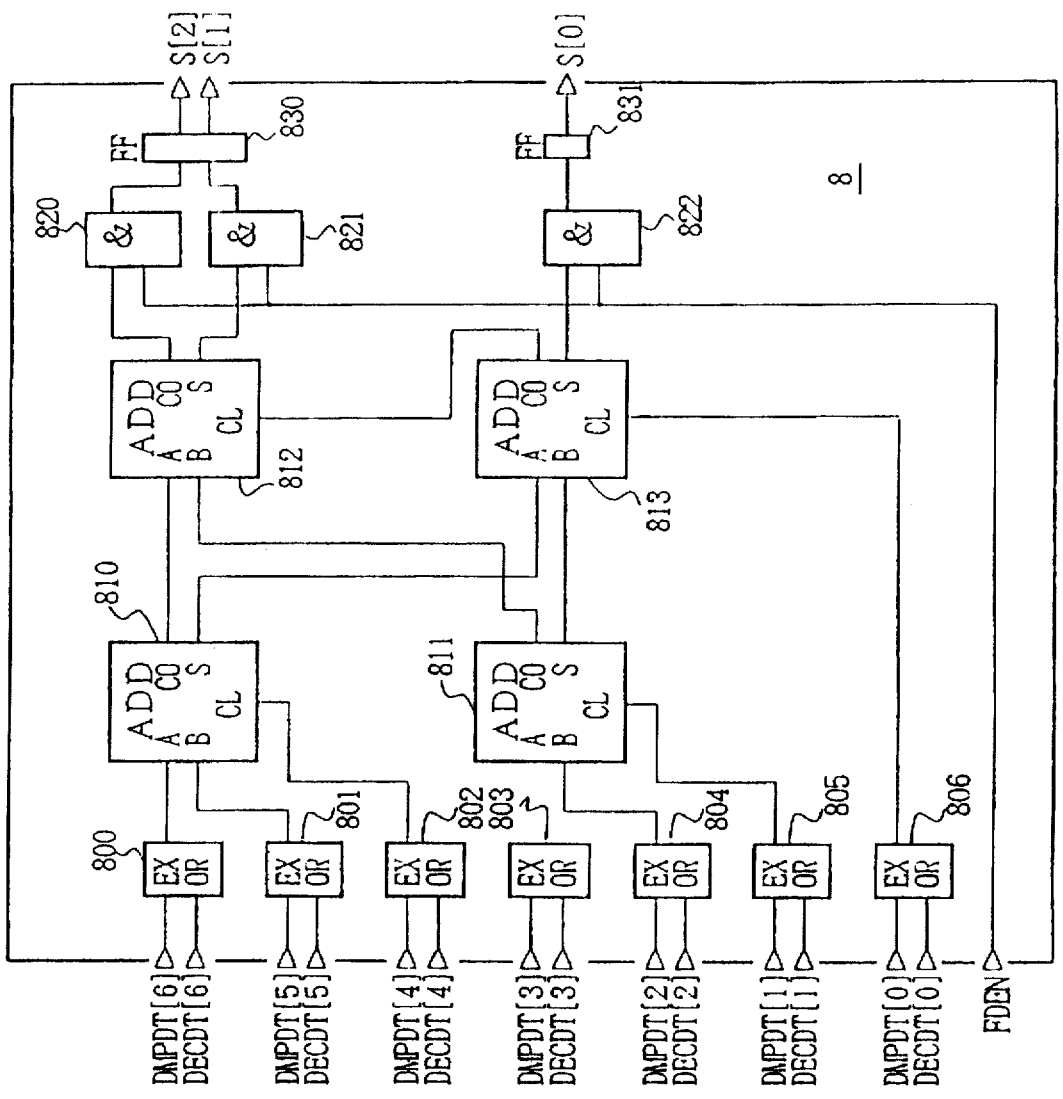
FIG. 55 is a diagram illustrating a structural example of error bit number counter (FINDE).

FIG. 55 is a block diagram of a detailed structural example of the error bit number calculator 8 shown in FIG. 1. The error bit number calculator 8 compares the decoding result outputted from the decision circuit 7 and the result for re-coding the C1 data with the result of demapping the received data, calculates and outputs the error corrected bit number. However, the calculator 8 does not work at position of frame bit.

Timings of enable signal FDEN and an output S (2 to 0) in the error bit number calculator 8 is shown in 8 (FINDE) of FIGS. 2 and 3.

Data DMPDT of the result of demapping the received data outputted from the demapping section 6 and data DECDT of the decoding result outputted from the C2 decoder 5 are inputted to the calculator 8. EXOR gates 800 to 806 extract EXORs from the data DMPDT of demapping result and the data DECDT of decoding result.

Adding circuits 810 to 813 add inputs A and B and outputs the result as C0 and the carrier as S. CL means a clear terminal. For example, the outputs of EXOR gates 800 and 801 are inputted to the adding circuit 810 as A and B inputs. The output from EXOR gate 801 is inputted to the clear terminal CL in the adding circuit 810.

Further, C0 outputted from the adding circuit 810 and C0 outputted from the adding circuit 811 are respectively inputted to A and B input terminals of the adding circuit 812. C0 outputted from the adding circuit 813 is outputted to a clear terminal CL of the adding circuit 812.

C0 outputted from the adding circuit 812 is inputted to one input terminal of AND gate 820, and carrier S outputted from the adding circuits 812 and 813 are inputted to one input terminal of each of AND gates 821 and 822.

An enable signal FDEN is inputted to another input terminal of each of AND gates 820 to 822. The outputs of AND gates 820 and 821 are inputted to the flip flop FF 830, the output of AND gate 822 is inputted to the flip flop FF 831. First and second bits of 3 bits, which express number of error correcting bits, are outputted from each of the flip flops FF 830. Third bit of the 3 bits is outputted from the flip lop FF 831.

Figure 56:
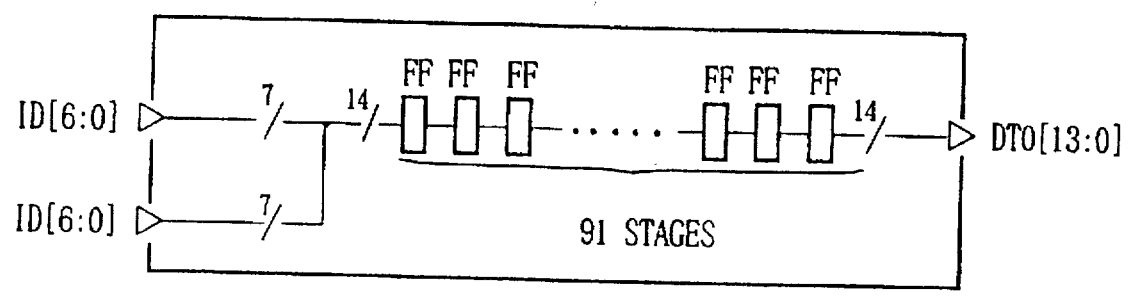
FIG. 56 is a diagram illustrating a structural example of DEC1 received signal delay section (DEC1DL).
Figure 57:
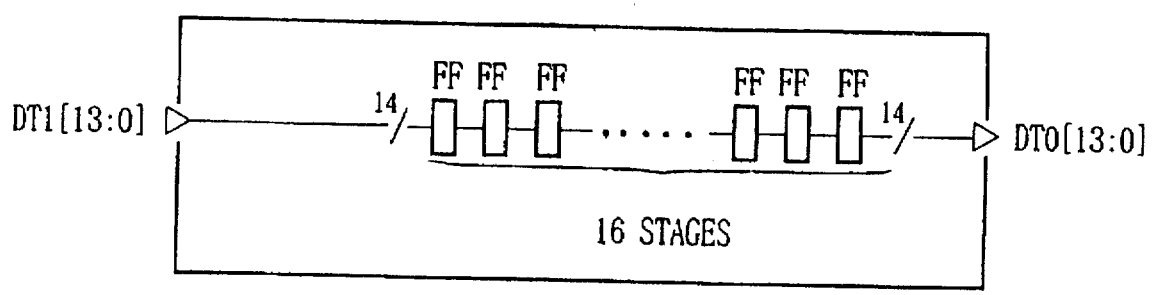
FIG. 57 is a diagram illustrating a structural example of DEC2 received signal delay section (DEC2DL).

FIGS. 56 and 57 show detailed structural diagrams of the received signal delay section 11 for DEC1 and the received signal delay section 12 for DEC2 [refer to FIG. 1]. Each section gives delay to the received signal for meeting timing of decoding code of level 1 and decoding code of level 2 with the timing of starting processing in the demapping section 6.

The received signal delay section for DEC1 11 shown in FIG. 56 is formed of 91 flip flops FF, and the received signal delay section for DEC2 shown in FIG. 57 is formed of 16 flip flops FF.

As described according to the embodiments, the present invention can provide a decoder for decoding a coded multi-valued signal with employing Viterbi coding method, by which an arithmetic circuit having smaller number of basic cells can be employed to operate with high-speed.

Further, in an arithmetic circuit of Euclidean distances to be found when employing Viterbi decoding method, one expression for calculating Euclidean distance can be selected from a fixed kinds of expressions for calculation, and only a logic of a selecting signal and an error signal can be employed without real calculations. The logic has the same effect as subtraction and addition. Therefore, a decoder of multi-valued coded signals that employs a vitabi decoding method can be realized with miniaturized basic cells.

The invention may be embodied in other specific forms without departing from the spirit or essential characteristics thereof. The present invention is therefore to be considered in all respects as illustrative and not restrictive. More particularly, 64-valued QAM system and 128-valued QAM system are explained as embodiments, but the present invention can be excepted at the time of employing QAM signal having upper or lower level $2^n$.

The scope of the present invention is indicated by the appended claims rather than by the foregoing description and all changes which come within the meaning and range of equivalency of the claims are therefore intended to be embraced therein.

What is claimed is:

1. A Viterbi decoder for decoding a received signal having Ich and Qch components, which are obtained by demodulating a convolutional coded multi-valued quadrature amplitude modulated signal, the Viterbi decoder comprising:

first means for inputting the received signal having the Ich and Qch components, which respectively include a main signal and an error signal;

second means operatively connected to the first means (FF1) for finding Euclidean distance between a predetermined signal point, which is one of a plurality of predetermined signal points allocated on a plane formed of Ich and Qch axes orthogonally crossed, and a signal point corresponding to the Ich and Qch components of the received signal; and third means operatively connected to the second means for performing a Viterbi decoding based on the Euclidean distance obtained by the second means.

wherein the plane has a plurality of domains divided in advance, and the second means includes a first circuit for providing a selection signal, which corresponds to one of the plurality of domains, where the received signal is positioned, and a second circuit for obtaining a calculated Euclidean distance value by applying the error signals of the Ich and Qch components of the received signal to a calculating expression selected by the selection signal.

2. A Viterbi decoder according to claim 1, wherein the plurality of signal points allocated on the plane are divided into tables of subsets A and B, each of which includes alternatively adjoined signal points.

3. A Viterbi decoder according to claim 2, wherein the second means obtains Euclidean distance for the subset A according to main and error signals of the Ich component of the received signal and Euclidean distance for subset B according to main and error signals of the Qch component of the received signal.

4. A Viterbi decoder according to claim 3, wherein the second means further includes an adder means for adding the Euclidean distance corresponding to the subset A and the Euclidean distance corresponding to the subset B, so that the Euclidean distance between the predetermined point and the signal point of the received signal is obtained.

5. A Viterbi decoder according to claim 4, wherein the Euclidean distance between the predetermined point and the signal point of the received signal is expressed by $(X-D)^2+(Y-D)^2$ provided that (X, Y) means the predetermined signal point, and D is expressed by decimal numbers of an error signal.

6. A Viterbi decoder according to claim 2, wherein the second means includes a distance calculating table processing circuit for receiving main and error signals of the Ich or Qch components and outputting a selecting signal which specifies one of the plurality of the domains, and a decoder circuit for reading out one of the calculated values corresponding to the expressions, based on the selecting signal.

7. A Viterbi decoder according to claim 6, wherein the distance calculating table processing circuit and the decoder circuit are provided for each of the subsets A and B.

8. A Viterbi decoder according to claim 7, wherein a pair of the distance calculating table processing circuits are provided respectively for two kinds of different convolutional coded multi-valued quadrature amplitude modulated signals, and there is comprised a gate for selecting outputs from the pair of distance calculating table processing circuits, the selecting gate being switched according to a switching control signal.

9. A Viterbi decoder according to claim 7, wherein the two kinds of different convolutional coded multi-valued quadrature amplitude modulated signals are of 64 value and 128 value, and the switching control signal selects the 64 or 128 value.

10. A Viterbi decoder according to claim 1, wherein a plurality of predetermined signal points corresponding to parity bits of received signals are allocated on the plane, and there are further comprised a fourth means operatively connected to the first means for finding second Euclidean distance between a predetermined signal point, which is one of the plurality of predetermined signal points corresponding to the parity bits and a signal point of the received signal, a fifth means operatively connected to the third means for performing a second vitabi decoding based on the second Euclidean distance obtained by the third means, and a sixth means operatively connected to the third means and fifth means for outputting a decoded signal of the received signal, based on vitabi decoded outputs from the third and sixth means.

11. A Viterbi decoder according to claim 10, wherein the sixth means includes a demapping means operatively connected to the first means for deciding signal points on the plane formed of Ich and Qch axes orthogonally crossed, based on the received signal, a decision means for finding a signal point on the plane based on the outputs from the third means and fifth means, and a error bit number detecting means for detecting the number of error bits from differences between the outputs of the demapping means and the decision means.

12. A Viterbi decoder according to claim 11, wherein a delay circuit is provided at the input side of the demapping means for setting timing of inputting signals to the demapping means to coincide with the timing of inputting signals to the fifth means.

13. A Viterbi decoder according to claim 10, wherein the plurality of predetermined signal points allocated on the plane include subset A to D divided into four, each of which includes alternatively adjoined signal points, and the subset C corresponds to that obtained by shifting the subset A+1 in the Qch direction and the subset D corresponds to that obtained by shifting the subset D−1 in the Ich direction.

14. A Viterbi decoder according to claim 1, wherein the convolutional coded multi-valued quadrature amplitude modulated signal is a coded signal having $2_n$ value.

15. A Viterbi decoder according to claim 14, wherein the $2_n$ value is 64.

16. A Viterbi decoder according to claim 14, wherein the $2_n$ value is 128.

* * * * *